(12) United States Patent
Fujiwara et al.

(10) Patent No.: US 7,163,886 B2
(45) Date of Patent: Jan. 16, 2007

(54) SEMICONDUCTOR INTEGRATED CIRCUIT DEVICE AND PROCESS FOR MANUFACTURING THE SAME

(75) Inventors: Tsuyoshi Fujiwara, Hamura (JP); Masahiro Ushiyama, Kokubunji (JP); Katsuhiko Ichinose, Ome (JP); Naohumi Ohashi, Ome (JP); Tetsuo Saito, Tokorozawa (JP)

(73) Assignees: Hitachi Tokyo Electronics Co., Ltd., Tokyo (JP); Renesas Technology Corp., Tokyo (JP)

( * ) Notice: Subject to any disclaimer, the term of this patent is extended or adjusted under 35 U.S.C. 154(b) by 0 days.

(21) Appl. No.: 10/917,289

(22) Filed: Aug. 13, 2004

(65) Prior Publication Data
US 2005/0020021 A1  Jan. 27, 2005

Related U.S. Application Data

(63) Continuation of application No. 09/913,896, filed as application No. PCT/JP99/03703 on Jul. 8, 1999, now abandoned.

(51) Int. Cl.
*H01L 21/4763* (2006.01)
*H01L 21/44* (2006.01)

(52) U.S. Cl. ............ 438/622; 438/618; 438/631; 438/597

(58) Field of Classification Search ......... 438/597, 438/622, 618, 631
See application file for complete search history.

(56) References Cited

U.S. PATENT DOCUMENTS

| 5,717,254 | A | 2/1998 | Hashimoto |
| 6,222,269 | B1 | 4/2001 | Usami |
| 6,274,417 | B1 | 8/2001 | Matsubara |
| 6,287,951 | B1 | 9/2001 | Lucas et al. |
| 6,326,064 | B1 | 12/2001 | Denison et al. |

FOREIGN PATENT DOCUMENTS

| JP | 5-47753 | 2/1993 |
| JP | 9-153546 | 6/1997 |
| JP | 10-321719 | 12/1998 |

*Primary Examiner*—Douglas W. Owens
*Assistant Examiner*—Samuel A. Gebremariam
(74) *Attorney, Agent, or Firm*—Antonelli, Terry, Stout & Kraus, LLP.

(57) ABSTRACT

In the manufacture of a semiconductor device having a high-performance and high-reliability, a silicon nitride film 17 for self alignment, which film is formed to cover the gate electrode of a MISFET, is formed at a substrate temperature of 400° C. or greater by plasma CVD using a raw material gas including monosilane and nitrogen. A silicon nitride film 44 constituting a passivation film is formed at a substrate temperature of about 350° C. by plasma CVD using a raw material gas including monosilane, ammonia and nitrogen. The hydrogen content contained in the silicon nitride film 17 is smaller than that contained in the silicon nitride film 44, making it possible to suppress hydrogen release from the silicon nitride film 17.

17 Claims, 40 Drawing Sheets

SEMICONDUCTOR INTEGRATED CIRCUIT DEVICE AND PROCESS FOR MANUFACTURING THE SAME

CROSS-REFERENCE TO RELATED APPLICATIONS

This application is a Continuation application of application Ser. No. 09/913,896, filed Aug. 21, 2001, now abandoned which is a National Stage application filed under 35 USC §371 of International (PCT) Application No. PCT/JP99/03703, filed Jul. 8, 1999. The contents of application Ser. No. 09/913,896, filed Aug. 21, 2001, is incorporated herein by reference in their entirety.

BACKGROUND OF THE INVENTION

The present invention relates to a semiconductor device and a process of manufacture thereof; and, more particularly, the invention relates to a technique that is effective in producing a highly integrated circuit device that has a high performance and a high reliability.

With a tendency to enhance the performance and increase the degree of miniaturization of a semiconductor device, a self alignment technique that is capable of absorbing mask alignment errors has been employed frequently.

For example, Japanese Patent Application Laid-Open No. Hei 11(1999)-26714 discloses a technique which calls for covering, with a silicon nitride film, gate electrodes of a MISFET (Metal Insulator Semiconductor Field Effect Transistor) constituting the memory cell of a DRAM, forming an interlayer insulating film made of a silicon oxide film, and then forming a plug for connecting source and drain regions of the MISFET. In the processing step of providing a connecting hole wherein this plug is to be formed, etching is carried out in two sub-steps, that is, a first etching sub-step permitting etching of the silicon oxide film, but not permitting easy etching of the silicon nitride film, and a second etching sub-step permitting etching of the silicon nitride film. Since the MISFET (selecting MISFET) of the DRAM memory cell is processed with a minimum processing size, mask misregistration between a gate electrode pattern and a connecting hole pattern cannot be avoided upon formation of the connecting hole between the gate electrodes, and accurate processing of the connecting hole cannot be attained without using a self alignment technique. In the technique as disclosed in the above-described literature, the silicon nitride film covering the gate electrodes serves as an etching stopper, whereby the connecting hole can be processed in self alignment with the gate electrode.

According to the above-described technique, the silicon oxide film is formed so as to be thinner than the silicon oxide film serving as an interlayer insulating film, and the silicon nitride film serves as an etching stopper so that sufficient overetching can be conducted in the above-described first etching sub-step. Even a minute connecting hole, or a connecting hole having a great aspect ratio, can be formed with a uniform thickness on the wafer, and, in addition, the process margin can be increased. In the second etching sub-step, owing to a sufficiently small thickness of the silicon nitride film serving as a stopper, excessive etching of a substrate can be inhibited even if sufficient over-etching is conducted. In short, a connecting hole can be formed in self alignment with the surface of the substrate. In particular, when the bottom portion of the connecting hole overlaps with an element isolation region, there is a possibility of the silicon oxide film, which constitutes the element isolation region, being etched excessively. By adoption of a two-stage etching process, excessive etching of the element isolation region can be controlled within a sufficiently acceptable range. As a result, leakage current of the MISFET due to excessive etching of the substrate (element isolation region) can be inhibited, whereby, in the case of a DRAM, the refresh properties can be improved.

The above-described self alignment processing relative to the substrate surface can be applied, for example, to a wiring step using a damascene process. More specifically, upon defining a wiring trench for metallization or a connecting hole in an interlayer insulating film, a thin silicon nitride film is formed in advance at a position corresponding to the bottom portion of the wiring trench or bottom portion of the connecting hole, and then, the wiring trench or connecting hole is formed in a manner similar to the above-described two-stage etching step. In such a step, it is possible to inhibit excessive etching of a member at the bottom portion of the wiring trench or connecting hole, improve the uniformity of the depth of the wiring trench or connecting hole, and to actualize definite connection between wiring layers.

There are a variety of film formation methods for formation of a silicon nitride film, for example, the thermal CVD (Chemical Vapor Deposition) and plasma CVD. For example, Japanese Patent Application Laid-Open No. Hei 2(1990)-224430 discloses a technique for using, as an interlayer insulating film or passivation film, a silicon nitride film formed by the ECR (Electron Cyclotron Resonance)-CVD using a raw material gas having silane ($SiH_4$) and nitrogen ($N_2$). Japanese Patent Application Laid-Open No. Sho 63(1988)-132434 discloses a technique for using, as a passivation film, a silicon nitride film formed by the ECR-CVD using a raw material gas having silane ($SiH_4$) and nitrogen ($N_2$).

The present inventors, however, have recognized that the above-described techniques involve problems. Recognition on the problems which will be described below was obtained by tests and investigation only by the present inventors, and it has not been published.

With a tendency toward miniaturization and improvement in the performance of a semiconductor device, heat treatment has been severely controlled. For miniaturization of a semiconductor device, precise control of the position and depth of a diffusion layer (impurity semiconductor region) is necessary. A high-temperature process subsequent to the precisely-controlled formation of a diffusion layer is not preferred, because it causes diffusion of impurities, thereby causing fluctuations in the position of the diffusion layer. A precise control of an impurity concentration in the diffusion layer is also desired so that re-diffusion of the impurities in the diffusion layer presumably causing fluctuations in the impurity concentration is not preferred. For improvement in the performance of a semiconductor device, it is desired to form a silicide layer over the surface of an impurity diffusion layer or over the surface of a gate electrode. Interposition of a high temperature process after the formation of a silicide layer causes various problems due to poor heat resistance of the silicide layer, for example, a change in the composition of the silicide layer owing to the re-reaction between the silicide layer and silicon layer, a lowering in conductivity of the silicide layer owing to this compositional change, an increase in the stress in the silicide layer and appearance of voids.

It is therefore impossible to form a silicon nitride film for self alignment as a film which covers the gate electrode, or a silicon nitride film for forming a wiring trench or connecting hole of a damascene process in self alignment, by using thermal CVD process, a film formation method which operates at high temperatures (usually, 700° C. or greater). According to the recognition of the present inventors, formation of a silicon nitride film by thermal CVD is accompanied with another problem in that active hydrogen (H) being generated during film formation is diffused in a diffusion layer or channel region of the MISFET, thereby causing the threshold voltage (Vth) to fluctuate.

Formation of a silicon nitride film using plasma CVD, which permits processing at low temperatures (usually about 400° C.), therefore investigated by the present inventors.

A silicon nitride film formed by plasma CVD however has a disturbance which may deteriorate the device characteristics. The disturbance is that a surface on which the silicon nitride film is to be formed receives plasma-induced damage by radicals generated in a plasma process or ion bombardment. This leads to inactivation of an impurity (boron (B), phosphorus (P), etc.) in a polycrystalline silicon film (gate electrode) on which the silicon nitride film is to be formed or in a diffusion layer (semiconductor substrate), or an increase of dangling bonds in the polycrystalline silicon film or diffusion layer, causing an increase in their resistance.

Upon formation of a silicon nitride film by plasma CVD, silane ($SiH_4$), ammonia ($NH_3$) and nitrogen ($N_2$) are used as raw material gases because they afford good step coverage, but a plasma CVD film (silicon nitride film) formed using such an $SiH_4/NH_3/N_2$ gas as a raw material contains much hydrogen (H). During the subsequent heat treatment, hydrogen is released from the film, causing an increase in the stress of the film (silicon nitride film). An increase in the stress of the film is a cause of deterioration of the device characteristics. A marked increase causes peeling of the film and may cause device failure.

Hydrogen thus released is diffused in a polycrystalline silicon film serving as a gate electrode or diffusion layers (source_drain) of a semiconductor substrate and becomes a cause for inactivating impurities in the polycrystalline silicon film or diffusion layers, resulting in an increase in the resistance of the gate electrode or source drain.

The hydrogen thus released and diffused in the polycrystalline silicon film or diffusion layers facilitates movement of impurities (particularly, boron (B)) in the polycrystalline film or diffusion layers and facilitates diffusion of impurities (particularly, boron) in the channel region of the MISFET. This effect causes fluctuations in the threshold voltage (Vth) of the MISFET, thereby deteriorating the performance of the semiconductor device.

As described above, in a silicon nitride film formed at low temperature, much hydrogen contained in the film is presumed to deteriorate device characteristics. Even if a silicon nitride film formed using $SiH_4/NH_3/N_2$ as a raw material gas contains much hydrogen in a deposited state, this drawback can be presumed to be overcome by a method of subjecting the resulting film to thermal treatment to release hydrogen from the film, thereby reducing its hydrogen content. But this method causes peeling of a film after thermal treatment and generates foreign matter. In addition, when a contact hole is formed in a portion of film that is just peeling, coverage failure of a connecting member occurs, thereby causing a conduction failure of the contact portion.

An object of the present invention is to provide a technique that is capable of forming a silicon nitride film for self alignment at low temperatures while reducing the hydrogen content.

Another object of the present invention is to provide a film formation method that is capable of reducing plasma-induced damage upon formation of a silicon nitride film.

A further object of the present invention is to provide a semiconductor device with less fluctuations in the resistance of a polycrystalline silicon film and with less fluctuations in the threshold voltage of the MISFET.

A still further object of the present invention is to provide a semiconductor device having high performance and high reliability.

The above-described and other objects and novel features of the present invention will be apparent from the description herein and the accompanying drawings.

SUMMARY OF THE INVENTION

Typical aspects and features of the invention, among those disclosed by the present application, will hereinafter be summarized.

In a semiconductor device or manufacturing process according to the present invention, a silicon nitride film for self alignment, when formed by plasma CVD, is formed at 350° C. or greater (preferably 400° C. or greater). In addition, the silicon nitride film is formed using a two-element gas having silane and nitrogen as raw material gases.

Formation of a silicon nitride film at 350° C. or greater, preferably at 400° C. or greater makes it possible to reduce the hydrogen content of the film in the as deposited state, thereby inhibiting an increase in the film stress and an increase in released hydrogen in the subsequent thermal treatment. In addition, use of a two-element gas (silane and nitrogen) makes it possible to reduce plasma-induced damage, thereby reducing the hydrogen content in the as deposited state. By these effects, peeling of a silicon nitride film for self alignment can be prevented, and release of hydrogen contained in the film can be suppressed. By suppressing hydrogen release from the film, inactivation of impurities in the gate electrode or source and drain regions can be inhibited, whereby fluctuations of their resistance and fluctuations of the threshold voltage of the MISFET can be suppressed. As a result, a semiconductor having improved reliability is available. It is needless to say that when use of a silicide layer to heighten the performance of a semiconductor device (MISFET) is taken into consideration, the formation temperature of the silicon nitride film is not set so high as that for thermal CVD.

In accordance with the present invention, a silicon nitride film formed by plasma CVD using a three-element raw material gas (silane, ammonia and nitrogen) is used as a passivation film applied to a semiconductor device, because step coverage is important in order to prevent invasion of water and the device characteristics do not depend on the hydrogen content of the passivation film. When the silicon nitride film for self alignment and passivation film are compared, the former has a smaller hydrogen content and is formed at a higher temperature.

Various combinations of the inventions disclosed herein will hereinafter be listed.

1. A manufacturing process of a semiconductor device according to the present invention, comprises:

(a) selectively forming a first insulating film (for example, an element isolation region) on a surface of a semiconductor substrate;

(b) forming a first conductor portion (for example, a gate electrode) via a second insulating film (for example, a gate insulating film) over the surface of the semiconductor substrate, (c) forming a semiconductor layer (for example, source-drain) in a region, on the surface of the semiconductor substrate, wherein the first insulating film and the first conductor portion do not exist;

(d) forming a third insulating film (for example, a film for self alignment) to cover the first conductor portion, semiconductor layer and first insulating film;

(e) forming a fourth insulating film (for example, an interlayer insulating film) over the third insulating film;

(f) forming a first opening (for example, a contact hole) in the fourth and third insulating films, (g) forming a second conductor portion (for example, a plug) in the first opening; and (h) forming a fifth insulating film (for example, a passivation film) over the fourth insulating film, wherein the third and fifth insulating films are silicon nitride films formed by plasma CVD and the third insulating film is formed at a temperature higher than that of the fifth insulating film.

2. The manufacturing process of a semiconductor device according to the item 1, wherein the first and fourth insulating films are silicon oxide films, and the step for forming a first opening comprises a step of etching the fourth insulating film under conditions permitting a larger etching amount of the fourth insulating film than that of the third insulating film and a step of etching the third insulating film under conditions permitting a larger etching amount of the third insulating film than that of the first insulating film.

3. The manufacturing process of a semiconductor device according to the item 1, wherein the fifth insulating film is formed using an ammonia-containing reaction gas, while the third insulating film is formed using an ammonia-free reaction gas.

4. The manufacturing process of a semiconductor device according to the item 1, further comprising, between the steps (c) and (d), a step of forming a silicide layer over the surface of the semiconductor layer.

5. The manufacturing process of a semiconductor device according to the item 4, wherein the second conductor portion contains a first conductor layer (for example, a titanium nitride layer) and a second conductor layer (for example, a tungsten layer), and the first conductor layer is thinner than the second conductor layer and lies below the second conductor layer.

6. The manufacturing process of a semiconductor device according to the item 1, further comprising, between the steps (g) and (h), (i) a step of forming a third conductor portion (for example, an interconnection) and (j) a step of connecting, in a second opening formed in the fifth insulating film to expose a portion of the third conductor portion, the third conductor portion with an externally connecting conductor portion (for example, a bonding wire or bump electrode).

7. The manufacturing process of a semiconductor device according to the item 1, wherein the first conductor portion is formed of a silicon layer containing boron.

8. The manufacturing process of a semiconductor device according to the item 1, wherein the conductor portion is formed of three conductor layers, that is, a first conductor layer made of silicon, a second conductor layer (for example, tungsten nitride serving as a barrier layer) and a third conductor layer made of a refractory metal (for example, titanium, cobalt or tungsten).

9. A manufacturing process of a semiconductor device according to the present invention, comprises:

(a) selectively forming a first insulating film (for example, an element isolation region) on a surface of a semiconductor substrate;

(b) forming a first conductor portion (for example, a gate electrode) over the surface of the semiconductor substrate via a second insulating film (for example, a gate insulating film), (c) forming a semiconductor layer (for example, source-drain) in a region, over the surface of the semiconductor substrate, wherein the first insulating film and the first conductor portion do not exist;

(d) forming a third insulating film (for example, a film for self alignment) to cover the first conductor portion, semiconductor layer and first insulating film;

(e) forming a fourth insulating film (for example, an interlayer insulating film) over the third insulating film;

(f) forming a first opening (for example, a contact hole) in the fourth and third insulating films, (g) forming a second conductor portion (for example, a plug) in the first opening; and (h) forming a fifth insulating film (for example, a passivation film) over the fourth insulating film, wherein the third and fifth insulating films are silicon nitride films formed by plasma CVD and the third insulating film has a hydrogen content smaller than that of the fifth insulating film.

10. A manufacturing process of a semiconductor device according to the present invention, comprises:

(a) forming a first insulating film (for example, a film for self alignment) on a surface of a semiconductor substrate;

(b) forming a second insulating film (for example, an insulating film for metallization) over the first insulating film;

(c) forming an opening (for example, a trench for damascene) in the second and first insulating films;

(d) forming a conductor layer (for example, an interconnection) in the opening; and (e) forming a third insulating film (for example, a passivation film) over the conductor layer, wherein the first insulating film and the third insulating film are silicon nitride films formed by plasma CVD and the first insulating film is formed at a temperature higher than that of the third insulating film.

11. A manufacturing process of a semiconductor device according to the present invention, comprises:

(a) forming a first insulating film (for example, a film for self alignment) on a surface of a semiconductor substrate;

(b) forming a second insulating film (for example, an insulating film for metallization) over the first insulating film;

(c) forming an opening (for example, a trench for damascene) in the second and first insulating films;

(d) forming a conductor layer (for example, an interconnection) in the opening; and (e) forming a third insulating film (for example, a passivation film) over the conductor layer, wherein the first insulating film and the third insulating film are silicon nitride films formed by plasma CVD and the first insulating film has a hydrogen content smaller than that of the third insulating film.

12. A manufacturing process of a semiconductor device according to the present invention, comprises:

(a) selectively forming a first insulating film (for example, an element isolation region) over a surface of a semiconductor substrate;

(b) forming a semiconductor layer (for example, source drain) in a region, over the surface of the semiconductor substrate, wherein the first insulating film does not exist;

(c) forming a refractory metal silicide layer over the surface of the semiconductor layer;

(d) forming a second insulating film (for example, a film for self alignment) to cover the refractory metal silicide layer and the first insulating film;

(e) forming a third insulating film (for example, an interlayer insulating film) over the second insulating film;

(f) forming an opening (for example, a contact hole) in the third and second insulating films, and (g) forming a conductor portion (for example, a plug) in the opening, wherein the second insulating film is a silicon nitride film formed by plasma CVD at 400° C. or greater.

13. The manufacturing process of a semiconductor device as described in the item 12, wherein the second insulating film is formed using a reaction gas having monosilane and nitrogen but free of ammonia.

14. The manufacturing process of a semiconductor device according to the item 12, wherein the third insulating film is a silicon oxide film, and the opening forming step comprises a step of etching the third insulating film under conditions permitting a larger etching amount of the third insulating film relative to the second insulating film and a step of etching the second insulating film under conditions permitting a larger etching-amount of the second etching film relative to the first insulating film.

15. The manufacturing process of a semiconductor device according to the item 12 wherein the silicide-layer forming step further comprises (h) depositing a refractory metal film over the semiconductor layer and first insulating film;

(i) heat treating the semiconductor substrate, thereby forming a silicide layer over a surface of the semiconductor layer; and (j) removing the refractory metal film over the first insulating film.

16. The manufacturing process of a semiconductor device according to the item 12 wherein the conductor piece contains a first conductor layer and a second conductor layer, and the first conductor layer is thinner than the second conductor layer and lies below the second conductor layer.

17. The manufacturing process of a semiconductor device according to the item 16, wherein the first conductor layer is a titanium nitride layer, while the second conductor layer is a tungsten layer.

18. A manufacturing process of a semiconductor device according to the present invention, which comprises:

(a) selectively forming a first insulating film (for example, an element isolation region) on a surface of a semiconductor substrate;

(b) forming a first conductor portion (for example, a gate electrode) over the surface of the semiconductor substrate via a second insulating film (for example, a gate insulating film), (c) forming a semiconductor layer (for example, source drain) in a region, over the surface of the semiconductor substrate, wherein the first insulating film and the first conductor portion do not exist;

(d) forming a third insulating film (for example, a film for self alignment) to cover the first conductor portion, semiconductor layer and first insulating film; and (e) forming a fourth insulating film (for example, an interlayer insulating film) over the third insulating film; wherein the first conductor portion is a boron-containing silicon film and the third insulating film is a silicon nitride film formed by plasma CVD at 400° C. or greater.

19. The manufacturing process of a semiconductor device according to the item 18, wherein the third insulating film is formed using a reaction gas having monosilane and nitrogen but free of ammonia.

20. A manufacturing process of a semiconductor film according to the present invention, comprises:

(a) forming a first insulating film (for example, a film for self alignment) over a semiconductor substrate;

(b) forming a second insulating film (for example, an insulating film for the formation of a damascene trench) over the first insulating film;

(c) forming an opening (for example, a trench for damascene) in the second and first insulating films; and (d) forming a conductor layer (for example, an interconnection) in the opening, wherein the first insulating film is a silicon nitride film formed by plasma CVD at 400° C. or greater.

21. The manufacturing process of a semiconductor device according to the item 20, wherein the second insulating film is a silicon oxide film.

22. The manufacturing process of a semiconductor device according to the item 20, wherein the conductor forming step comprises forming a first conductor layer as a lower layer and a second conductor layer as an upper layer, the second conductor layer is made of copper, and the first conductor layer serves to prevent diffusion of copper.

23. A manufacturing process of a semiconductor device according to the present invention, comprises:

(a) depositing, via a first insulating film (for example, a gate insulating film), a first conductor layer made of silicon, a second conductor layer, a third conductor layer made of a refractory metal and a second insulating film (for example, a cap insulating film) over a semiconductor substrate;

(b) processing the second insulating film, and the third, second and first conductor layers into a predetermined pattern; and (c) forming a third insulating film (for example, a film for self alignment) over the second insulating film, wherein the second insulating film is a silicon nitride film formed by plasma CVD at 400° C. or greater.

24. The manufacturing process of a semiconductor device according to the item 23, wherein the third insulating film is a silicon nitride film formed by plasma CVD at 400° C. or greater.

25. A semiconductor device according to the present invention, comprises:

(a) a semiconductor substrate, (b) a first insulating film (for example, an element isolation region) selectively formed on a surface of a semiconductor substrate;

(c) a first conductor portion (for example, a gate electrode) formed over the surface of the semiconductor substrate via a second insulating film (for example, a gate insulating film), (d) a semiconductor layer (for example, source drain, diffusion layer, interconnection) disposed between the first insulating film and first conductor portion over the surface of the semiconductor substrate;

(e) a third insulating film (for example, a film for self alignment) formed over the first conductor portion, first insulating film and semiconductor layer;

(f) a fourth insulating film (for example, an interlayer insulating film) formed over the third insulating film;

(g) a second conductor portion (for example, a plug) formed in the opening defined in the third and fourth insulating films; and (h) a fifth insulating film (for example, a passivation film) formed over the second conductor portion, wherein the third and fifth insulating films are silicon nitride films formed by plasma CVD and the third insulating film has a hydrogen content smaller than that of the fifth insulating film.

26. The semiconductor device according to the item 25, wherein the second conductor portion contains a first conductor layer and a second conductor layer, and the first conductor layer is thinner than the second conductor layer and lies below the second conductor layer.

27. The semiconductor device according to the item 26, wherein the first conductor layer is a titanium nitride layer and the second conductor layer is a tungsten layer.

28. The semiconductor device according to the item 25, wherein a refractory metal silicide layer is formed over the surface of the semiconductor layer.

29. The semiconductor device according to the item 25, wherein the first conductor portion is formed of a boron-containing silicon layer.

30. A semiconductor device according to the present invention, comprises:
(a) a semiconductor substrate;
(b) a first conductor portion (for example, a gate electrode) formed over the semiconductor substrate via a first insulating film (for example, a gate insulating film);
(c) a second insulating film (for example, a cap insulating film) formed over the first conductor portion, and
(d) a third insulating film (for example, a passivation film) formed over the second insulating film,
wherein the second and third insulating films are silicon nitride films formed by plasma CVD and the second insulating film has a hydrogen content smaller than that of the third insulating film.

31. The semiconductor device according to the item 30, further comprising:
(e) first and second conductor regions disposed on opposite ends of the first conductor portion on the surface of the semiconductor substrate,
wherein the first conductor portion functions as a gate of a transistor, the first and second semiconductor regions function as source and drain of the transistor, and the second insulating film has a substantially equal width with the first conductor portion in a direction from the source toward the drain.

32. The semiconductor device according to the item 30, further comprising (e) a second conductor portion (for example, an interconnection) formed over the second insulating film and (f) an externally connecting conductor portion (for example, a bump) connected with the second conductor portion,
wherein the third insulating film has an opening and in the opening, the externally connecting conductor portion has been connected with the second conductor portion.

33. A semiconductor device according to the present invention, comprises:
(a) a semiconductor substrate;
(b) a first conductor portion (for example, a gate electrode) formed over the semiconductor substrate via a first insulating film (for example, a gate insulating film) and having a side wall;
(c) a second insulating film (for example, a side wall) formed over the side wall of the first conductor portion; and
(d) a third insulating film (for example, a passivation film) formed over the first conductor film,
wherein the second and third insulating films are silicon nitride films formed by plasma CVD and the second insulating film has a hydrogen content smaller than that of the third insulating film.

34. The semiconductor device according to the item 33, further comprising (3) a second conductor portion (for example, an interconnection) formed over the second insulating film; and
(f) an externally connecting conductor portion (for example, a bump) connected with the second conductor portion, wherein the third insulating film has an opening and in the opening, the externally connecting conductor portion has been connected with the second conductor portion.

35. A semiconductor device according to the present invention, which comprises:
(a) a semiconductor substrate;
(b) a first insulating film (for example, a film for self alignment) over the semiconductor substrate;
(c) a second insulating film (for example, an insulating film for the formation of a wiring trench) over the first insulating film,
(d) a first conductor portion (for example, an interconnection) formed in a first opening defined in the first and second insulating films;
(e) a third insulating film (for example, an interlayer insulating film) over the first conductor portion,
(f) a second conductor portion (for example, an interconnection) over the third insulating film, and
(g) a fourth insulating film (for example, a passivation film) over the second conductor portion,
wherein the first and fourth insulating films are silicon nitride films formed by plasma CVD and the first insulating film has a hydrogen content smaller than that of the fourth insulating film.

36. The semiconductor device according to the item 35, further comprising (h) an externally connecting conductor portion connected with the second conductor portion, wherein the fourth insulating film has a second opening, and this second opening, the externally connecting conductor piece has been connected with the second conductor portion.

37. The semiconductor device according to the item 36, wherein the second insulating film is a silicon oxide film.

38. The manufacturing process of a semiconductor device according to the item 12, further comprising, between the steps (a) and (b), a step of forming a first conductor portion (for example, a gate electrode) made of a silicon material, wherein in the step (c), a high refractory silicide layer is formed on the surface of the first conductor portion.

39. The semiconductor device according to the item 25, wherein the first conductor piece is made of a silicon material and a refractory metal silicide layer has been formed over the surface of the first conductor portion.

40. A manufacturing process of a semiconductor device according to the present invention, which comprises forming a first silicon nitride film for self alignment and forming a second silicon nitride film for passivation,
wherein the first silicon nitride film is formed by plasma CVD using a raw material gas having silane and nitrogen, and the second silicon nitride film is formed by plasma CVD using a raw material gas having silane, ammonia and nitrogen.

41. The manufacturing process of a semiconductor device according to the item 40, wherein the first silicon nitride film is formed at a temperature higher than that of the second silicon nitride film.

42. The manufacturing process of a semiconductor device according to the item 40, wherein the first silicon nitride film is formed at 400° C. or greater.

43. A semiconductor device of the present invention, which comprises a first nitride film for self alignment processing and a second silicon nitride film for passivation, wherein between an Si—H/Si—N bonding ratio R1 according to FT-IR analysis of the first silicon nitride film and an Si—H/Si—N bonding ratio R2 according to FT-IR analysis of the second silicon nitride film, there is a relationship of R1<R2.

44. The semiconductor device according to the item 43, wherein the Si—H bonding by the FT-IR analysis of the first silicon nitride film is $2 \times 10^{21}$ cm$^{-3}$ or less.

The members in the parentheses are indicated as exemplarily only and the present invention is not limited thereby.

Effects available by typical aspects and features of the invention among the above-disclosed combinations will next be described briefly.

(1) A silicon nitride film for self alignment can be formed at a low temperature with a small hydrogen content.

(2) A plasma-induced image upon formation of a silicon nitride film can be reduced.

(3) A semiconductor device with less fluctuations in the resistance of a polycrystalline film and less fluctuations in the threshold voltage of a MISFET can be provided.

(4) A high-performance and high-reliability semiconductor device can be provided.

BEST MODE FOR CARRYING OUT THE INVENTION

Figure 1A:
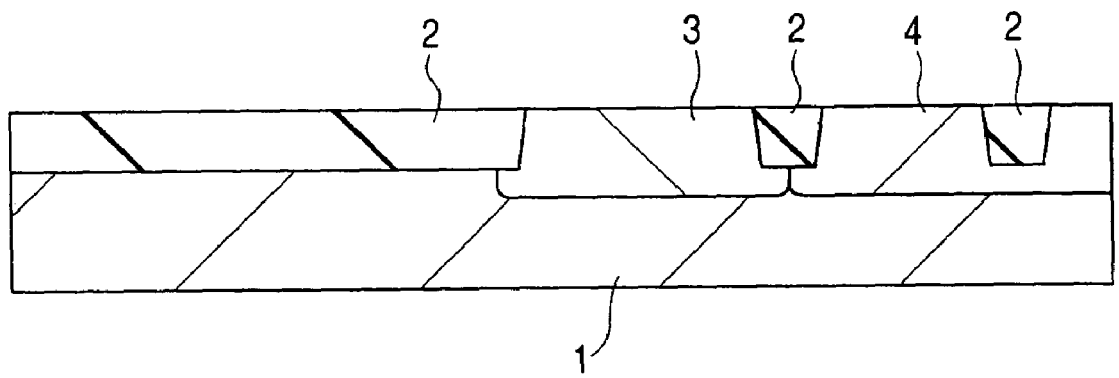
FIGS. 1(a) to 14 are cross-sectional views illustrating, in the order of steps, a process in the manufacture of a semiconductor device according to Embodiment 1 of the present invention.

The present invention will hereinafter be described in detail based on the accompanying drawings. In all the drawings the embodiments, like members having the same function will be identified by like reference numerals and overlapping descriptions will be omitted.

Embodiment 1

FIGS. 1(a) to 14 are cross-sectional views illustrating, in the order of steps, a process in the manufacture of a semiconductor device according to Embodiment 1 of the present invention.

As illustrated in FIG. 1(a), over the main surface of a semiconductor substrate 1, for example, made of p$^-$ type single crystal silicon, an element isolation region 2 is formed. This element isolation region 2 can be formed, for example, in the following manner. First, a silicon oxide (SiO) film and a silicon nitride (SiN) film are successively formed over the main surface of the semiconductor substrate 1. Using a patterned photoresist film, the silicon nitride film is etched. With this etched silicon nitride film being used as a mask, a shallow trench is formed in the semiconductor substrate 1. An insulating film, for example, a silicon oxide film is deposited to embed the shallow trench, followed by removal of the silicon oxide film from a region other than the shallow trench by CMP (chemical mechanical polishing). By wet etching or the like, the silicon nitride film is then removed, whereby the element isolation region 2 (the first insulating film in the item 1) is formed.

With the patterned photoresist film being used as a mask, impurities are ion-implanted to form a p-type well 3 and an n-type well 4. In the p-type well 3, a p-conductivity type impurity, such as boron (B), is ion-implanted, while in the n-type well 4, an n-conductivity type impurity, such as phosphorus (p), is ion-implanted. In this manner, an n channel type MISFETQn is formed in the p-type well 3 and a p channel type MISFETQp is formed in the n-type well 4.

Figure 1B:
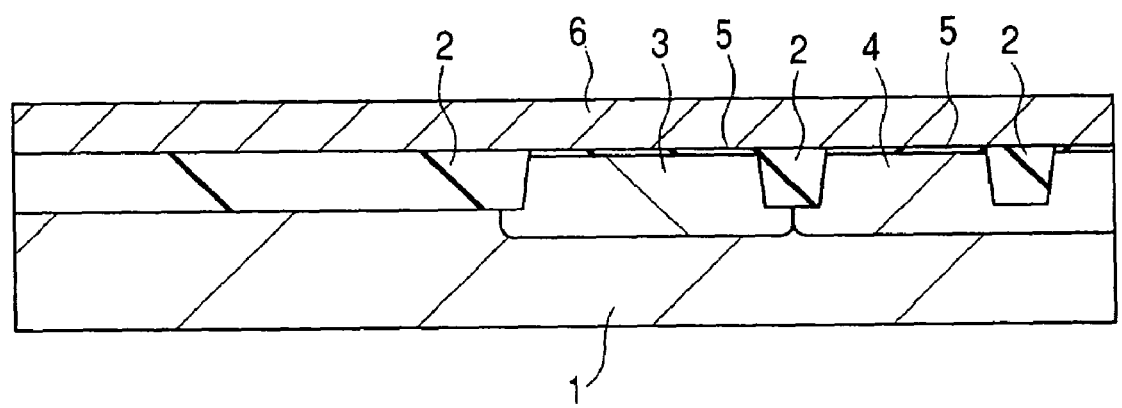

As illustrated in FIG. 1(b), a silicon oxide film 5 (the second insulating film in the item 1) is formed over each of the regions of the p-type well 3 and n-type well 4. The silicon oxide film 5 serves as a gate insulating film of the MISFET and is formed, for example, by thermal CVD.

Then, a polycrystalline silicon film 6 is formed. This polycrystalline silicon film 6 serves as a gate electrode (the first conductor piece in the item 1) of the MISFET and is formed, for example, by CVD.

Figure 1C:
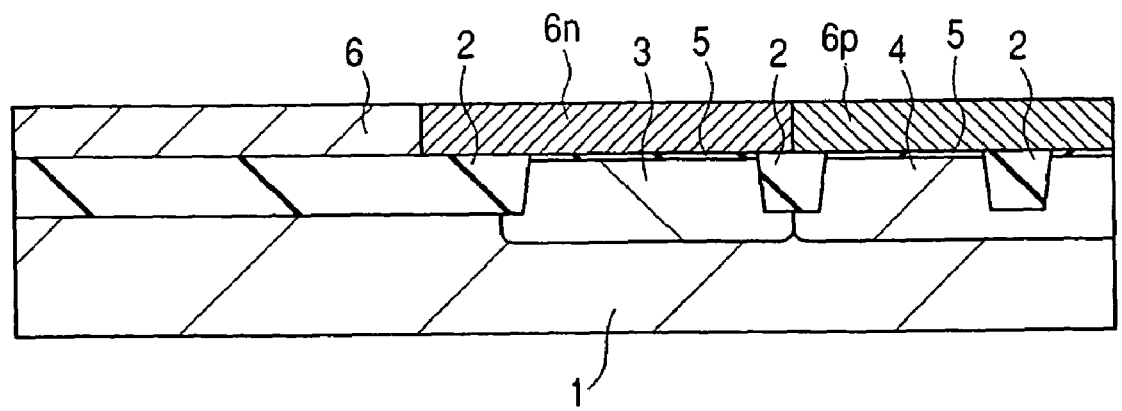

As illustrated in FIG. 1(c), using a photoresist film (not illustrated) as a mask, an n-type impurity (ex. phosphorus (P)) is ion-implanted to the polycrystalline silicon film 6 in a region (the region of p-type well 3) wherein the n channel type MISFETQn is to be formed, whereby the n-type region 6n of the polycrystalline silicon film is formed. Using a photoresist film (not illustrated) as a mask, a p-type impurity (ex. boron (B)) is ion-implanted to the polycrystalline silicon film 6 in a region (the region of n-type well 4) wherein the p channel type MISFETQp is to be formed, whereby the p-type region 6p of the polycrystalline silicon film is formed.

Separate ion implantation in two regions of the polycrystalline silicon film 6 makes it possible to constitute a so-called dual gate structure wherein the conductivity type of the gate electrode becomes an n type in the case of the n channel type MISFET and a p type in the case of the p channel type MISFET. By adopting this dual gate structure, the Vth (threshold voltage) of the MISFET can be reduced, whereby a MISFET capable of being driven at a low voltage can be formed. The conventional semiconductor device has the inherent drawback that, when a boron-containing polycrystalline silicon film is employed for a portion of the gate electrode, owing to a large thermal diffusion coefficient of boron, boron diffused from the gate electrode (polycrystalline silicon film) reaches the channel region (well), tending to cause the threshold voltage of the MISFET to fluctuate. In this Embodiment, however, a silicon nitride film having a small hydrogen content is used as a film for self alignment processing, as will be described later, so that diffusion of boron is suppressed and the high reliability of the semiconductor device can be maintained. This will be described more specifically later.

Figure 2A:
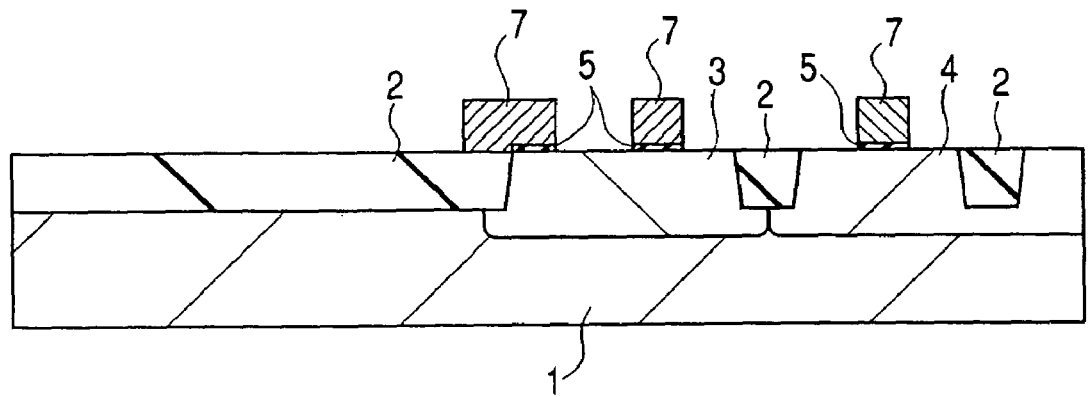

As illustrated in FIG. 2(a), polycrystalline silicon films 6,6n,6p are formed into predetermined patterns, whereby gate electrodes 7 are formed. For this patterning, dry etching is conducted using a photoresist film (not illustrated) as a mask. The gate electrode 7 may be caused to function as an interconnection.

Figure 2B:
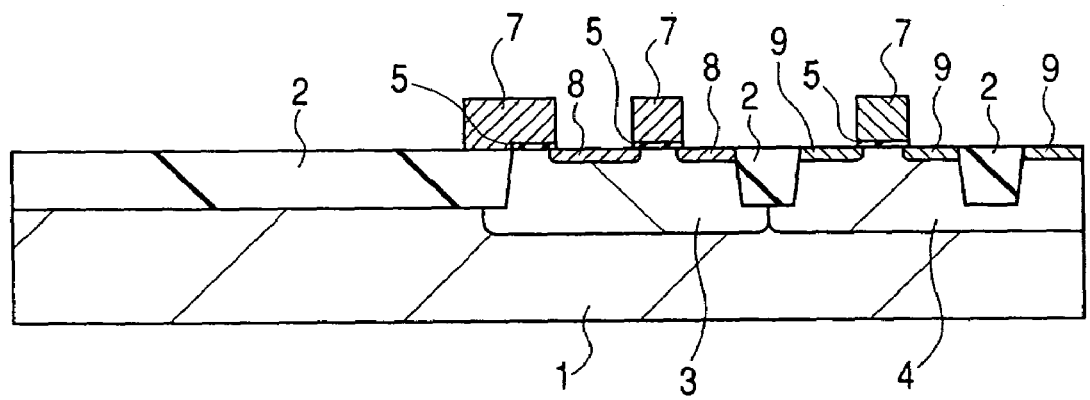

As illustrated in FIG. 2(b), using a photoresist film (not illustrated) as a mask, an n-type impurity (for example, phosphorus or arsenic (As)) is ion-implanted to the p-type well 3, whereby an n-type semiconductor region 8 (the semiconductor layer in the item 1) is formed. The gate electrode 7 also serves as a mask so that the n-type semiconductor region 8 is formed in self alignment with the gate electrode 7. With a photoresist film (not illustrated) being used as a mask, a p-type impurity (ex. boron) is ion-implanted to the n-type well 4, whereby a p-type semiconductor region 9 (the semiconductor layer in the item 1) is formed. Similarly, the gate electrode 7 serves as a mask so that the p-type semiconductor region 9 is formed in self alignment with the gate electrode 7.

Figure 2C:
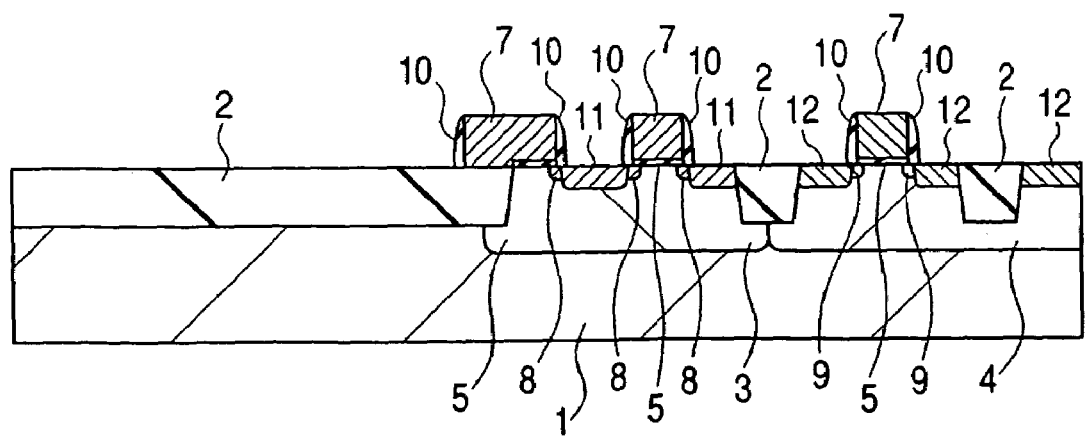

As illustrated in FIG. 2(c), side walls 10 are formed on the side walls of the gate electrode 7. These side walls 10 are formed, for example, by depositing, on the side walls of the gate electrode 7, a silicon oxide film to a thickness sufficient for providing good step coverage and then anisotropically etching this silicon oxide film.

As in the step of FIG. 2(b), an $n^+$ type semiconductor region 11 and a $p^+$ type semiconductor region 12 are formed in the region of p-type well 3 and the region of n-type well 4, respectively. To the $n^+$ type semiconductor region 11 and $p^+$ type semiconductor region 12, impurities are introduced at higher concentrations than the n-type semiconductor region 8 and p-type semiconductor region 9, respectively. In this ion implantation step, the side walls 10 function as masks so that the $n^+$ type semiconductor region 11 and $p^+$ type semiconductor region 12 are formed in self alignment with the side walls 10. Thus, a source-drain having an LDD (Lightly Doped Drain) structure formed of the n-type semiconductor region 8 and the $n^+$ type semiconductor region 11 or the p-type semiconductor region 9 and the $p^+$ type semiconductor region 12 is formed.

Figure 3A:
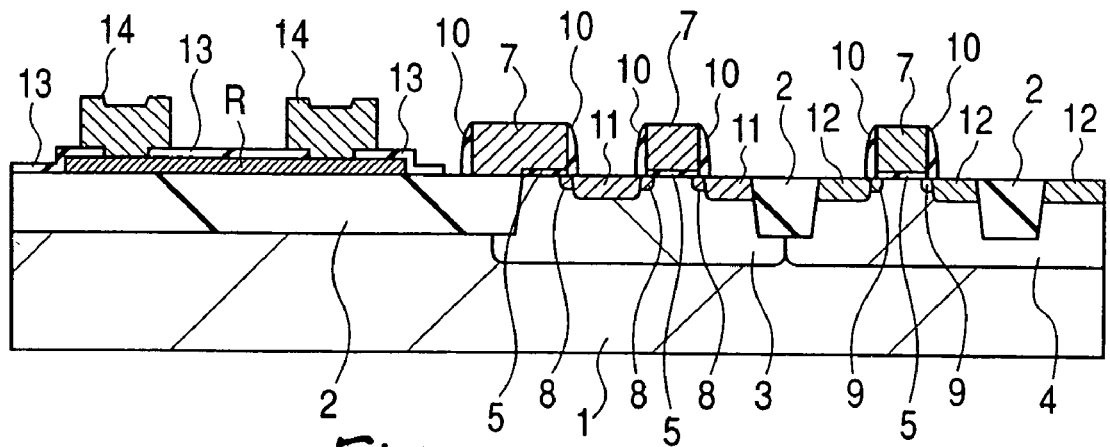

As illustrated in FIG. 3(a), a resistive element is formed over the wide element isolation region 2. This resistive element is formed, over the element isolation region 2, of a conductor film R, an insulating film 13 covering the conductor film R and a withdrawal electrode 14 over the insulating film 13. For the conductor film R, a metal (for example, tungsten) having a relatively high resistance or a semiconductor film (for example, a polycrystalline silicon film) to which an introduction amount of an impurity is relatively small can be used. For the insulating film, a silicon oxide film or a silicon nitride film can be used. For the withdrawal electrode 14, a polycrystalline silicon film can be used. The conductor film R can be formed by depositing a conductor film all over the semiconductor substrate 1 and then patterning it. Then, the insulating film 13 is deposited by CVD, sputtering or the like method. After opening a connecting hole, a polycrystalline silicon film is deposited, for example, by CVD, followed by patterning of this polycrystalline silicon film into a predetermined pattern, whereby the withdrawal electrode 14 is formed.

The resistive element exemplified above is equipped with the withdrawal electrode 14, but another type of a resistive element to be withdrawn directly by a plug without disposing the withdrawal electrode 14 may be employed. In this case, if the conductor film R is made of a polycrystalline silicon film, it is necessary to cover the surface of the conductor film R with an insulating film in order to prevent silicide formation on the whole surface of the polycrystalline silicon film in the silicide step, which will be described later.

Prior to the formation of the side walls 10, as illustrated in FIG. 2(c), the conductor film R may be formed (patterned), followed by formation of an insulating film for forming the side walls 10 to cover the conductor film R. In this case, by anisotropic etching of the insulating film using a photoresist film, which is formed to cover the patterned conductor film R, as a mask, the insulating film 13 covering the conductor film R can be formed in the formation region of the conductor film R, and, simultaneously, side walls 10 can be formed.

Figure 3B:
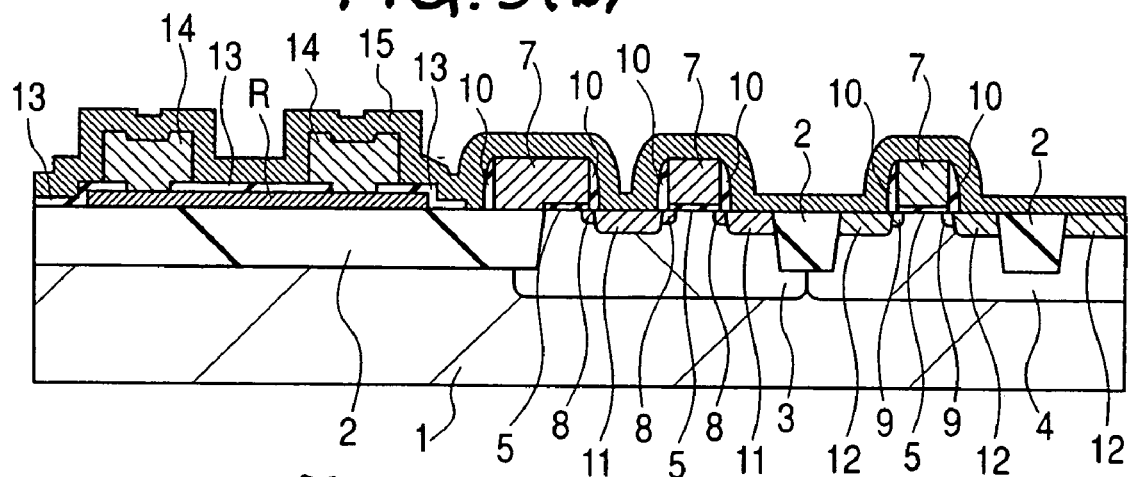

As illustrated in FIG. 3(b), a metal film 15 is deposited all over the surface of the semiconductor substrate 1. For the metal film 15, a refractory metal, for example, titanium, tungsten or cobalt, is used. The metal film 15 is deposited by CVD, sputtering or the like method.

Figure 3C:
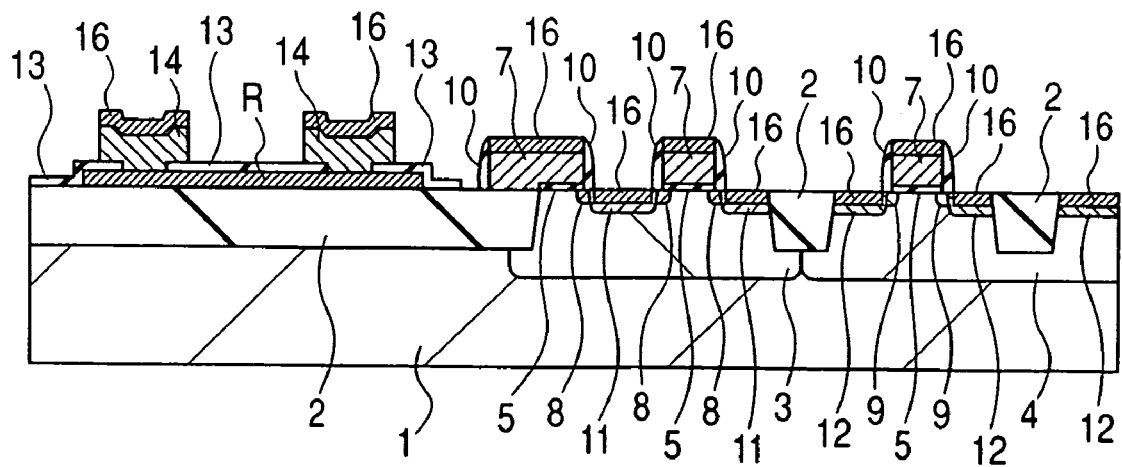

As illustrated in FIG. 3(c), the semiconductor substrate 1 is thermally treated using, for example, RTA (Rapid Thermal Anneal). By this thermal treatment, a silicide forming reaction occurs in a region wherein the metal film 15 is brought into contact with a silicon material, whereby a silicide layer 16 is formed. When the metal film 15 is made of cobalt, this silicide layer 16 is cobalt silicide (CoSi). An unreacted portion of the metal film 15 is selectively removed. The unreacted portion of the metal film can be wet etched under the conditions permitting etching of the metal film 15, but not permitting etching of the silicide layer 16.

Thus, formation of the silicide layer 16 over the gate electrodes 7, $n^+$ type semiconductor regions 11, $p^+$ type semiconductor regions 12 and withdrawal electrode 14 makes it possible to reduce the connection resistance with the plug in a region wherein a contact is to be formed and also to reduce the sheet resistance in a region constituting interconnections, such as the gate electrodes 7, $n^+$ type semiconductor regions 11 and $p^+$ type semiconductor regions 12. As a result, the wiring resistance and wiring-wiring resistance can be reduced, thereby improving the response rate of elements, whereby the performance of the semiconductor device can be improved.

The silicide layer 16 itself is poor in heat resistance. It differs in resistance (particularly in the case of cobalt silicide), depending on its crystal phase; and, even if formed of a crystal phase having a small resistance, it happens to undergo a phase change to a crystal phase having high resistance by the subsequent heat treatment. Alternatively, a silicide forming reaction proceeds at an interface between the silicide layer and a not-silicide-formed silicon region, and the silicon element ratio lowers in the silicide layer, leading to a stoichiometric deviation from the crystal structure. In this case, an increase in the resistance becomes a problem. Moreover, when an unreacted metal region exists, the unreacted metal forms its silicide, and at the same time, transfers to the silicon region as a result of the subsequent heat treatment, whereby voids appear in a region wherein the unreacted metal existed. If such voids are formed in the contact portion, they increase the contact resistance and in the worse case, cause a connection failure.

This embodiment is free of such a problem of heat resistance of the silicide layer 16, because, as will be described later, the subsequent thermal treatment is conducted at a suppressed temperature, particularly, a film for self alignment (silicon nitride film) is formed at a relatively low temperature by plasma CVD, not by thermal CVD. In short, the silicide layer 16 can be used while avoiding the problem of heat resistance, which makes it possible to enhance the performance of a semiconductor device.

Figure 4A:
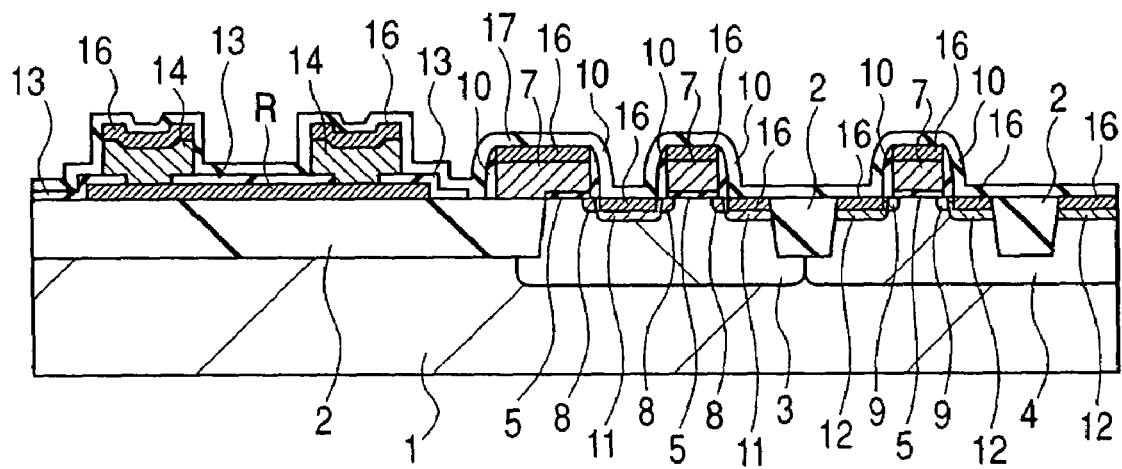

As illustrated in FIG. 4(a), a silicon nitride film 17 (the third insulating film in the item 1) is formed all over the surface of the semiconductor substrate 1. This silicon nitride film 17 is used for self alignment processing, as will be described later.

The silicon nitride film 17 is formed by plasma CVD at 350° C. or greater, preferably at 400° C. or greater. By the use of plasma CVD, a silicon nitride film can be formed at a lower temperature compared with thermal CVD, which requires a temperature of 700° C. or greater (for example, about 780° C.) for film formation. It is therefore unnecessary to consider the problem of heat resistance of the silicide layer 16.

In addition, the silicon nitride film 17 is formed using a raw material gas having silane (monosilane ($SiH_4$)) and nitrogen ($N_2$) but not having ammonia ($NH_3$). In this regard, it differs from a passivation film which will be described later. The passivation film is formed at about 350° C. by using a raw material gas having monosilane, ammonia and nitrogen. The passivation film is formed using an ammonia-containing raw material gas because good step coverage is important for this film, but the silicon nitride film 17 is formed using an ammonia-free raw material gas. The passivation film is formed at a relatively low temperature of about 350° C., but formation of the silicon nitride film 17 needs a temperature of 350° C. or greater, preferably 400° C. or greater. In short, for the formation of the silicon nitride film 17, ammonia is not used, while for the formation of the passivation film, ammonia is used. In addition, the silicon nitride film 17 is formed at a temperature higher than that of the passivation film. In this specification, the term "temperature" means the substrate temperature.

By using such an ammonia-free raw material gas, the hydrogen content in the silicon nitride film 17 can be reduced. Since a hydrogen content in the silicon nitride film 17 is lowered, release of hydrogen from the silicon nitride film 17 can be inhibited even by the subsequent heat treatment (for example, sintering or densification at about 700° C. in the case where an interlayer insulating film is made of PSG (Phosphor Silicate Glass) or SOG (Spin On Glass)). As described above, release of hydrogen increases the stress of the silicon nitride film 17, presumably causing peeling of the silicon nitride film 17 or a connection failure at the bottom portion of a connecting hole. In addition, the released hydrogen, as described above, inactivates the impurity (particularly, boron) in the impurity-introduced silicon layer (gate electrode 7, $n^+$ type semiconductor region 11, $p^+$ type semiconductor region 12, withdrawal electrode 14), thereby increasing its resistance. It facilitates transfer of an impurity (particularly, boron) and the impurity (particularly, boron) thus rendered diffusible transfers to the channel region of the MISFET and causes the threshold voltage to fluctuate. Such a stress increase of the silicon nitride film, fluctuations and increase in the resistance of the silicon layer and fluctuations in the threshold voltage of the MISFET due to release of hydrogen become a cause for the failure and performance deterioration of the resulting semiconductor device. In this embodiment, however, the silicon nitride film 17 does not contain so much hydrogen in the as-deposited state, so that no such problem occurs.

Use of an ammonia-free raw material gas makes it possible to decrease plasma-induced damage upon formation of the silicon nitride film 17. When the raw material gas contains ammonia, plasma is presumed to have an increased density by the Penning effect brought about by the addition of ammonia. In this embodiment, because of use of a raw material gas free of ammonia, the plasma density does not show an excessive increase, and plasma damage or ion bombardment can therefore be suppressed. As a result, damage to a silicon layer (gate electrode 7, $n^+$ type semiconductor region 11, $p^+$ type semiconductor region 12 and withdrawal electrode 14, or silicide layer 16) to serve as a substrate over which the silicon nitride film 17 is formed can be reduced, and generation of dangling bonds and an increase in the resistance due to these dangling bonds can be prevented.

As described above, the hydrogen contained in the silicon nitride film 17 is relatively small, at least smaller than that contained in the passivation film (silicon nitride film) which will be described later.

Test results by the present inventors on the hydrogen content in the silicon nitride film 17 or the quality of the silicon nitride film related to the hydrogen content will be described.

Figure 15:
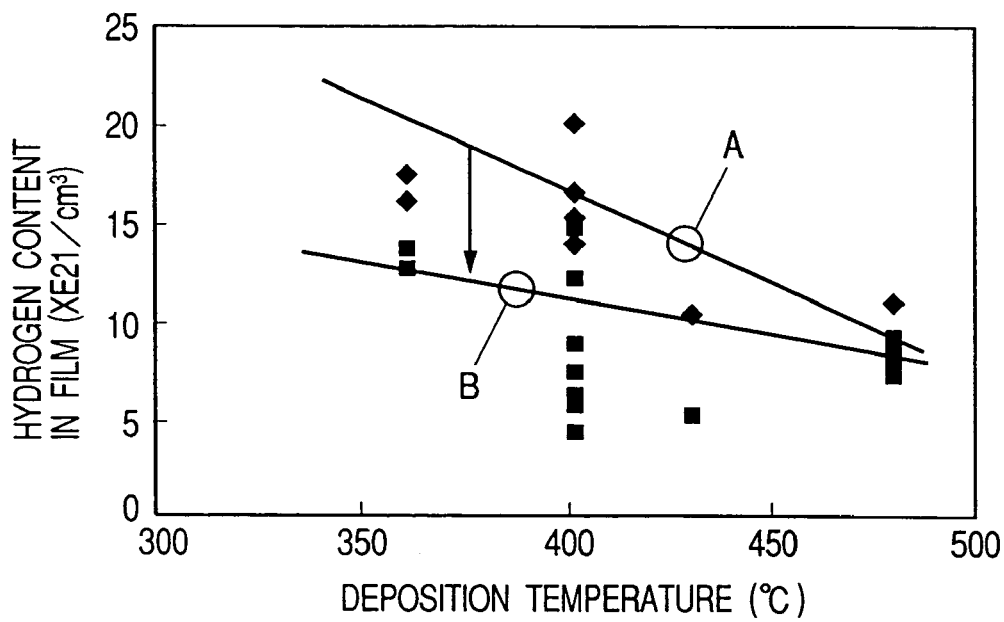
FIG. 15 is a graph showing the hydrogen content in a silicon nitride film at varied film forming temperatures.

FIG. 15 is a graph showing the hydrogen content in a silicon nitride film at varied film forming temperatures (deposition temperatures). The rhombic data points show the hydrogen content of the film in the as-deposited state, while the square data points show the hydrogen content in the film after annealing at 780° C. for 10 seconds. Line A is a test line showing the hydrogen content of the film in the as-deposited state, while Line B is a test line showing the hydrogen content in the annealed film. As is apparent from Line A, the higher the deposition temperature, the lower is the hydrogen content in the film. The difference between Line A and Line B (hydrogen content released by annealing) becomes smaller with an increase in the deposition temperature. This suggests that the hydrogen content in the as-deposited state can be reduced and the amount of hydrogen released by annealing can be decreased by increasing the deposition temperature.

Figure 16:
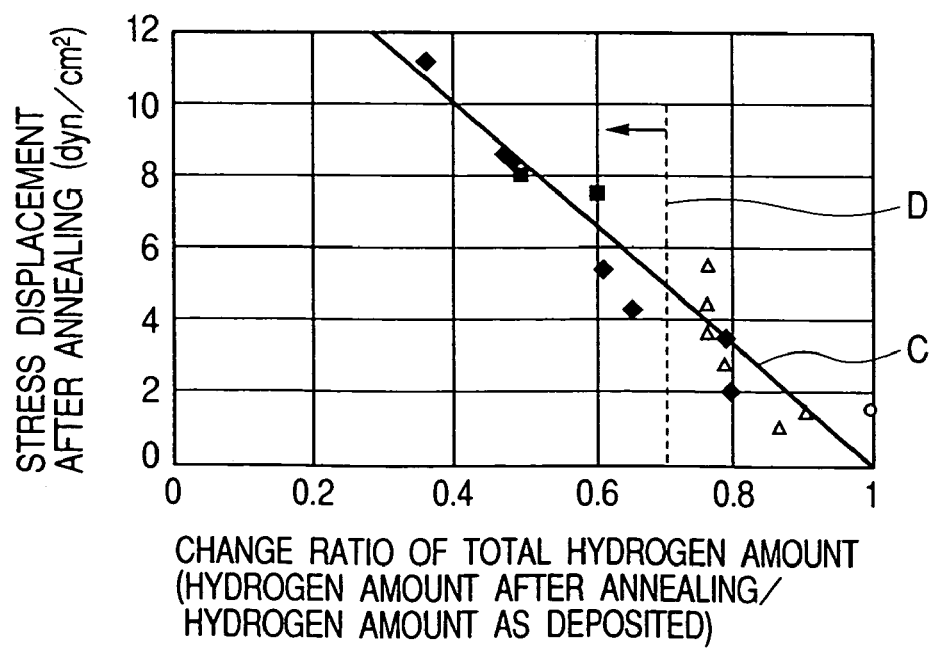
FIG. 16 is a graph showing the relationship between the hydrogen content changing ratio by annealing of the silicon nitride film and stress displacement after annealing.

FIG. 16 is a graph illustrating the relationship between the hydrogen content changing ratio by annealing and stress displacement after annealing. Line C is a test line available from each of the data points. Here, the hydrogen content changing ratio is obtained by dividing the hydrogen content after annealing by the hydrogen content in the as-deposited state. As this diagram suggests, there is a close relationship between the hydrogen content changing ratio and stress displacement after annealing. The greater the hydrogen content changing ratio (the higher the deposition temperature), the smaller the stress displacement. With a line of about 0.7 (Line D) as a boundary, peeling of a film occurs in a region wherein the hydrogen amount changing ratio is smaller (at a lower deposition temperature), while peeling of the film does not occur in a region wherein it is greater (at a higher deposition temperature). Results of the test show that the peeling of a silicon nitride film can be prevented almost completely by setting the deposition temperature at 400° C. This is the reason why the silicon nitride film 17 is formed preferably at 400° C. or greater.

Figure 17:
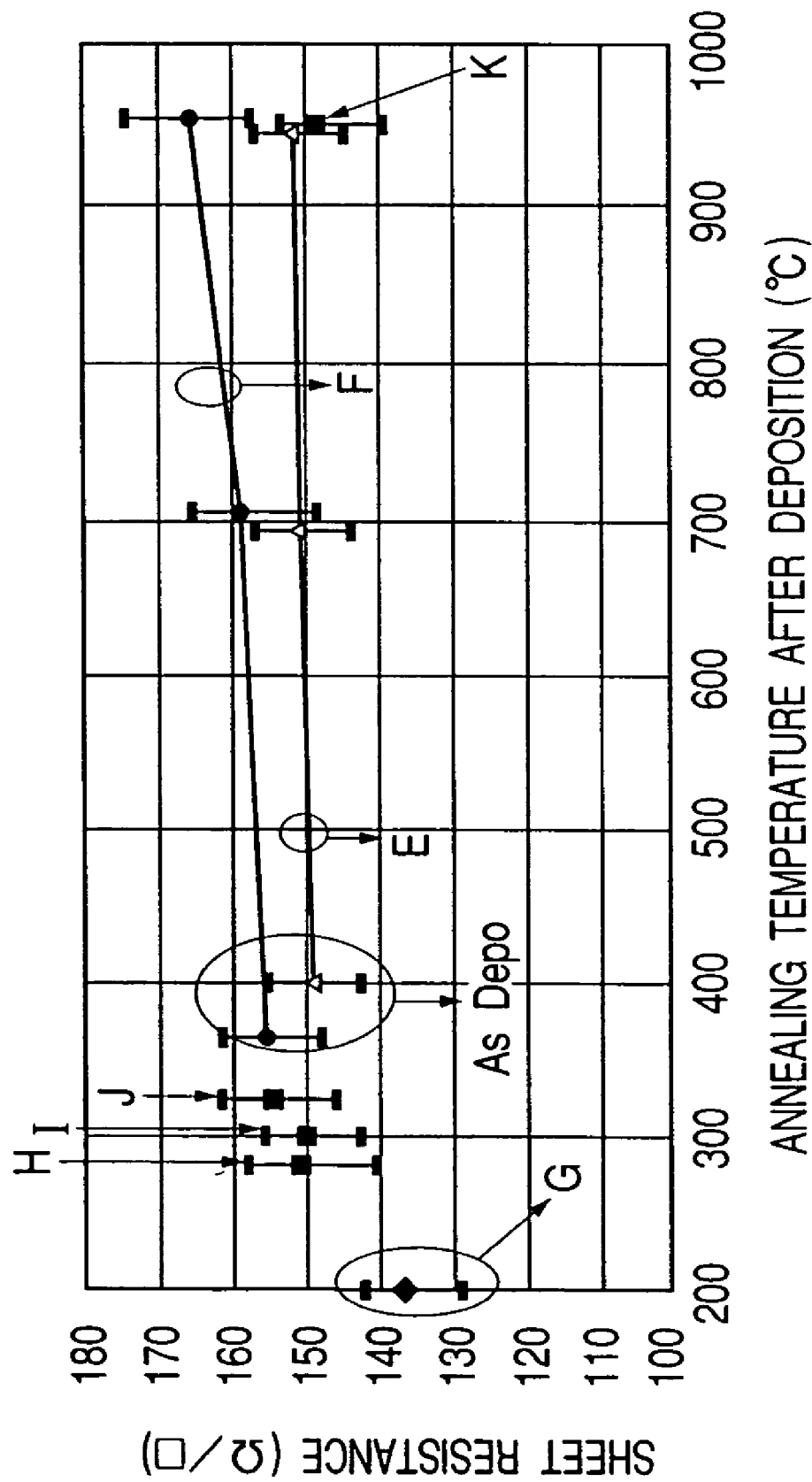
FIG. 17 is a graph of the sheet resistance of a polycrystalline silicon film plotted against the annealing temperature when a silicon nitride film disposed over the boron-containing polycrystalline silicon film is annealed.

FIG. 17 is a graph wherein the sheet resistance, after annealing, of a boron-containing polycrystalline silicon film over which a silicon nitride film has been deposited is plotted versus annealing temperature. An error bar is attached to each of the data.

The triangle data points show the data of a silicon nitride film formed at 400° C. by using a raw material gas having monosilane and nitrogen (two-element raw material gas), and Line E is a test line connecting these data.

The black circle data points show the data of a silicon nitride film formed at 360° C. using a raw material gas including monosilane, ammonia and nitrogen (three-element raw material gas), and Line F is a test line connecting these data.

The rhombic data point G shows the reference datum on the sheet resistance (in the as-deposited state) of an annealing-free polycrystalline silicon film over which no silicon nitride film is deposited. It, of course, shows the lowest resistance.

The square data points show various comparison data provided for consideration. Point H is a datum of a polycrystalline silicon film treated with $NH_3$ plasma, Point I is a datum of a polycrystalline silicon film with $N_2$ plasma, Point J is a datum of a polycrystalline silicon film treated with $NH_3/N_2O$ plasma and Point K is a datum of a polycrystalline silicon film treated with $N_2$ plasma, followed by heat treatment at 950° C. for 10 seconds.

Data in FIG. 17 have revealed that the sheet resistance of a polycrystalline silicon film is lower (in other words, closer to the polycrystalline silicon film in the as-deposited state) when a silicon nitride film is formed at 400° C. by using a two-element gas (Line E) than when a silicon nitride film is formed at 360° C. by using a three-element gas (Line F), suggesting that the polycrystalline silicon film is not deteriorated. Comparison between the datum (point H) on treatment with $NH_3$ plasma or the datum (Point I) on treatment with $N_2$ plasma and the datum (Point J) on treatment with $NH_3/N_2O$ plasma is usefull as reference data for explaining the difference between the resistance of the silicon nitride film formed using a two-element gas and the silicon nitride film formed using a three-element gas. Data of Points H and I correspond to the data (Line E) of a two-element gas, while the datum on Point J corresponds to the datum (Line F) of a three-element gas. The sheet resistance is almost equal in these data. Plasma from a one-element gas is formed in each of $NH_3$ plasma and $N_2$ plasma. On the other hand, plasma from a two-element gas is formed in $NH_3/N_2O$ plasma; and, in this case, the Penning effect, that is, a phenomenon wherein the degree of plasma dissociation becomes higher compared with the case of a one-element gas, is presumed to occur. The difference between the data at Points H and I and datum at Point J is presumed to be due to plasma-induced damage of a polycrystalline silicon film resulting from the Penning effect. When similar consideration is applied to Line E and Line F, the Penning effect resulting from ammonia occurs when the silicon nitride film is deposited using a three-element gas (Line F). Compared with the two-element gas (Line E), the polycrystalline silicon film serving as a substrate receives much plasma-induced damage and is presumed to have increased resistance. This experimentally indicates that, in this embodiment, with provision of the silicon nitride film 17 in the form of a silicon nitride film formed using a two-element gas at a substrate temperature of 400° C. or greater, the resistance of the gate electrode 7 or the like can be maintained low and the performance of a semiconductor device can be maintained high.

The sheet resistance of a silicon nitride film formed using a two-element gas does not increase so much even if it is annealed at a high temperature, while the sheet resistance of a silicon nitride film formed by using a three-element gas increases largely by annealing at a high temperature. The datum (Point K) on the treatment of a polycrystalline silicon film with $N_2$ plasma, followed by thermal treatment at 950° C. for 10 seconds is useful as a reference for explaining the existence of a change in the sheet resistance depending on the annealing temperature. The datum on Point K shows a polycrystalline silicon film subjected only to $N_2$ plasma treatment and subsequent thermal treatment, so that an increase in the sheet resistance of the polycrystalline silicon film is presumed to result from such treatments. In short, without the influence of hydrogen, an increase in sheet resistance to an extent as shown in Point K occurs. The data (Line E) on the use of a two-element gas and thermal treatment (annealing) at about 950° C. are almost equal to that of Point K, but the data (Line F) on the use of a three-element gas indicate a large increase in the sheet resistance.

As illustrated in FIG. 15, when a two-element gas is used, the influence by hydrogen is negligible, but a large amount of hydrogen is released when a three-element gas is employed. The resistance of the polycrystalline silicon film is presumed to increase owing to this hydrogen. In short, an increase in the resistance of the polycrystalline silicon film (Line F) with an increase in the annealing temperature is presumed to occur because released hydrogen inactivates an impurity (boron) in the polycrystalline silicon film. This experimentally indicates provision of the silicon nitride film 17 of the present invention of a silicon nitride film formed at 400° C. or greater by using a two-element gas makes it possible to suppress fluctuations in the resistance of the gate electrode 7 or the like and maintain the reliability of the semiconductor device, even if a step requiring a high treating temperature exists after the formation of the silicon nitride film.

Thus, by providing the silicon nitride film 17 of this embodiment of a silicon nitride film formed at a substrate temperature of 400° C. or greater by plasma CVD using a raw material gas including silane and nitrogen, peeling of the silicon nitride film 17 can be prevented and release of hydrogen from the silicon nitride film 17 can be suppressed, leading to improvements in the performance and reliability of the semiconductor device.

Figure 4B:
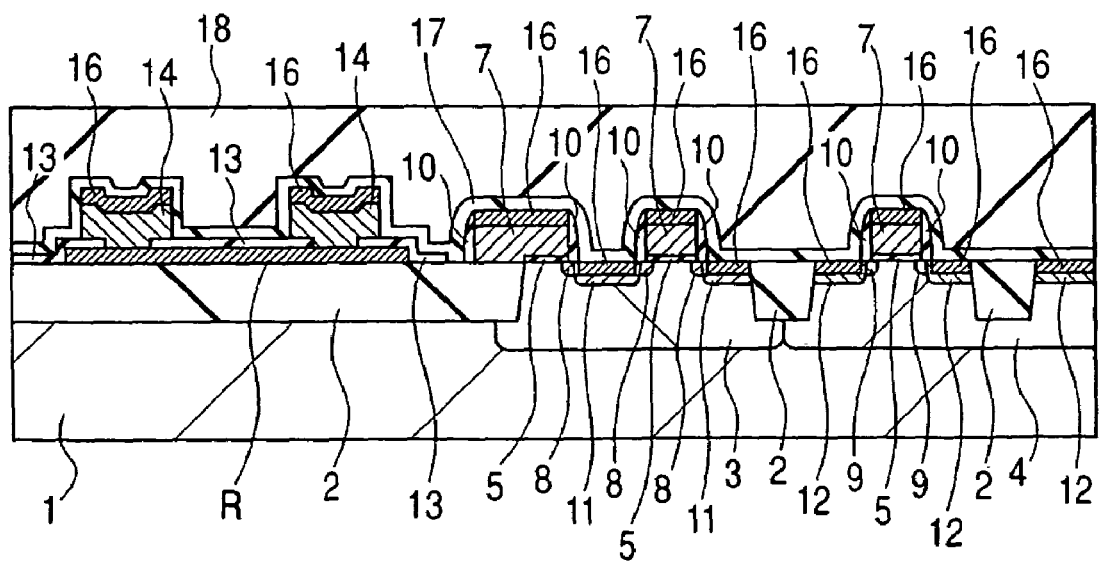

As illustrated in FIG. 4(*b*), an interlayer insulating film 18 (the fourth insulating film in the item 1, etc.) is formed. This interlayer insulating film 18 is made of, for example, a silicon oxide film formed, for example, by CVD. Alternatively, PSG, SOG or the like film may be used as the interlayer insulating film 18. A self flowable film, such as PSG or SOG, can well embed the miniaturized gate electrode 7, facilitating surface planarization. When PSG or SOG is used, it is subjected to thermal treatment, such as sintering or densification. Since the release of hydrogen from the silicon nitride film 17 is suppressed, as described above, problems which will otherwise occur after heat treatment, such as peeling of the silicon nitride film 17, a rise or fluctuations in the resistance of the gate electrode 7 or fluctuation in the threshold voltage, do not occur.

The surface of the interlayer insulating film 18 may be planarized, for example, by CMP (Chemical Mechanical Polishing).

Figure 5A:
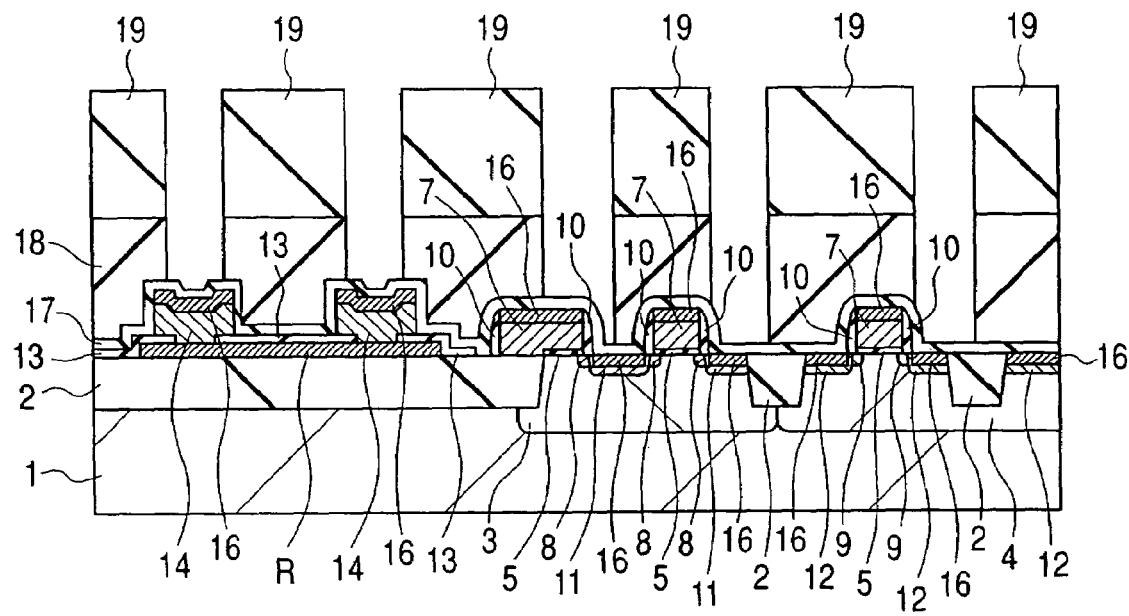

As illustrated in FIG. 5(*a*), a photoresist film 19 having openings defined in accordance with connecting hole patterns is formed over the interlayer insulating film 18. With this photoresist film 19 being used as a mask, etching is conducted to partially form connecting holes 20 (the first openings in the item 1, etc.). This etching (the first etching step) is conducted under the conditions permitting etching of a silicon oxide film, but not easy etching of a silicon nitride film. Selection of such conditions can make the silicon nitride film 17 function as an etching stopper. This etching makes it possible to expose the upper surface of the silicon nitride film 17, even if the connecting holes are different in depth. In other words, sufficient over-etching can be effected until the deepest hole is formed, whereby holes different in depth can be formed definitely. In addition, even if the etching rate on the wafer is not uniform, sufficient over-etching can be carried out until the completion of the processing of a hole whose etching is completed last. The processing margin of the connecting holes can therefore be increased.

Figure 5B:
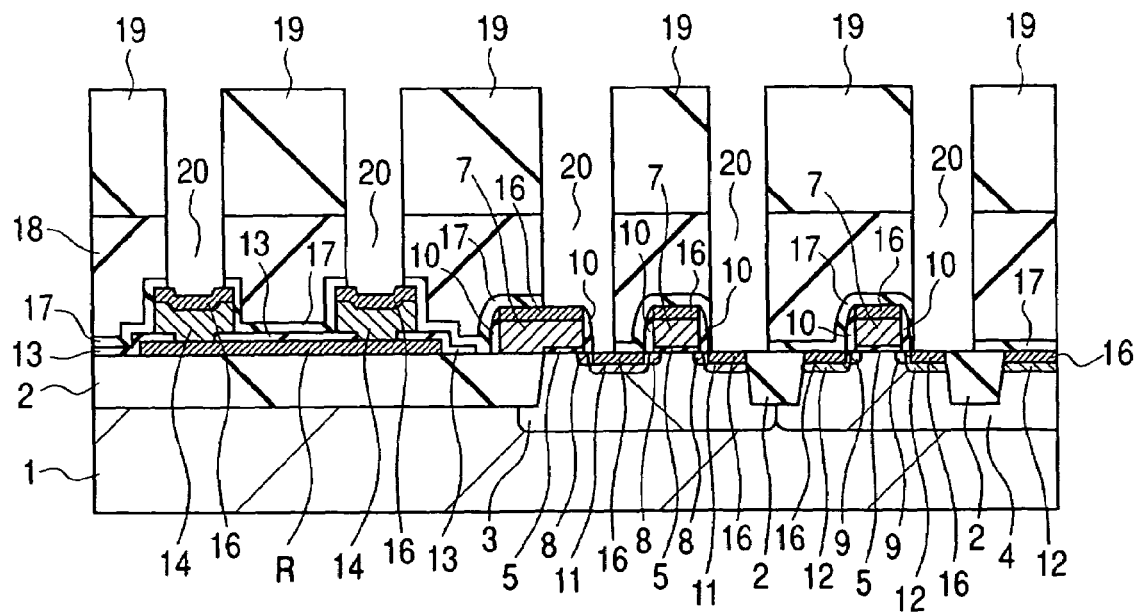

As illustrated in FIG. 5(b), a second etching is conducted to remove the silicon nitride film 17 from the bottom portion of the connecting holes 20, whereby the opening of connecting holes 20 is completed. The second etching is carried out under conditions facilitating etching of a silicon nitride film, but not facilitating etching of a silicon oxide film. Even if sufficient over-etching is conducted upon second etching, excessive etching of the underlying semiconductor substrate 1 (element isolation region 2) can be inhibited. More specifically, the silicon nitride film 17 is much thinner than the interlayer insulating film 18, so that over-etching in the second etching step is sufficient when about half of the thickness of the silicon nitride film 17 at most is etched. The over-etching in the second etching step can therefore be suppressed to an extent that is not so large as to excessively etch even the element isolation region 2 or the like and cause a problem. This makes it possible to prevent deterioration in the performance and reliability of the MISFET, which will otherwise occur due to excessive etching in the element isolation region 2 or the like, but to maintain the performance and reliability of the semiconductor device high.

The silicon nitride film 17 does not peel off easily as described above, so that no peeling of the silicon nitride film 17 occurs in this opening step of connecting holes 20.

Figure 6A:
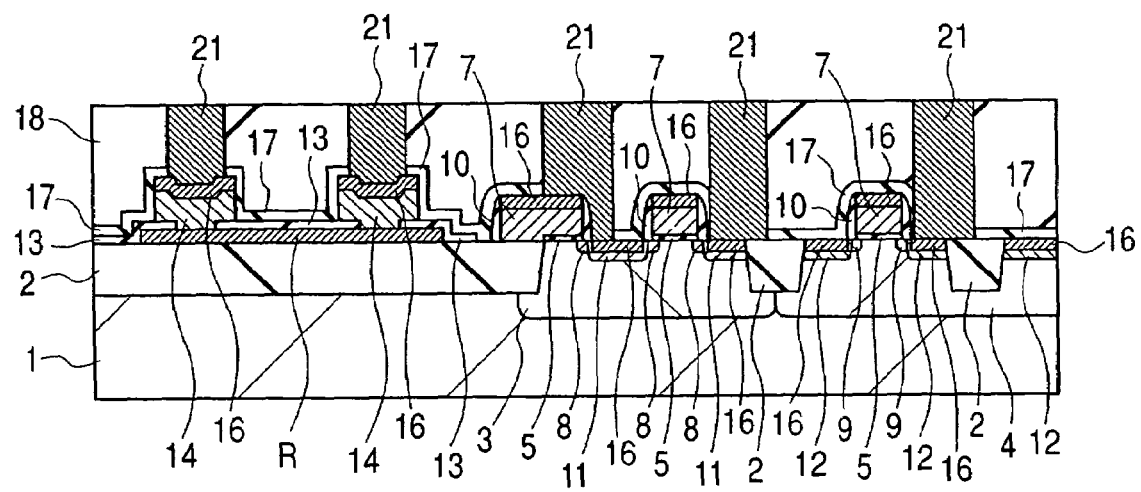

As illustrated in FIG. 6(a), plugs 21 are formed in the connecting holes 20, for example, in the following manner. A titanium nitride (TiN) film is formed all over the surface of the semiconductor substrate 1, including the inside of each of the connecting holes 20. This titanium nitride film can be formed, for example, by CVD. Owing to the excellent step coverage of CVD, the titanium nitride film can be formed with a uniform thickness even inside of the minute connecting holes 20. Since the silicon nitride film 17 does not peel off easily, the step coverage of the titanium nitride film is not disturbed. Next, a tungsten (W) film is formed to embed the connecting holes therewith. This tungsten film is formed, for example, by CVD. Even the minute connecting holes 20 can be embedded similarly with tungsten by CVD. The titanium nitride film and tungsten film in a region outside the connecting holes 20 are then removed by CMP, whereby the plugs 21 can be formed.

Figure 6B:
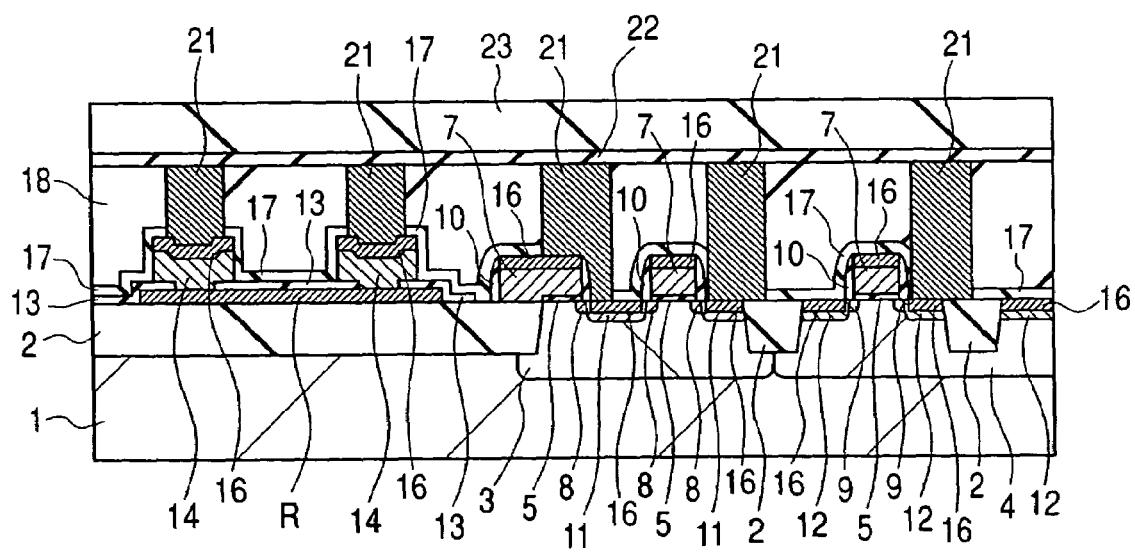

As illustrated in FIG. 6(b), a silicon nitride film 22 is formed over the interlayer insulating film 18 and plug 21, followed by the formation of an insulating film 23 for the first wiring layer. This silicon nitride film 22 is a film serving as an etching stopper upon forming a trench in the insulating film 23, so that a material having an etching selectivity to the insulating film 23 relative to the silicon nitride film is employed. As the insulating film 23, a material having a small dielectric constant is used in order to suppress the capacity between interconnections to as low a level as possible. The insulating film 23 is for example a silicon oxide film. Alternatively, the insulating film 23 may be an organic SOG film having a small dielectric constant or a fluorine-containing SOG film. With the silicon nitride film 22 and insulating film 23, a second-layer interconnection will be formed. Thus, their total thickness is determined by a designed thickness necessary for the second-layer interconnection. In consideration of lowering the capacity between interconnections, a silicon nitride film 22 having a high dielectric constant is desired to have a thickness as thin as possible insofar as it has a sufficient thickness to exhibit a stopper function.

As the silicon nitride film 22, a silicon nitride film formed in a similar manner to the silicon nitride film 17 at a substrate temperature of 400° C. or greater by plasma CVD using a raw material gas including monosilane and nitrogen can be used. By application of a film, that is similar to the silicon nitride film 17, to the silicon nitride film 22, a film, that is formed without a high-temperature step as in thermal CVD and in which the amount of hydrogen that is released is suppressed, can be used as a stopper film. As a result, even if a step causing hydrogen release exists after this step, peeling of the silicon nitride film 22 does not occur and the release of hydrogen is suppressed, whereby there is no room for released hydrogen causing a deterioration in the characteristics of the MISFET.

Figure 7A:
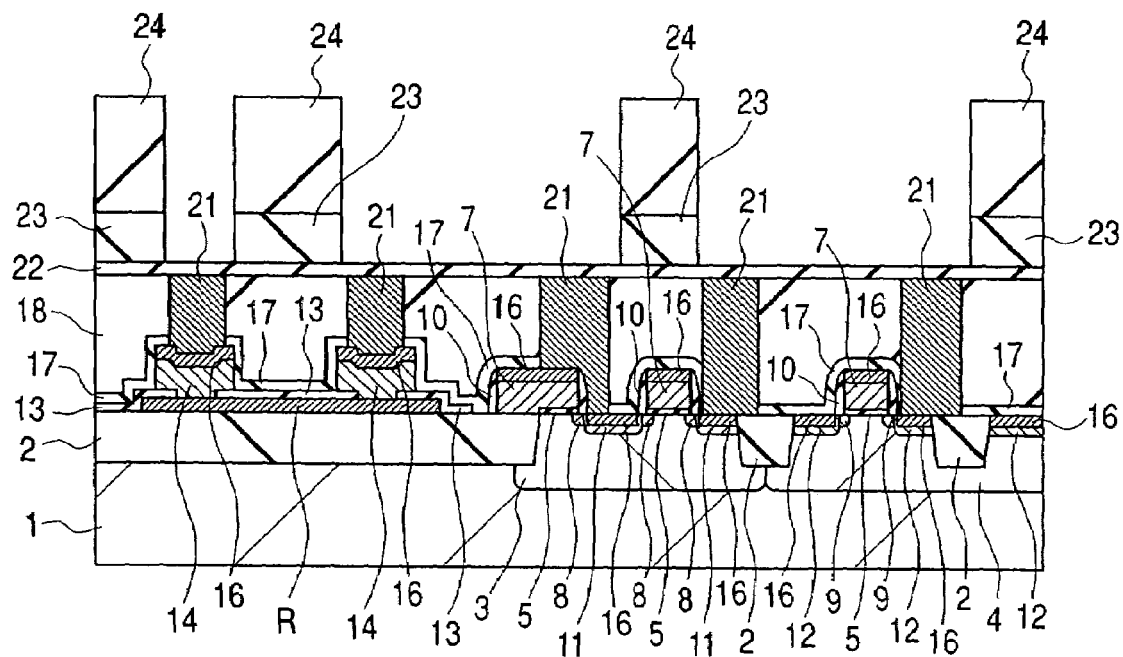

As illustrated in FIG. 7(a), a photoresist film 24 having an opening formed according to the wiring pattern of the first wiring layer is patterned on the insulating film 23, and using this photoresist film 24 as a mask, first etching is conducted. In the insulating film 23, a wiring trench 25 is defined partially by this first etching. This etching is conducted under conditions facilitating etching of a silicon oxide film, but not facilitating etching of a silicon nitride film. The silicon nitride film 22 then serves as an etching stopper.

Figure 7B:
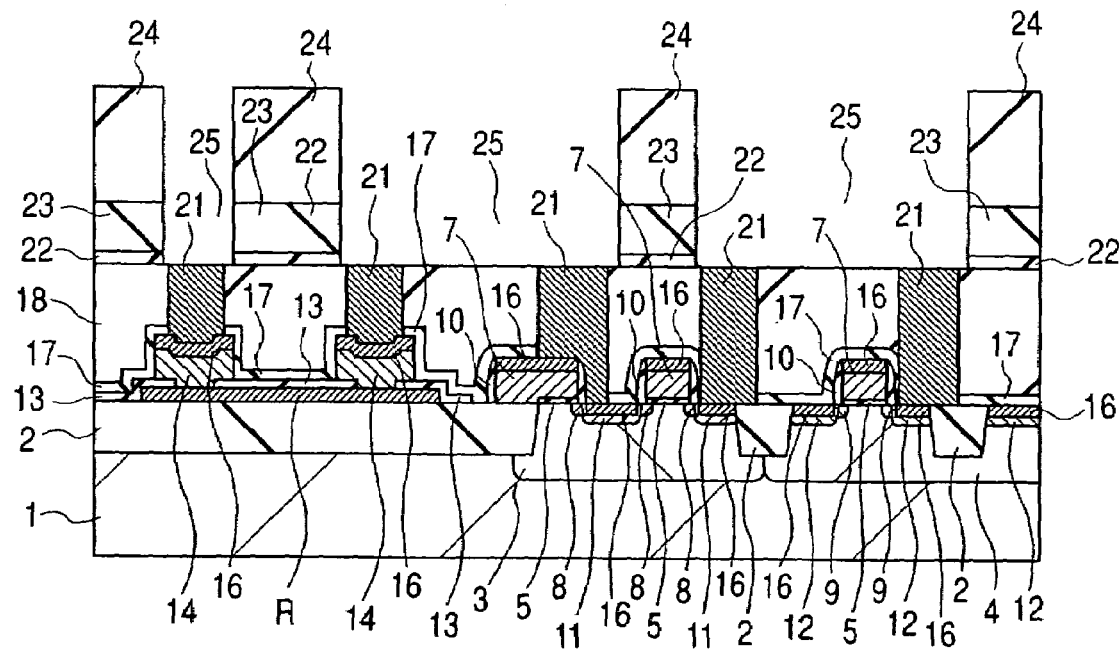
Figure 8A:
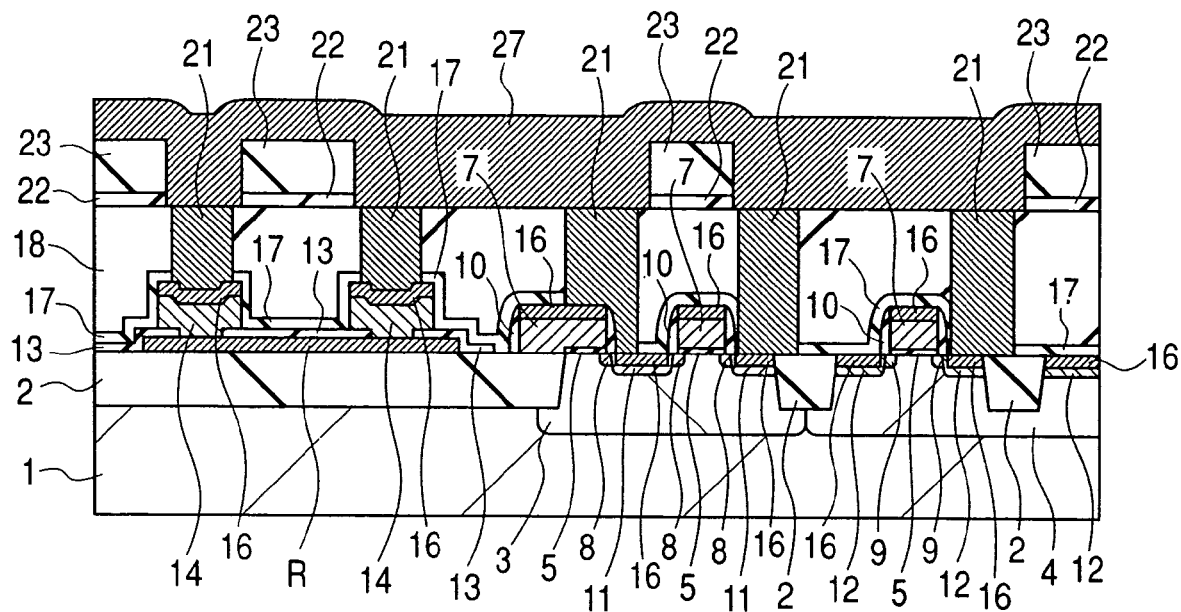
Figure 8B:
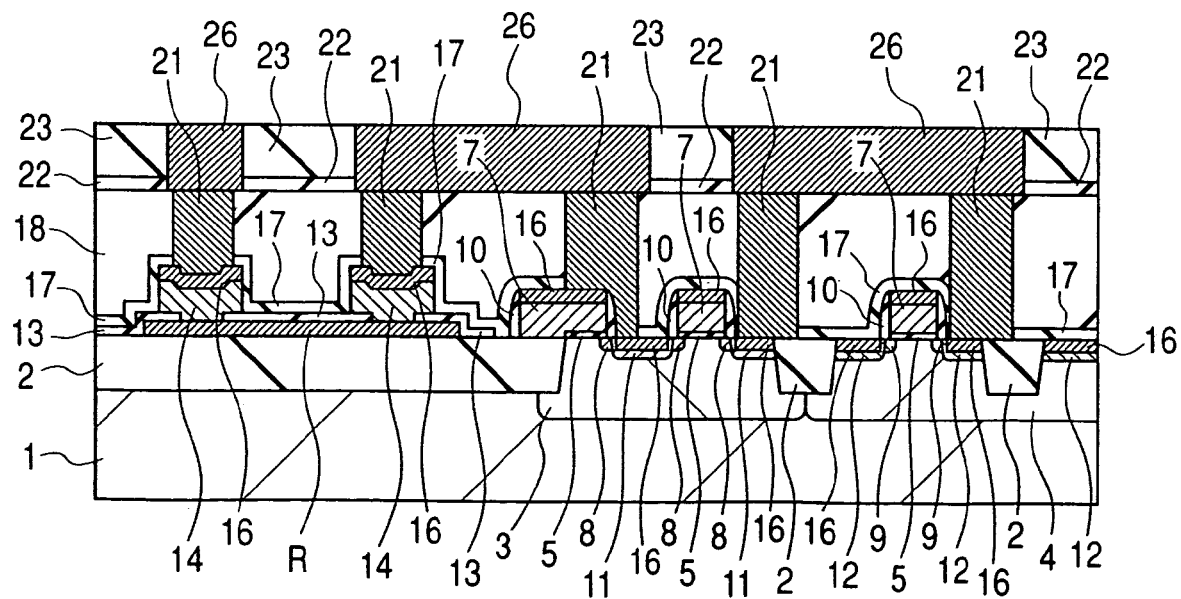

As illustrated in FIG. 7(b), second etching is conducted under conditions permitting etching of a silicon nitride film. Since the silicon nitride film 22 is formed so as to be sufficiently thin, as described above, not so much over-etching is necessary upon second etching, and excessive etching of the interlayer insulating film 18 can be suppressed. By such two-stage etching, the wiring trench 25 can be formed uniformly and surely.

Then, an interconnection 26 of the first wiring layer is formed inside of the wiring trench 25. The interconnection 26 is formed of a barrier layer and a main conductive layer. The barrier layer is made of, for example, a titanium nitride film, while the main conductive layer is made of, for example, copper. The barrier layer has a function of preventing diffusion of copper therearound, and, for this purpose, a titanium nitride film can be employed. The barrier layer is, however, not limited to a titanium nitride film, but another metal film having a function of preventing diffusion of copper can also be employed. Instead of titanium nitride, tantalum (Ta) or tantalum nitride (TaN) can be used. As the barrier layer, a description will hereinafter be given using a titanium nitride film as an example. As described above, tantalum or tantalum nitride can be used instead. The copper film functions as a main conductive layer and can be formed, for example, by plating. Prior to plating, a thin copper film can be formed by sputtering as a seed film. Alternatively, the copper film may be formed by sputtering. In this case, it is recommended to fluidize the copper film, which has been formed by sputtering, by heat treatment, thereby improving embedding properties in a connecting hole or wiring trench. In the following description, formation of a copper film by plating will be exemplified. As described above, sputtering may be used alternatively.

The interconnection 26 is formed as follows. A titanium nitride film is formed all over the semiconductor substrate 1, including the inside of the wiring trench 25, followed by formation of a copper film to embed the wiring trench 25. A metal laminate film 27 thus formed of the titanium nitride film and copper film is embedded in the wiring trench 25 (FIG. 8(a)).

For the formation of the titanium nitride film and the copper film, CVD and plating, for example, are employed, respectively. Prior to the formation of the copper film by plating, a copper seed film can be formed, for example, by sputtering. Then, the copper film and titanium nitride film in a region outside the wiring trench 25 are removed by CMP, whereby interconnection 26 is formed (FIG. 8(*b*)).

Figure 9A:
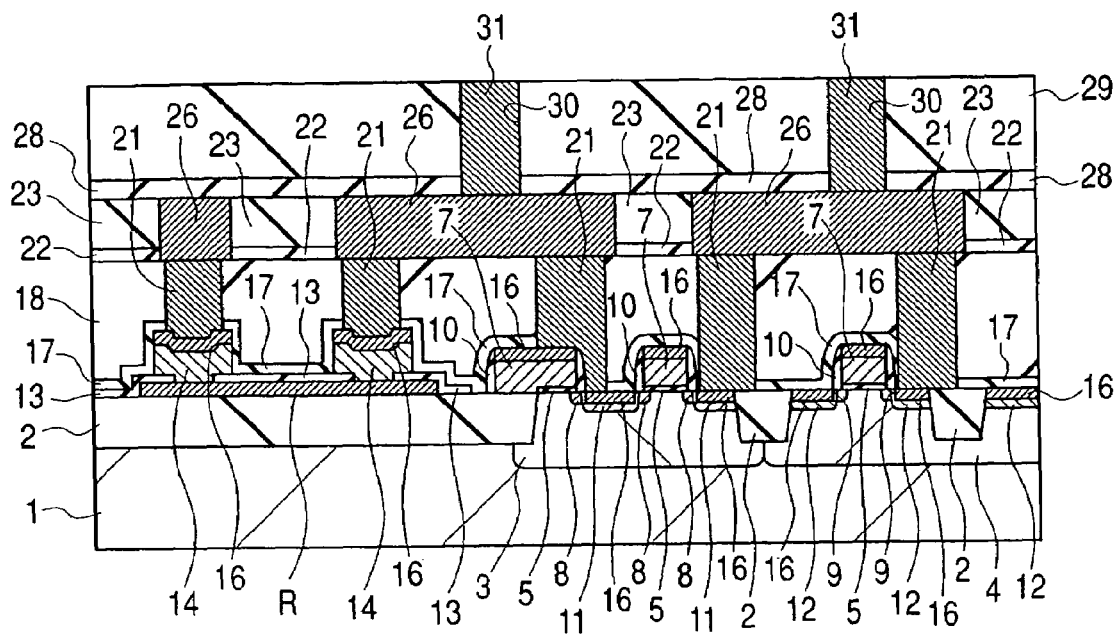
Figure 9B:
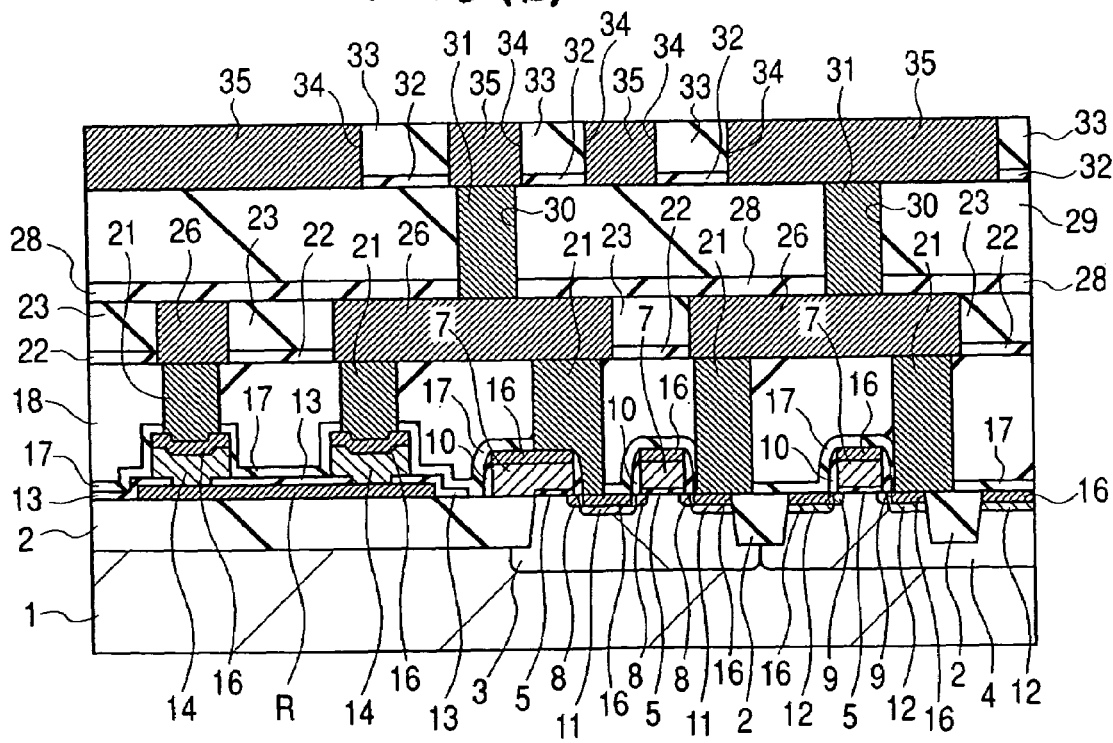

As illustrated in FIG. 9(*a*), a stopper insulating film 28 and an interlayer insulating film 29 are successively formed over the interconnection 26 and insulating film 23. The stopper insulating film 28 is formed of a material having an etching selectivity to the interlayer insulating film 29, and a silicon nitride film can be employed, for example. The interlayer insulating film 29, for example, is made of a silicon oxide film. As the stopper insulating film 28, a silicon nitride film formed under similar conditions to the silicon nitride film 17 can be used.

A photoresist film having openings according to connecting hole patterns is patterned on the interlayer insulating film 29. With this photoresist film being used as a mask, the interlayer insulating film 29 is etched. Upon this etching, conditions are selected to prevent smooth etching of the silicon nitride film, but to facilitate etching of the silicon oxide film, whereby the interlayer insulating film 29 can be etched using the stopper insulating film 28 as an etching stopper. Then, the stopper insulating film 28 is etched under conditions selected to etch the silicon nitride film, whereby connecting holes 30 are formed. As described above, excessive etching of the underlying film can be suppressed by this two-stage etching.

Plugs 31 are then formed inside of the connecting holes 30. These plugs 31 are formed as follows. First, a barrier layer is formed all over the semiconductor substrate 1 including the inside of the connecting holes 30, followed by a formation of a copper (Cu) film for embedding therewith these connecting holes 30. The copper film and barrier film in a region outside the connecting holes 30 are removed by CMP, whereby the plugs 31 are formed.

As illustrated in FIG. 9(*b*), similar to the interconnection 26, a silicon nitride film 32 and a silicon oxide film 33 are formed, followed by two-stage etching of the silicon oxide film 33 and silicon nitride film 32 to form a wiring trench 34. An interconnection 35, similar to the interconnection 26, is formed inside of the wiring trench 34. As the silicon nitride film 32, a silicon nitride film similar to the above-described silicon nitride film 22 can be used.

Figure 10:
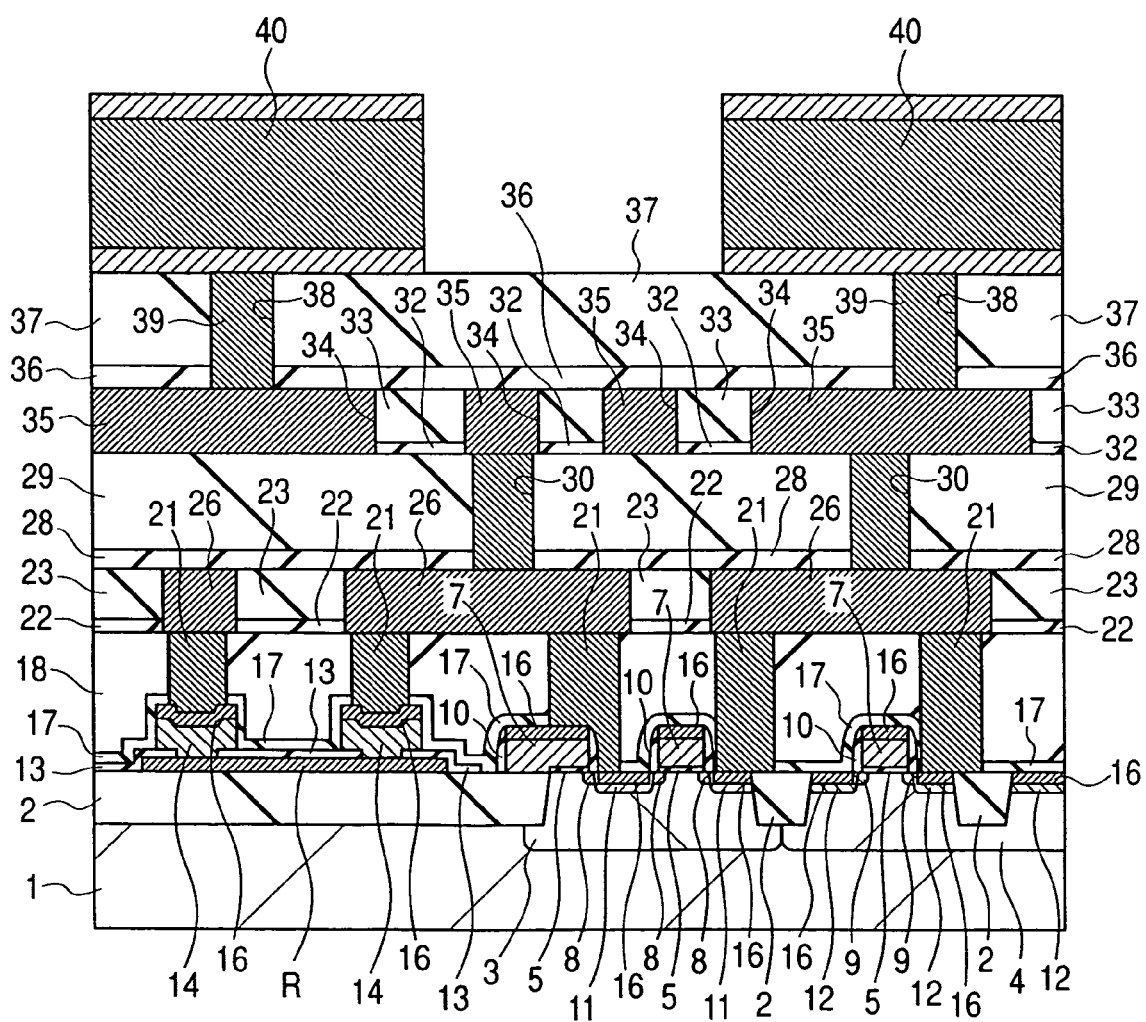

As illustrated in FIG. 10, in a similar manner to the plugs 31, plugs 39 are formed. First, a stopper insulating film 36 and an interlayer insulating film 37 are formed. By two stage etching of the stopper insulating film 36 and interlayer insulating film 37, connecting holes 38 are formed. Inside of these connecting holes 38, the plugs 39 similar to the plugs 31 are formed.

An interconnection 40 is then formed over the interlayer insulating film 37. The interconnection 40, for example, is a laminate of a titanium film, an aluminum film and a titanium nitride film. This interconnection 40 is formed, for example, by successively depositing the titanium film, aluminum film and titanium nitride film, and then etching these films into a predetermined pattern by photolithography.

Figure 11:
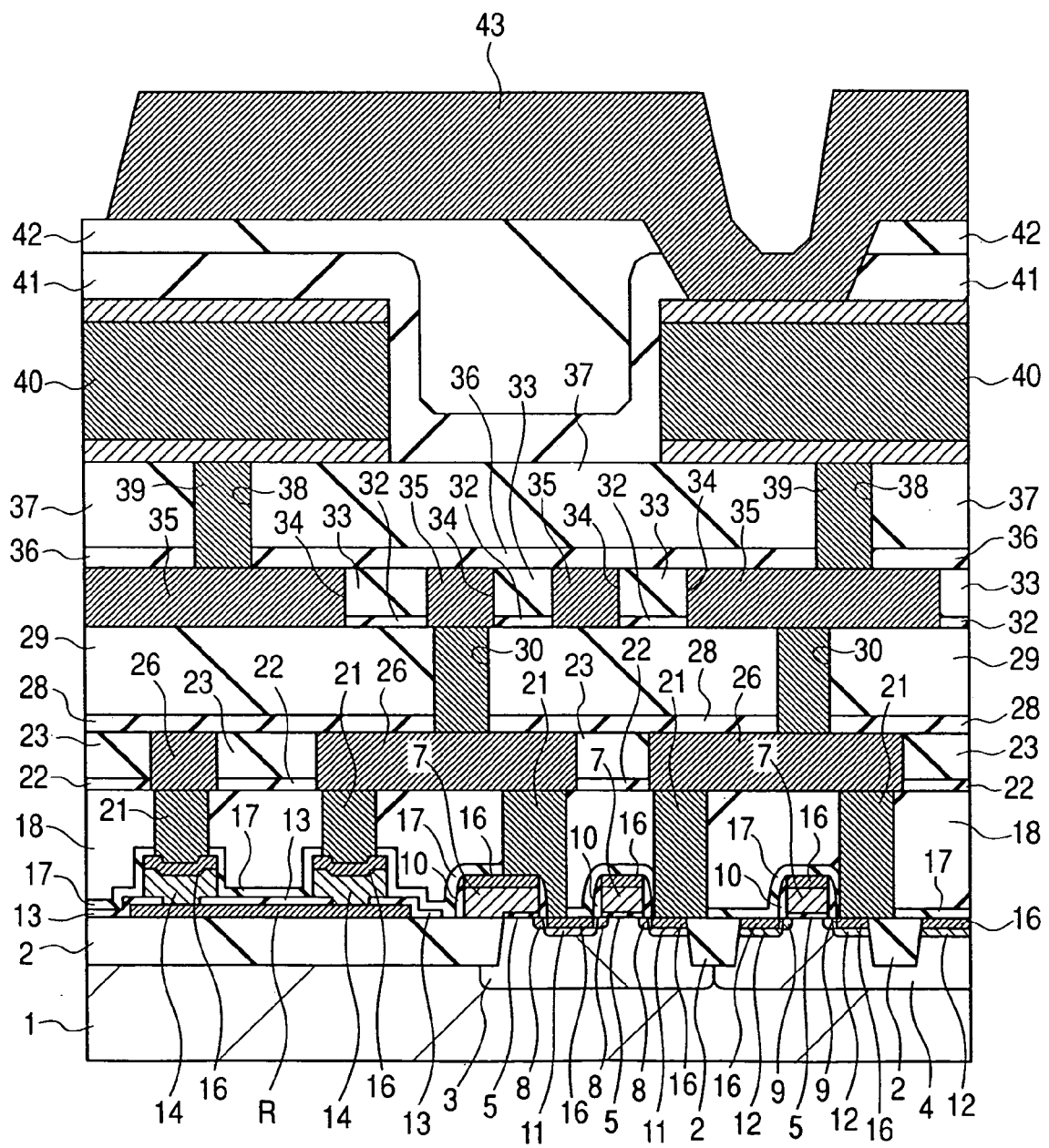

As illustrated in FIG. 11, an insulating film 41 is formed for covering the interconnection 40, followed by the formation of an insulating film 42 over the insulating film 41. This insulating film 41 is formed from, for example, a silicon oxide film, for example, by CVD. The insulating film 42 is made of, for example, SOG. The use of the SOG film makes it possible to planarize the unevenness on the surface derived from the interconnection 40. Upon formation of this SOG film, thermal treatment is conducted for reflow of the SOG film, but high performance and reliability of the resulting semiconductor device are not lost, because a silicon nitride film that has an excellent peeling resistance and is capable of suppressing hydrogen release has been used for the silicon nitride films 17 and 22. A silicon oxide film may be formed further over the insulating film 42.

Over the insulating film 42, an interconnection 43 (the third conductor piece in the item 1, etc.) is formed. The interconnection 43 includes a bonding pad, and it is connected with an external connecting conductor piece (for example, bump). The interconnection 43 is made of, for example, an aluminum film and is formed, for example, by sputtering.

Figure 12:
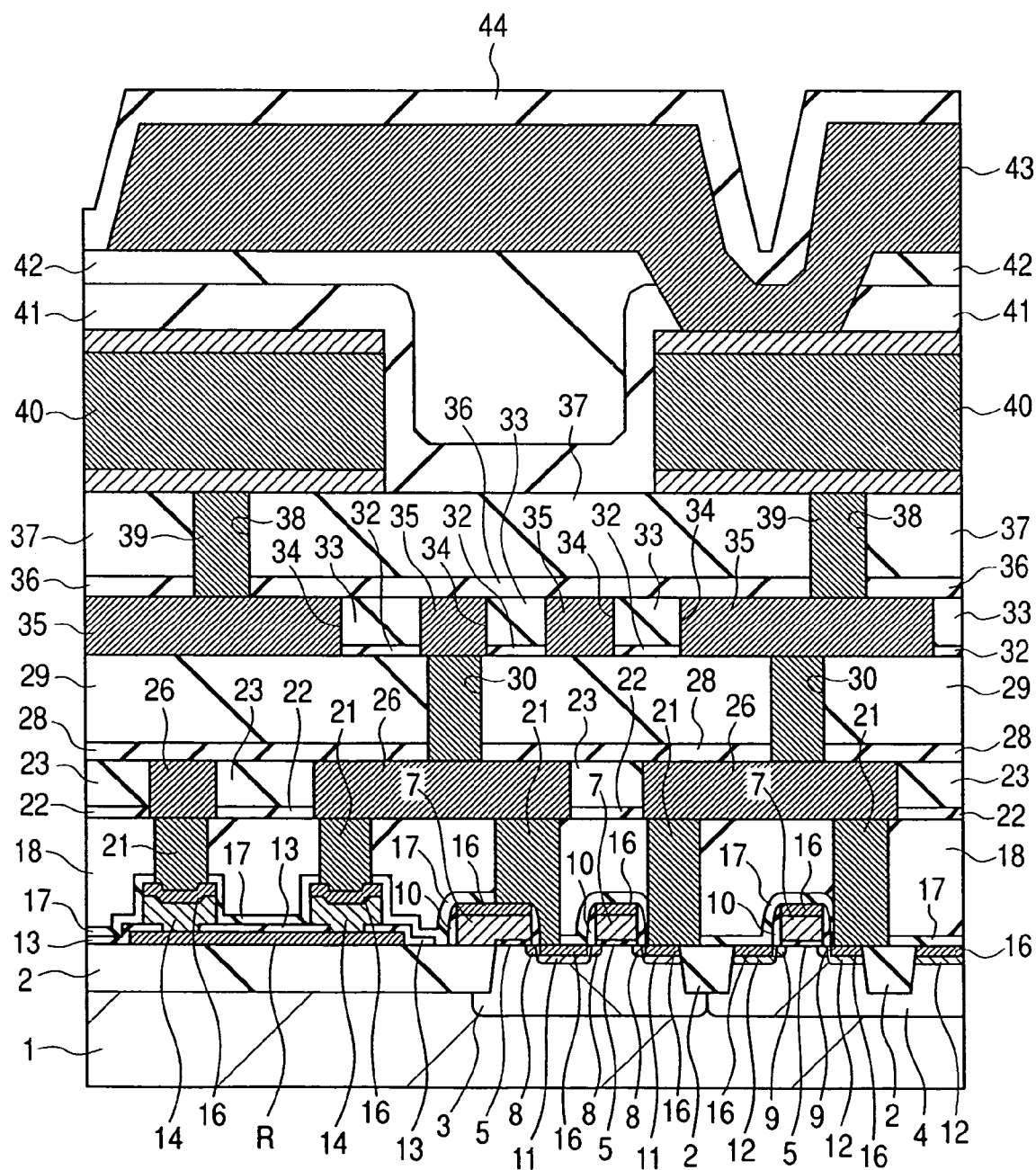

As illustrated in FIG. 12, a silicon nitride film 44 (the fifth insulating film in the item 1, etc.) is formed to cover the interconnection 43. This silicon nitride film 44 is a film constituting a passivation film and serves to block the invasion of water or impurities from the outside of the semiconductor device. In addition, it inhibits transmission of the α rays, thereby preventing a malfunction of the semiconductor device. The silicon nitride film 44 is required to have a step coverage to satisfy the above-described functions. Accordingly, the silicon nitride film 44 is formed at a substrate temperature of about 350° C. by plasma CVD using a raw material gas having monosilane, ammonia and nitrogen. Formation of a silicon nitride film under such conditions makes it possible to give the film an excellent step coverage, and the film thus formed can effectively prevent invasion of water and impurities. As described above, the silicon nitride film 44 is formed under conditions different from those under which the silicon nitride films 17, 22 are formed. The silicon nitride film 44 is formed at a temperature lower than that of the silicon nitride films 17,22. Ammonia is used for the formation of the former film, while ammonia is not used for the formation of the latter films. Formation of silicon nitride films under different conditions depending on the purpose of use is one of the characteristics of this embodiment.

Figure 13:
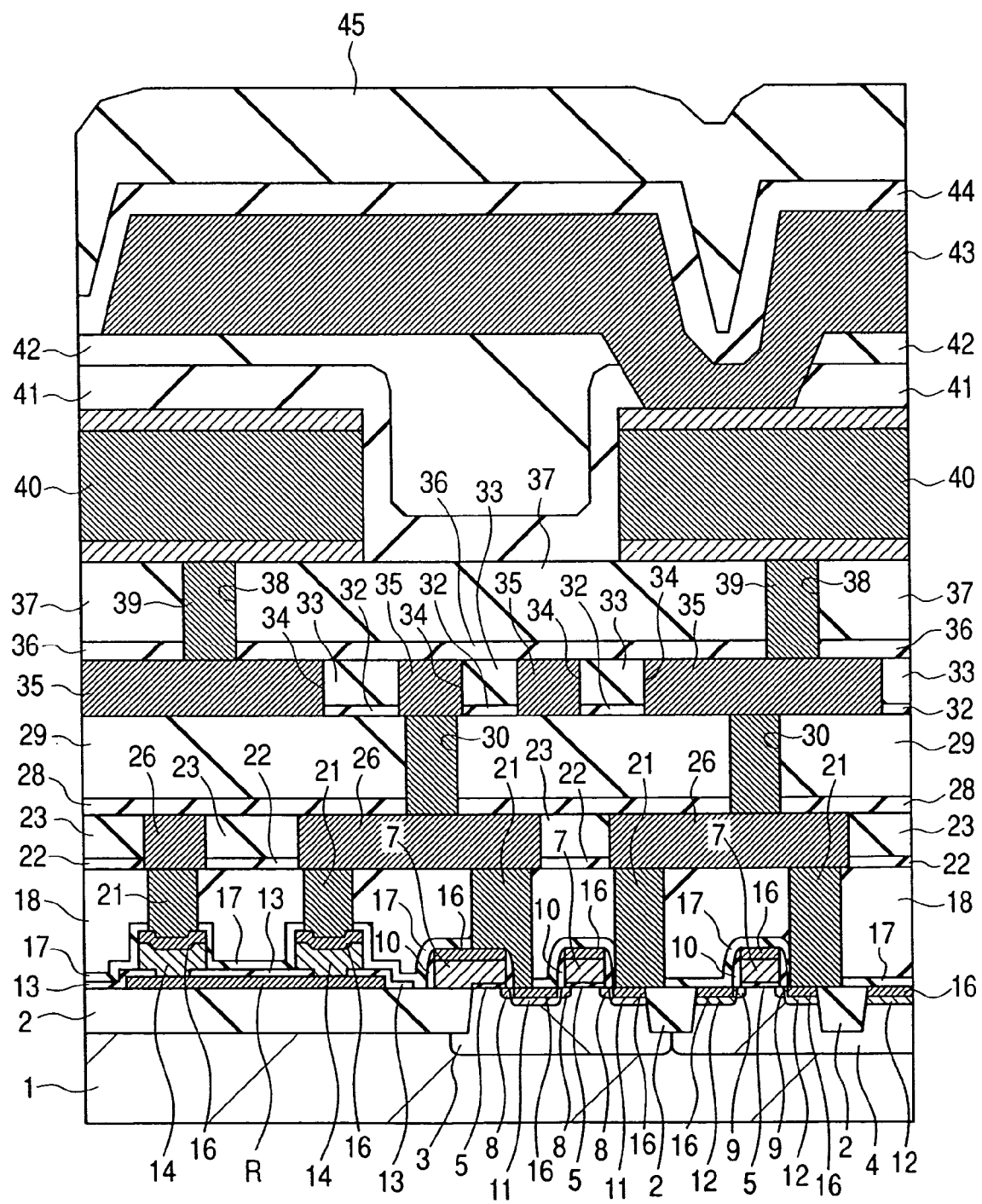
Figure 14:
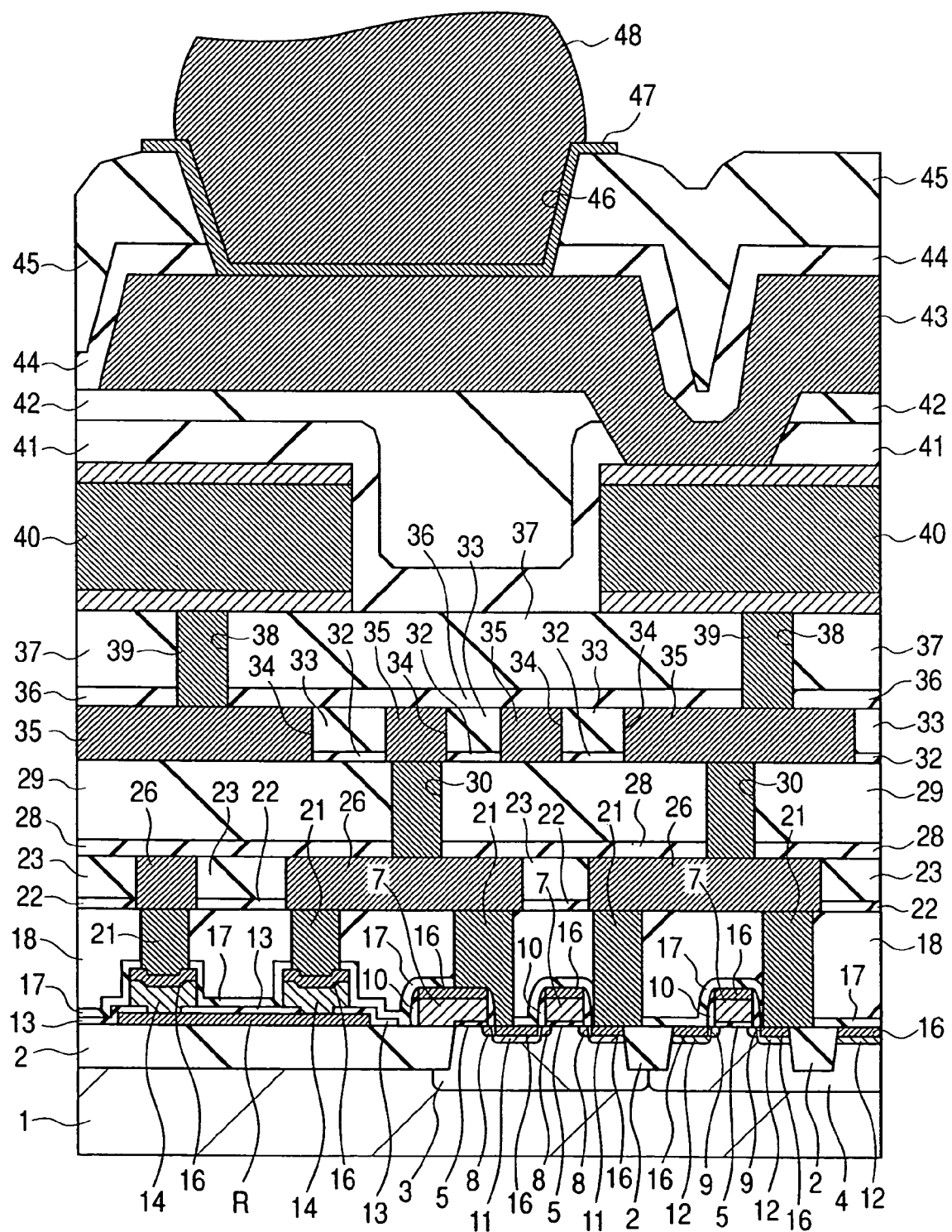

As illustrated in FIG. 13, a silicon oxide film 45 is formed to cover the silicon nitride film 44. The silicon nitride film 44 and silicon oxide film 45 serve as passivation films. As illustrated in FIG. 14, a connecting hole 46 is formed in the silicon oxide film 45 and silicon nitride film 44 to expose the interconnection 43. After formation of a bump underlying metal layer 47 so as to cover the surface of this connecting hole 46, a bump 48 is formed as an external connecting conductor piece. The bump 48 is formed to have almost a spherical shape, but a portion of it is omitted in this drawing. The connecting hole 46 can be formed by photolithography and etching, while the bump underlying metal 47 can be formed by patterning of a metal film deposited all over the semiconductor substrate 1. As the bump underlying metal layer 47, gold can be used, for example, while as the bump 48, gold and solder can be used, for example.

Then, a semiconductor device is completed after mounting on a package substrate, but an explanation thereof is omitted.

Here, the bump 48 is exemplified as an external connecting conductor piece, but alternatively, an inner lead, such as a bonding wire, may be used. Connection to a lead frame via a gold wire is followed by molding with a resin, but description of this step is omitted.

The semiconductor device of this embodiment can also be applied to a so-called WPP (Wafer Process Package), wherein, after formation of re-placement and re-routing via a resin film, such as polyimide, a bump is formed on a pad region of this re-placement and re-routing, and then the wafer is divided into individual semiconductor devices.

Figure 18:
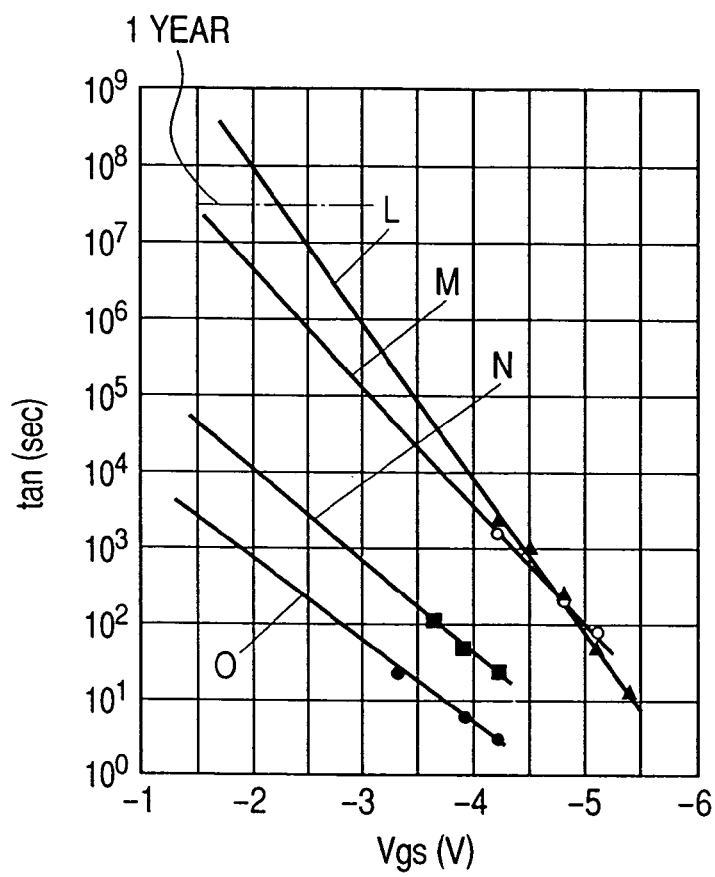
FIG. 18 is a graph showing NBTI characteristics of a MISFET.

The effect of this embodiment will be described with reference to FIGS. 18 and 19. FIG. 18 is a graph illustrating the NBTI (Negative Bias Temperature Instability) characteristics of a MISFET. Line L in the graph is a data line of the semiconductor device of this embodiment. Lines M,N,O are data lines provided for comparison. These data are obtained by applying a silicon nitride film (a film formed under similar conditions to the silicon nitride film 44), formed at a substrate temperature of about 350° C. by plasma CVD using a raw material gas including monosilane, ammonia and nitrogen, to a film corresponding to the silicon nitride film 17 of this embodiment. In Lines M,N,O, silicon nitride films are formed using different apparatuses.

As illustrated in FIG. 18, Line L shows the largest life time (tau: characteristic value indicating an increasing time of an off-state current) under a practical use state (for example, Vgs=−1V) of a source-drain voltage (Vgs). In other words, the semiconductor device of this embodiment is superior in reliability to the other cases (Line M,N,O). Judging from the fact that the life tau is expressed by a logarithm, the reliability of the semiconductor device of this embodiment is extraordinarily superior.

Figure 19:
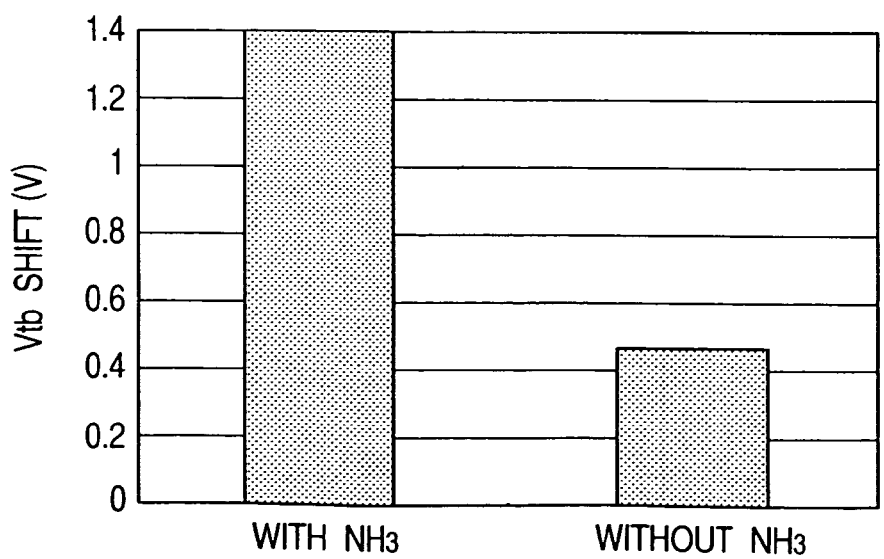
FIG. 19 is a graph illustrating the amount of shift in a flat band voltage.

FIG. 19 is a graph illustrating the amount (Vfb) of flat band voltage shift. As the MISFET, a p-channel type MISFET having a p-type impurity (boron) doped to a gate electrode is used. In the graph, data on the right side (without $NH_3$) relates to the semiconductor device of this embodiment, while data on the left side (with $NH_3$) relates to a semiconductor device obtained by applying a silicon nitride film (a film formed under similar conditions to the silicon nitride film 44) formed at a substrate temperature of about 550° C. by plasma CVD using a raw material gas including monosilane, ammonia and nitrogen to a film corresponding to the silicon nitride film 17 of this embodiment.

As illustrated in FIG. 19, the Vfb shift reaches 1.4V when the raw material gas contains $NH_3$ (on the left side), while it is only 0.45V or so when the raw material gas is free of $NH_3$ (on the right side). Consideration that the Vfb shift occurs by diffusion of an impurity (boron) from the gate electrode reveals that diffusion of boron from the gate electrode is effectively suppressed in the semiconductor device of this embodiment.

According to this embodiment, since the silicon nitride films 17,22 are formed at a substrate temperature of 400° C. or greater by plasma CVD using a raw material gas having monosilane and nitrogen (not ammonia), peeling of these silicon nitride films 17,22 can be suppressed and release of hydrogen from these films can be prevented. As a result, the performance and reliability of the semiconductor device can be maintained at a high level.

Comparison between a silicon nitride film (first silicon nitride film) used for the silicon nitride film 17 and a silicon nitride film (second silicon nitride film) used for the silicon nitride film 44 reveals a difference between the ratio of Si—H bonds to Si—N bonds, as measured by the FT-IR method. More specifically, there is a relationship R1<R2 between the Si—H/Si—N bonds ratio R1 of the first silicon nitride film and the Si—H/Si—N bonds ratio R2 of the second silicon nitride film. The FT-IR measurement performed by the present inventors shows that the number of Si—H bonds of the first silicon nitride film is $1 \times 10^{21}$ cm$^{-3}$ and that of the Si—N bonds is $10 \times 10^{21}$ cm$^{-3}$, while the number of SiH bonds of the second silicon nitride film is $11 \times 10^{21}$ cm$^{-3}$ and that of the Si—N bonds is $6 \times 10^{21}$ cm$^{-3}$. Hydrogen release from the second silicon nitride film is therefore presumed to result from Si—H bonds mainly.

Embodiment 2

The process of manufacture of a DRAM (Dynamic Random Access Memory) according to Embodiment 2 of the invention will next be described in the order of steps based on FIGS. 20 to 42. In each of the drawings illustrating the cross-section of a substrate, a region (memory cell array) wherein a memory cell of a DRAM is to be formed is illustrated on the left side, while a peripheral circuit region is illustrated on the right side.

Figure 20:
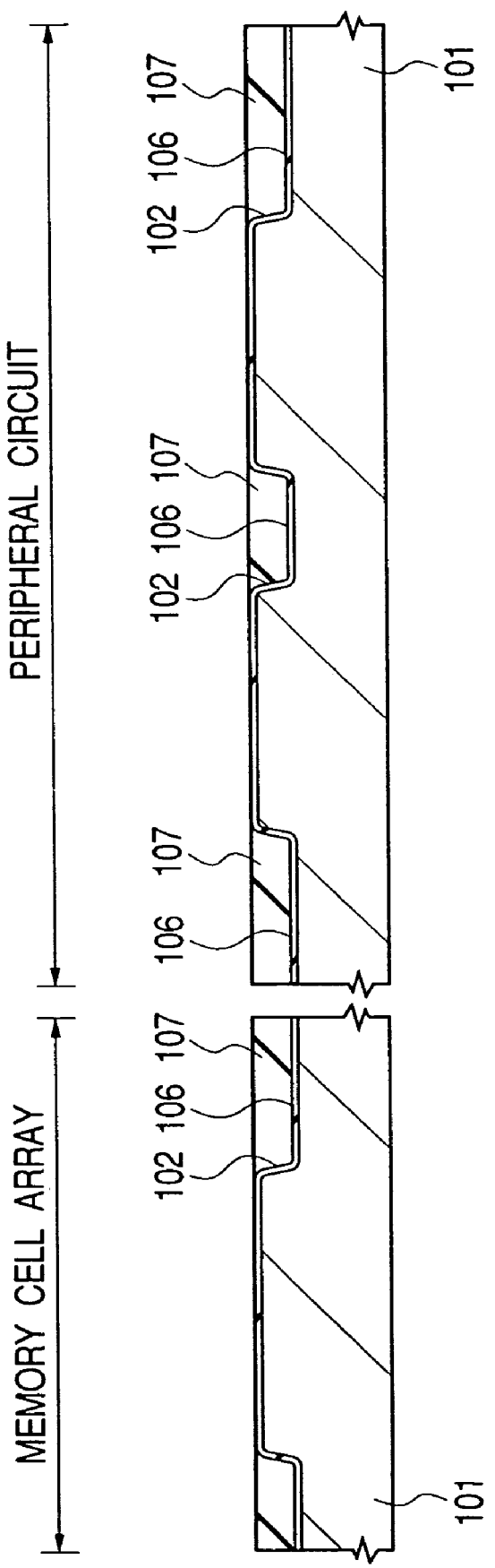
FIGS. 20 to 42 are cross-sectional views illustrating, in the order of steps, a process in the manufacture of a DRAM according to Embodiment 2 of the present invention.

As illustrated in FIG. 20, an element isolating trench 102 of about 350 nm depth is defined by photolithography and etching in a semiconductor substrate 101 (hereinafter simply called a "substrate") which is formed of a p-type single crystal silicon having a specific resistance of about 10 Ωcm. A thin (about 10 nm thick) silicon oxide film 106 is then formed on the inner wall of the element isolating trench 102, for example, by wet oxidation at about 850° C. to 900° C. or dry thermal oxidation at about 1000° C. A silicon oxide film (which will hereinafter be called "TEOS oxide film is deposited to a thickness of about 400 nm, for example, by plasma CVD using ozone ($O_3$) and tetraethoxysilane (TEOS) as source gases to embed the element isolating trench 102 with this film. This silicon oxide film is subjected to CMP (Chemical Mechanical Polishing) to remove the silicon oxide film in a region other than the element isolating trench 102, while leaving the silicon oxide film 107 inside of the element isolating trench 102, whereby an element isolation region is formed.

Figure 21:
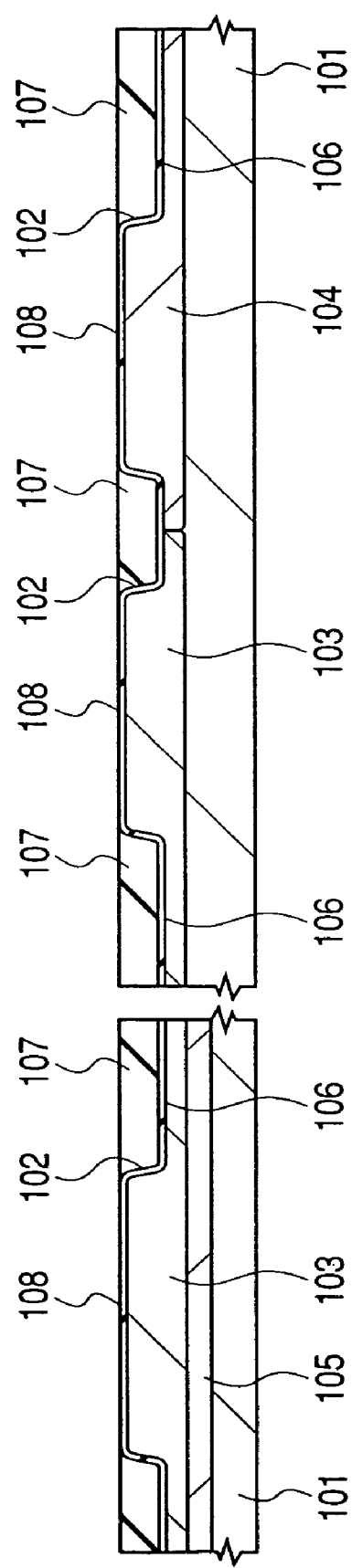

As illustrated in FIG. 21, after ion implantation of a p-type impurity (boron) and an n-type impurity (phosphorus) to the substrate 101, these impurities are diffused by thermal treatment at about 1000° C., whereby a p-type well 103 and an n-type well 105 are formed in the memory cell array of the substrate 101 and the p-type well 103 and n-type well 104 are formed in the peripheral circuit region of the substrate 101. The surface of the substrate 101 (p-type well 103 and n-type well 104) was wet washed with a hydrofluoric acid washing liquid, followed by the formation of a clean gate oxide film 108 of about 6 nm thick on the surface of each of the p-type well 103 and n-type well 104 by thermal oxidation at about 800° C.

Figure 22:
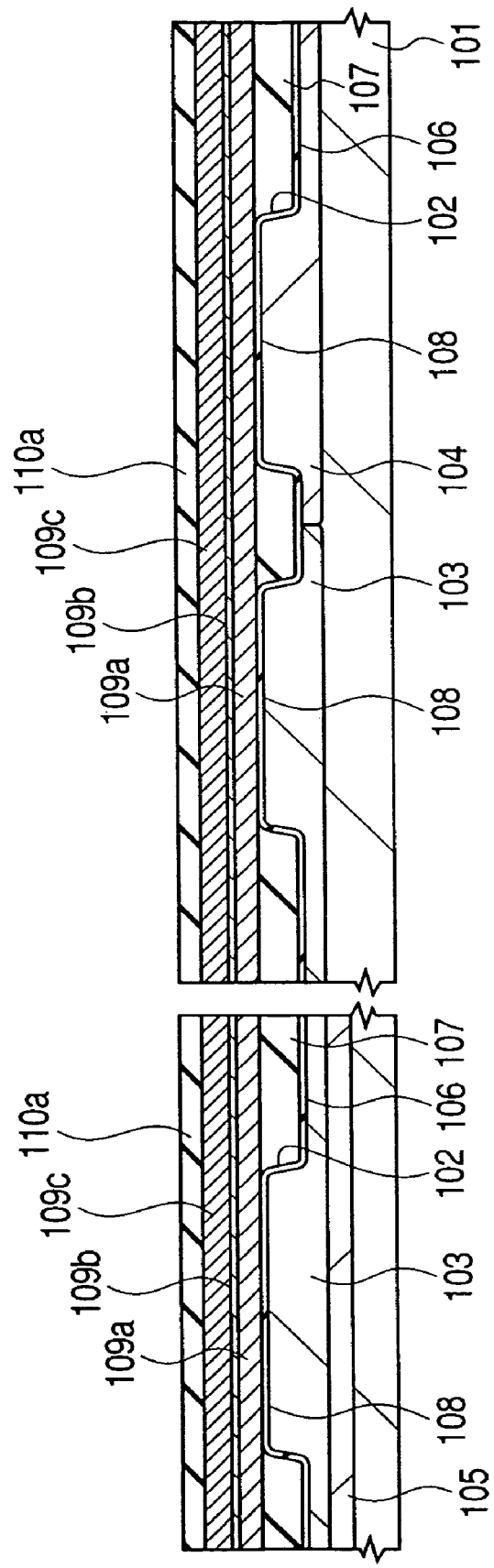

As illustrated in FIG. 22, a low-resistance polycrystalline silicon film 109a of about 100 nm thick, which has been doped with phosphorus (P), is deposited over the gate oxide film 108 by CVD, followed by deposition thereover of a WN film 109b of about 5 nm thick and a W film 109c of about 50 nm thick by sputtering. Over the W film, a silicon oxide film 110a of about 100 nm thick is deposited by CVD.

In order to relax the stress of the W film 109c and densify the WN film 109b, they are thermally treated at about 800° C. in an inert gas atmosphere, such as nitrogen. The silicon oxide film 110a over the W film 109c is formed for the purpose of protecting the surface of the W film 109c upon this thermal treatment and relaxing the stress at the interface between a silicon nitride film (110b), which will be deposited over the silicon oxide film 110a in the subsequent step, and the underlying W film 109c.

Figure 23:
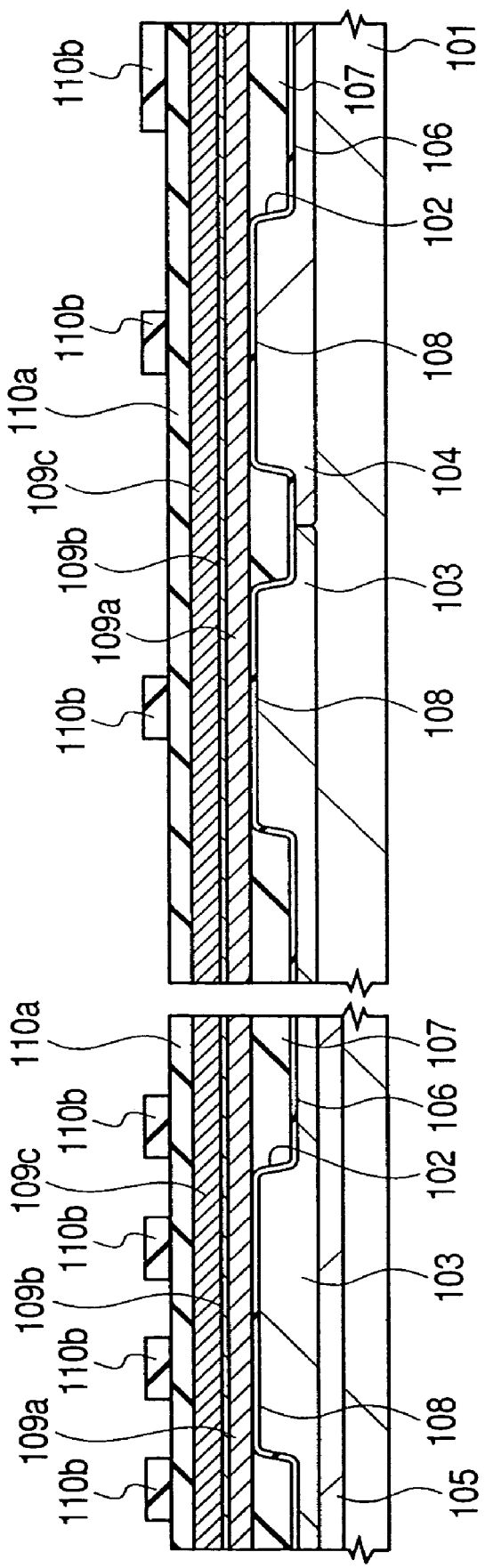
Figure 24:
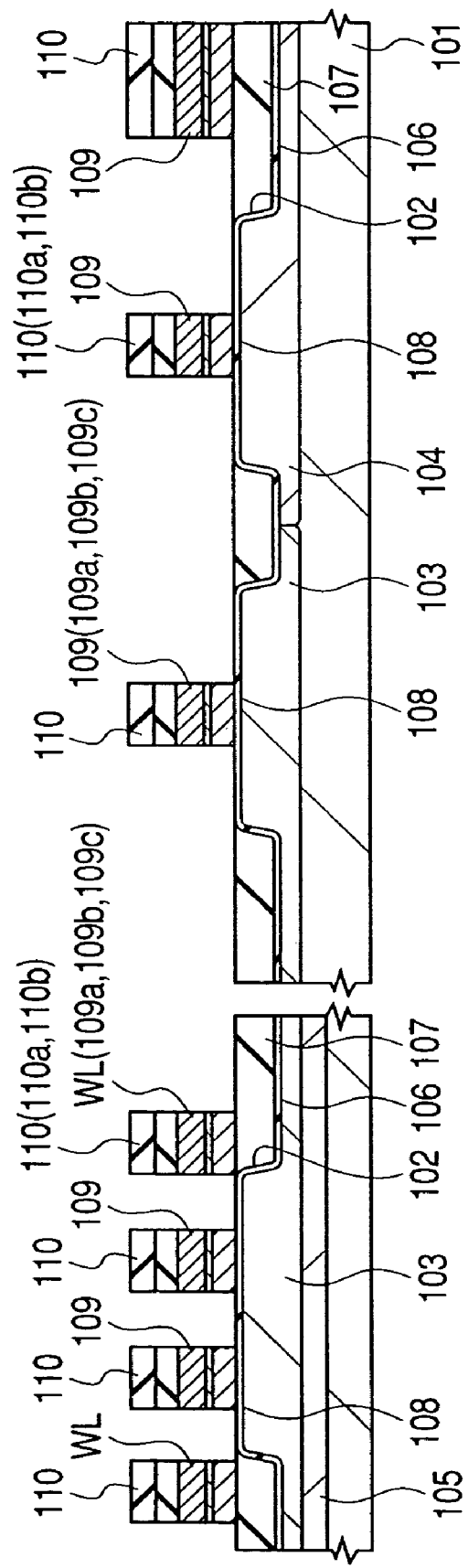

As illustrated in FIG. 23, after deposition of the silicon nitride film 110b of about 100 nm thick over the silicon oxide film 110a, the silicon nitride film 110b is dry etched using a photoresist film (not illustrated) as a mask to leave the silicon nitride film 110b in a region wherein a gate electrode is to be formed.

This silicon nitride film 110b is formed under similar conditions to the silicon nitride film 17 of Embodiment 1. More specifically, it is formed at a substrate temperature of 400° C. or greater by plasma CVD using a raw material gas having monosilane and nitrogen. This silicon nitride film 110b, as will be described later, is used upon self alignment processing of a connecting hole to be formed in a memory cell region, and it serves as a cap insulating film of a gate electrode. If hydrogen is released from this cap insulating film, problems as described in Embodiment 1 will occur, for example, processing failure of a connecting hole due to peeling, increase or fluctuations of resistance of gate electrode or source drain and fluctuations of the threshold voltage of MISFET. In this embodiment, these problems can be avoided by using, as the silicon nitride film 110b serving as a cap insulating film, a silicon nitride film which does not easily cause hydrogen release.

After removal of the photoresist film, the silicon oxide film 110a, W film 109c, WN film 109b and polycrystalline silicon film 109a are dry etched using the silicon nitride film 110b as a mask, whereby a gate electrode 109 formed of the polycrystalline film 109a, WN film 109b and W film 109c is formed in each of the memory cell array and peripheral circuit regions. Over the gate electrode 109, a cap insulating film 110, including the silicon oxide film 110a and silicon nitride film 110b, is formed. The gate electrode 10 formed in the memory cell array functions as a word line WL. In this embodiment, the cap insulating film 110 includes the silicon oxide film 110a, but the silicon oxide film 110a is not essential. The cap insulating film 110 may be formed only of the silicon nitride film 110b.

Figure 25:
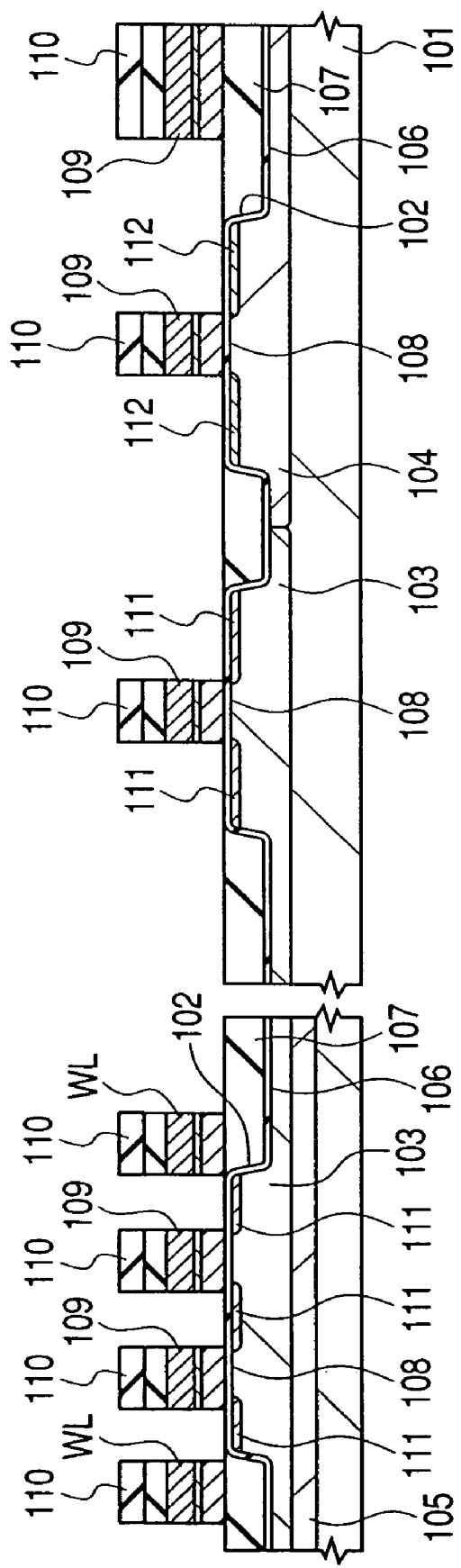

As illustrated in FIG. 25, by ion implantation of an n-type impurity (phosphorus or arsenic) to the p-type well 103 on both sides of the gate electrode 109, an $n^-$ type semiconductor region 111 is formed, while by ion implantation of a p-type impurity (boron) to the n-type well 104, a $p^-$ type semiconductor region 112 is formed.

Figure 26:
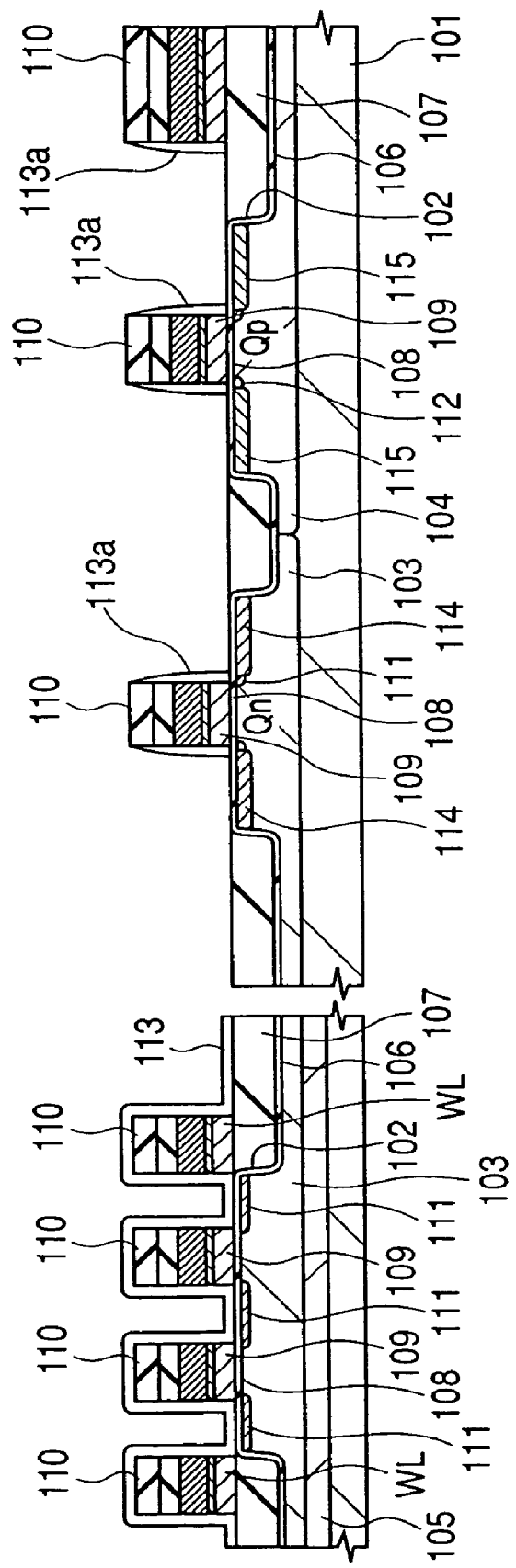

As illustrated in FIG. 26, a silicon nitride film 113 of about 50 nm thick is deposited over the substrate 101. The silicon nitride film 113 of the peripheral circuit region is anisotropically etched with the upper portion of the substrate 101 in the memory cell array being covered with a photoresist film (not illustrated), whereby side wall spacers 113a are formed on the side walls of the gate electrode 109 in the peripheral circuit region.

The silicon nitride film 113 is formed, in a similar manner to the silicon nitride film 110b, at a substrate temperature of about 400° C. by plasma CVD using a raw material gas having monosilane and nitrogen. In the memory cell array region, this silicon nitride film 113 is employed, together with the silicon nitride film 110b, upon self alignment processing of a connecting hole to be formed in a memory cell array region. In short, it serves as a side wall of a gate electrode in the memory cell array. If hydrogen is released from such a silicon nitride film 113, problems similar to those described with reference to Embodiment 1 occur, for example, processing failure of a connecting hole due to peeling, an increase or fluctuations of resistance of the gate electrode or source-drain and fluctuations of the threshold voltage of MISFET. In this embodiment, however, these problems can be avoided by using, as the silicon nitride film 113, a hydrogen-release-suppressed silicon nitride film.

The side wall spacers 113a formed by the silicon nitride 113 are also formed from a silicon nitride film not permitting easy release of hydrogen. Accordingly, similar effects are available in the peripheral circuit region.

By ion implantation of an n-type impurity (phosphorus or arsenic) to the p-type well 103 of the peripheral circuit region, $n^+$ type semiconductor regions 114 (source, drain) are formed, while by ion implantation of a p-type impurity (boron) to the n-type well 104, $p^+$ type semiconductor regions (source, drain) are formed. By the steps so far described, an n channel type MISFETQn and p channel type MISFETQp, each equipped with a source and a drain having an LDD (Lightly Doped Drain) structure, are formed in the peripheral circuit region.

Figure 27:
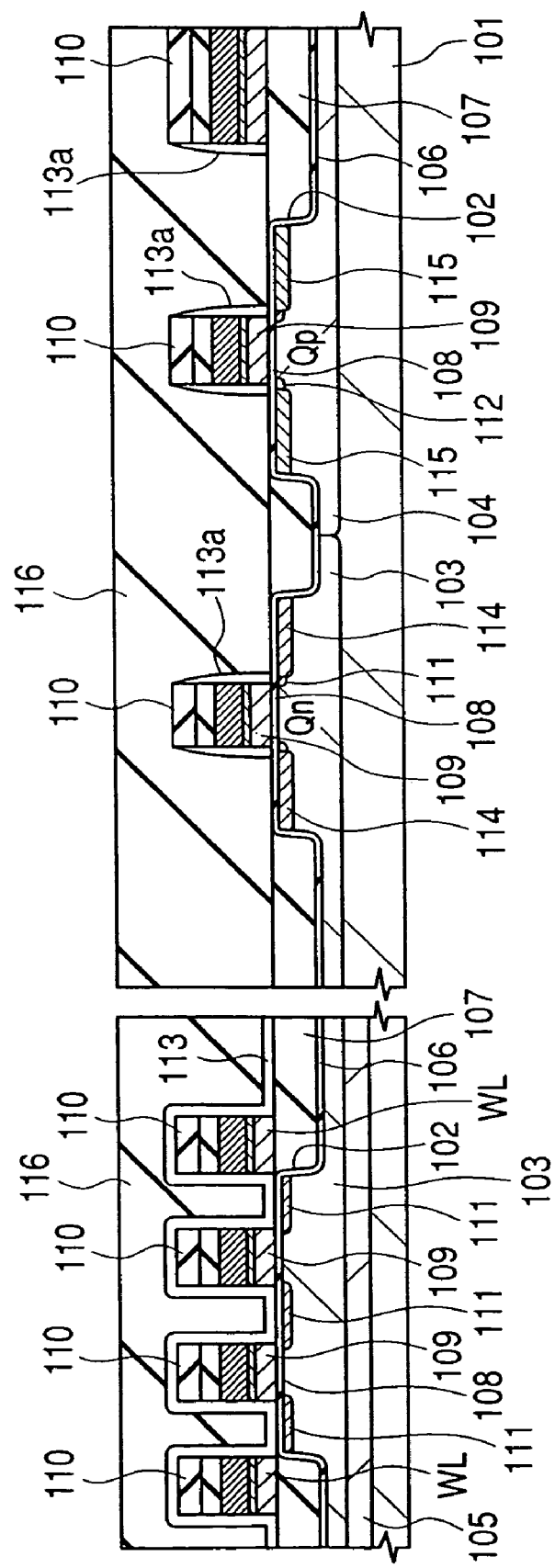

As illustrated in FIG. 27, a silicon oxide film 116 is formed over the gate electrode 109, followed by chemical and mechanical polishing of the silicon oxide film 116 to planarize its surface.

Figure 28:
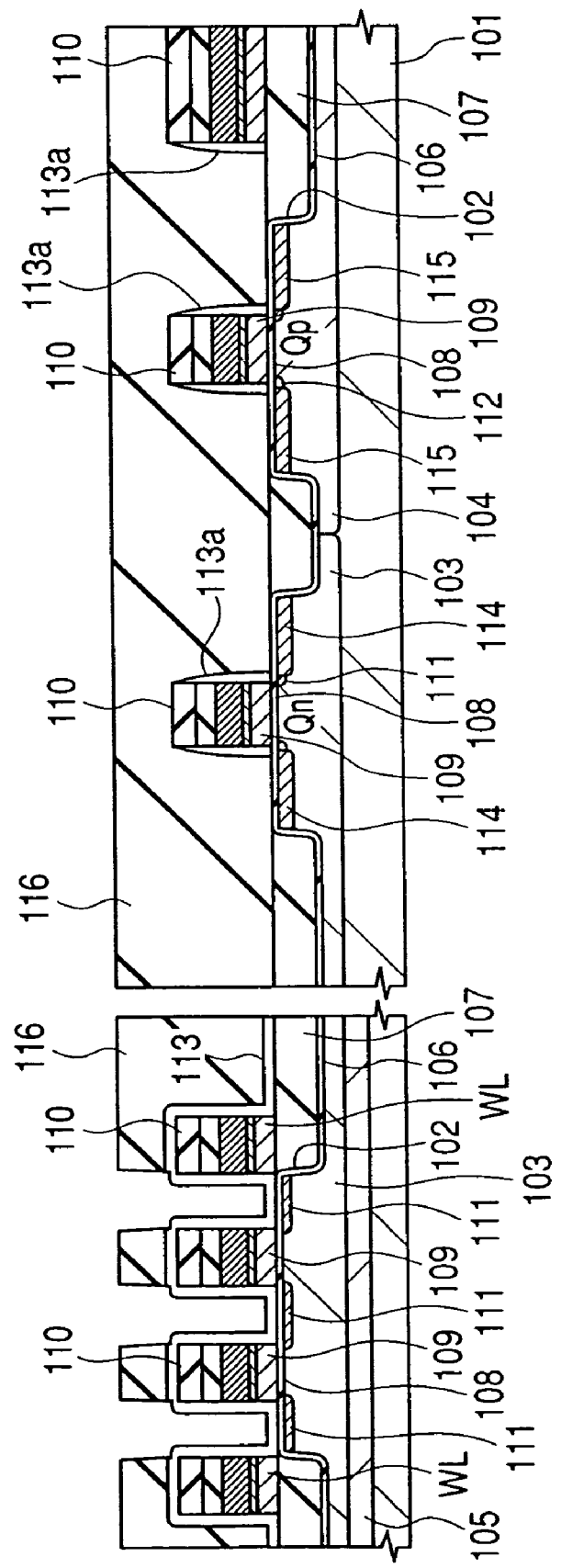
Figure 29:
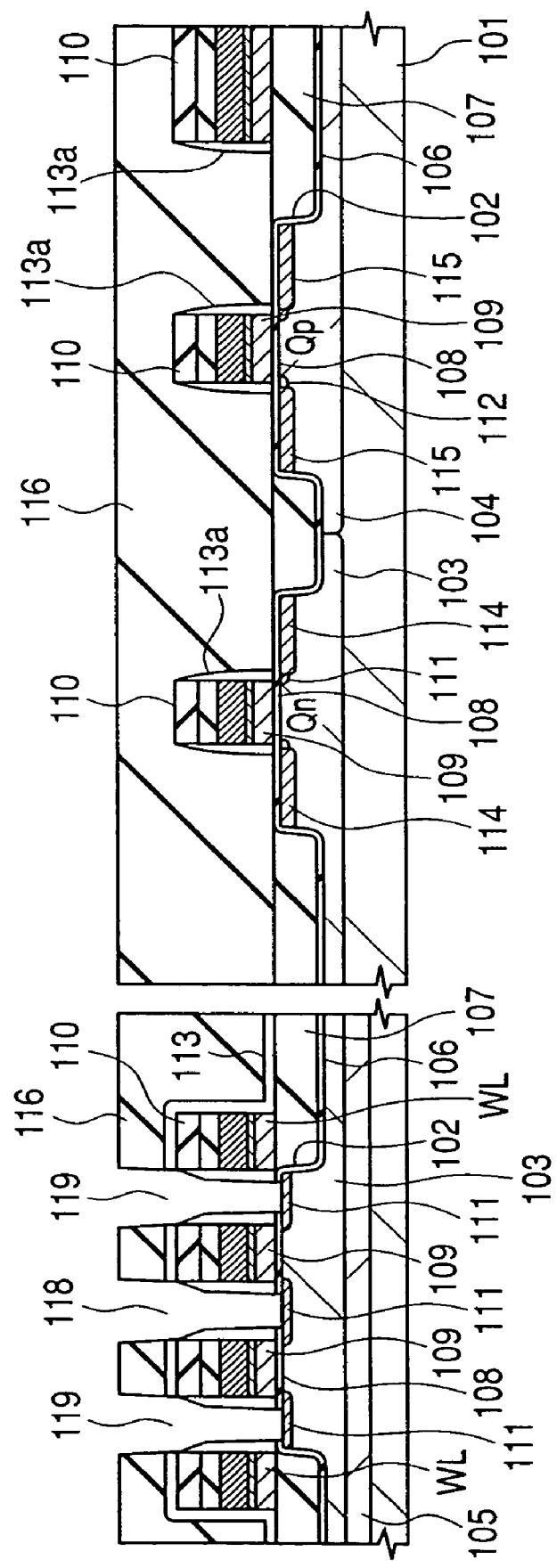

As illustrated in FIG. 28, using a photoresist film (not illustrated) as a mask, the silicon oxide film 116 of the memory cell array is dry etched, followed by dry etching of the silicon nitride film 113 below the silicon oxide film 116, whereby contact holes 118,119 are formed above the $n^-$ type semiconductor regions 111.

The silicon oxide film 116 is etched under such conditions that the etching rate of silicon oxide (silicon oxide film 116) would be larger than that of silicon nitride, by which complete removal of the silicon nitride film 113 is avoided. The silicon nitride film 113 is, on the other hand, etched under conditions so that the etching rate of silicon nitride would be greater than that of silicon (substrate) or silicon oxide to prevent deep etching of the substrate 101 or silicon oxide film 107. In addition, the silicon nitride film 113 is etched under conditions permitting anisotropic etching of the silicon nitride film 113, whereby the silicon nitride film 113 is left on each of the side walls of the gate electrode 109 (word line WL). This makes it possible to form the contact holes 118,119 having a minute diameter in self alignment with the gate electrodes 109 (word line WL).

Figure 30:
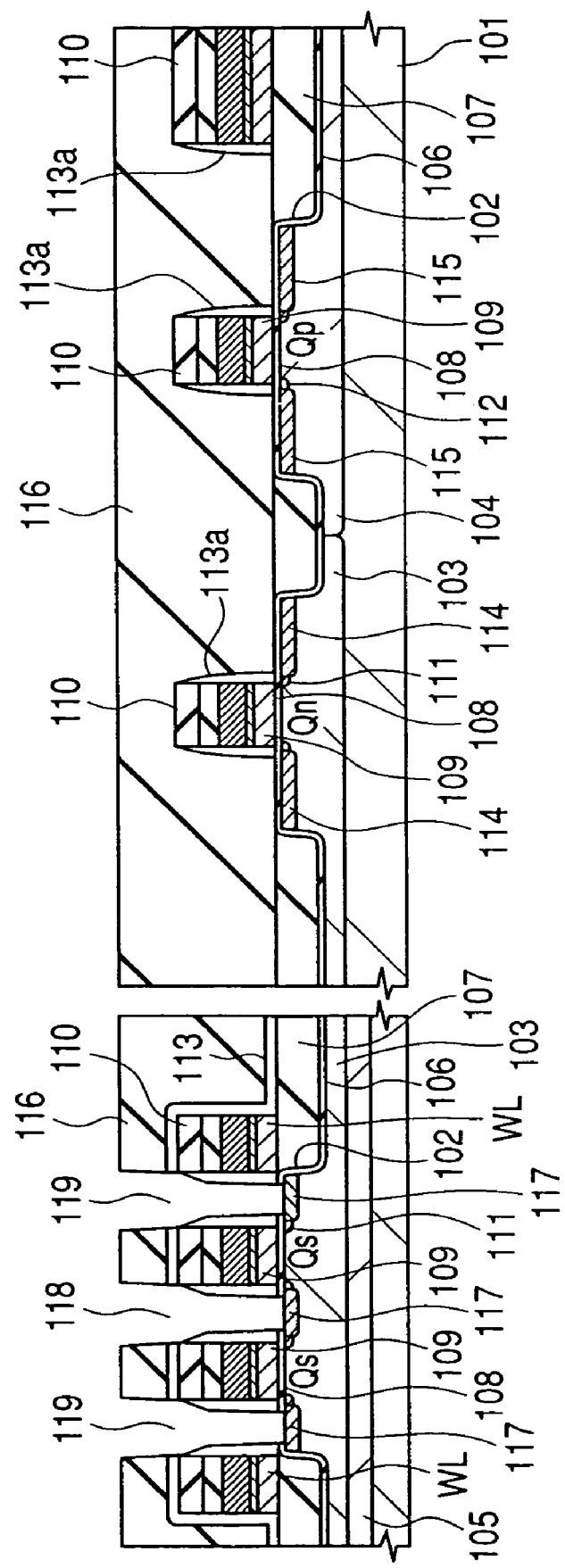

As illustrated in FIG. 30, an n-type impurity (phosphorus or arsenic) is ion-implanted to the p-type wells 103 ($n^-$ type semiconductor regions 111) of the memory cell array via the contact holes 118,119, whereby $n^+$ type semiconductor regions 117 (source, drain) are formed. By the steps so far described, a memory selecting MISFETQs formed of an n channel type is formed in the memory cell array.

Figure 31:
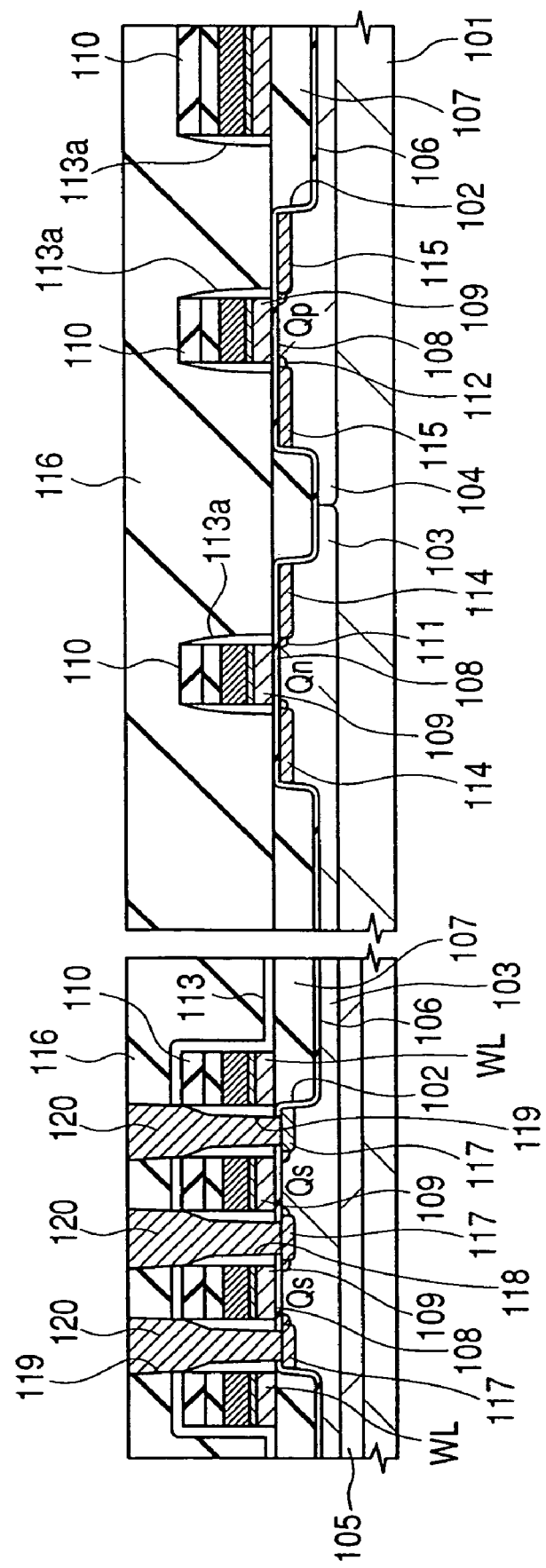

As illustrated in FIG. 31, plugs 120 are formed inside of the contact holes 118,119. These plugs 120 are formed by wet washing the inside of the contact holes 118,119 with a hydrofluoric-acid-containing washing liquid; depositing, by CVD over the silicon oxide film 116 including the inside of the contact holes 118,119, a low-resistance polycrystalline silicon film having an n-type impurity, such as phosphorus (P) doped thereto; and etching back (or polishing by CMP) the polycrystalline silicon film to leave it only inside of the contact holes 118,119.

Figure 32:
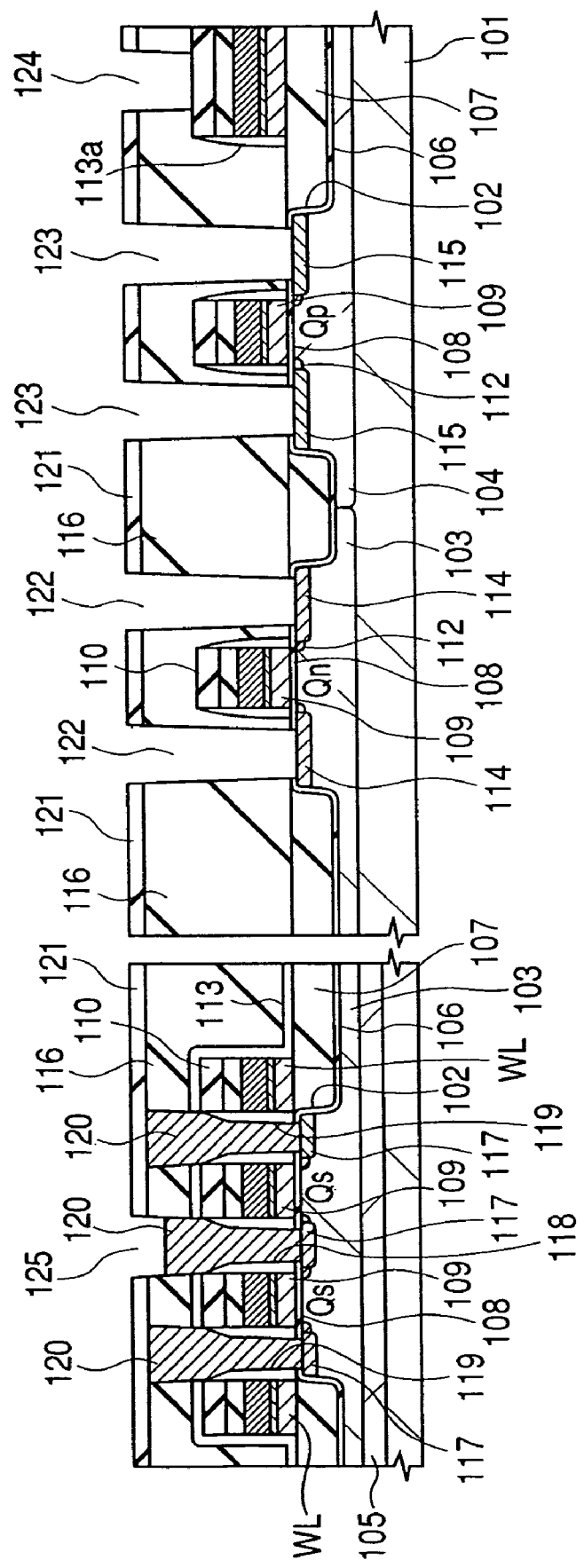

As illustrated in FIG. 32, after deposition of a silicon oxide film 121 of about 20 nm thick over the silicon oxide film 116 by CVD, the silicon oxide film 121 and underlying silicon oxide film 116 in the peripheral circuit region are dry etched using a photoresist film (not illustrated) as a mask, whereby contact holes 122 and contact holes 123 are formed over the source and drain ($n^+$ type semiconductor regions 114) of the n channel type MISFETQn and the source and drain ($p^+$ type semiconductor regions 115) of the p channel type MISFETQp, respectively. At the same time, a contact hole 124 is formed over the gate electrode 109 (or the gate electrode 109 in a not-illustrated region of the n channel type MISFETQn), while a through-hole 125 is formed over the contact hole 118 of the memory cell array.

Figure 33:
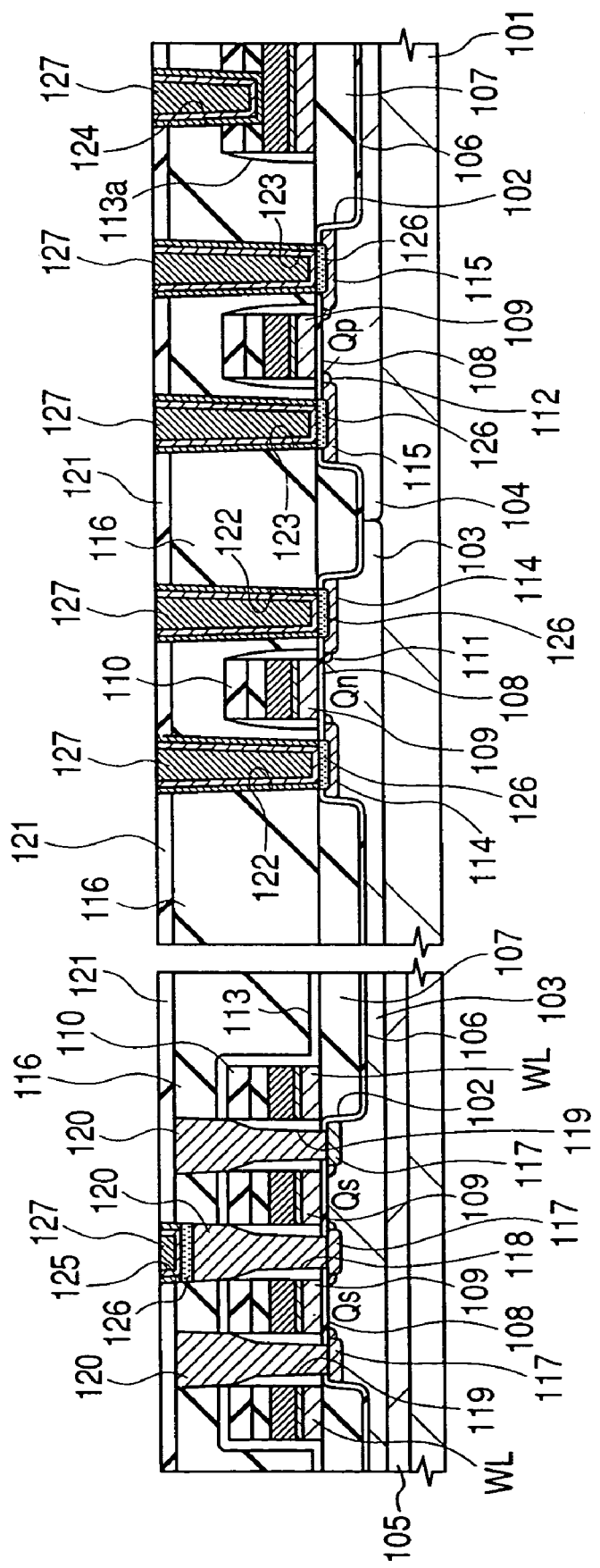

As illustrated in FIG. 33, after formation of a silicide film 126 over each surface of the source and drain ($n^+$ type semiconductor regions 114) of the n-channel type MISFETQn, the source and drain ($p^+$ type semiconductor regions 115) of the p-channel type MISFETQp, and the plug 120 inside of the contact hole 118, plugs 127 are formed inside of the contact holes 122,123,124 and the through-hole 125.

The above-described silicide film 126 is formed, for example, by depositing a Ti film of about 30 nm thick and a TiN film of about 20 nm thick over the silicon oxide film 121, including the insides of the contact holes 122,123,124 and through-hole 125, by sputtering, and the heat treating the substrate 101 at about 650° C. The plugs 127 are formed, for example, by depositing a TiN film of about 50 nm thick and a W film of about 300 nm thick by CVD over the TiN film including the inside of the contact holes 122,123,124 and through-hole 125, and then polishing the W film, TiN film and Ti film over the silicon oxide film 121 by CMP to leave these films only inside of the contact holes 122,123, 124 and through-hole 125.

Formation of the silicide film 126 made of Ti silicide on the interface between the source_drain ($n^+$ type semiconductor regions 114, $p^+$ type semiconductor regions 115) and the plug 127 formed thereover makes it possible to reduce the contact resistance between the source_drain ($n^+$ type semiconductor regions 114, $p^+$ type semiconductor regions 115) and the plug 127, leading to an improvement in the speed of operation of the MISFET (n channel type MISFETQn, p channel type MISFETQp) constituting the peripheral circuit.

Figure 34:
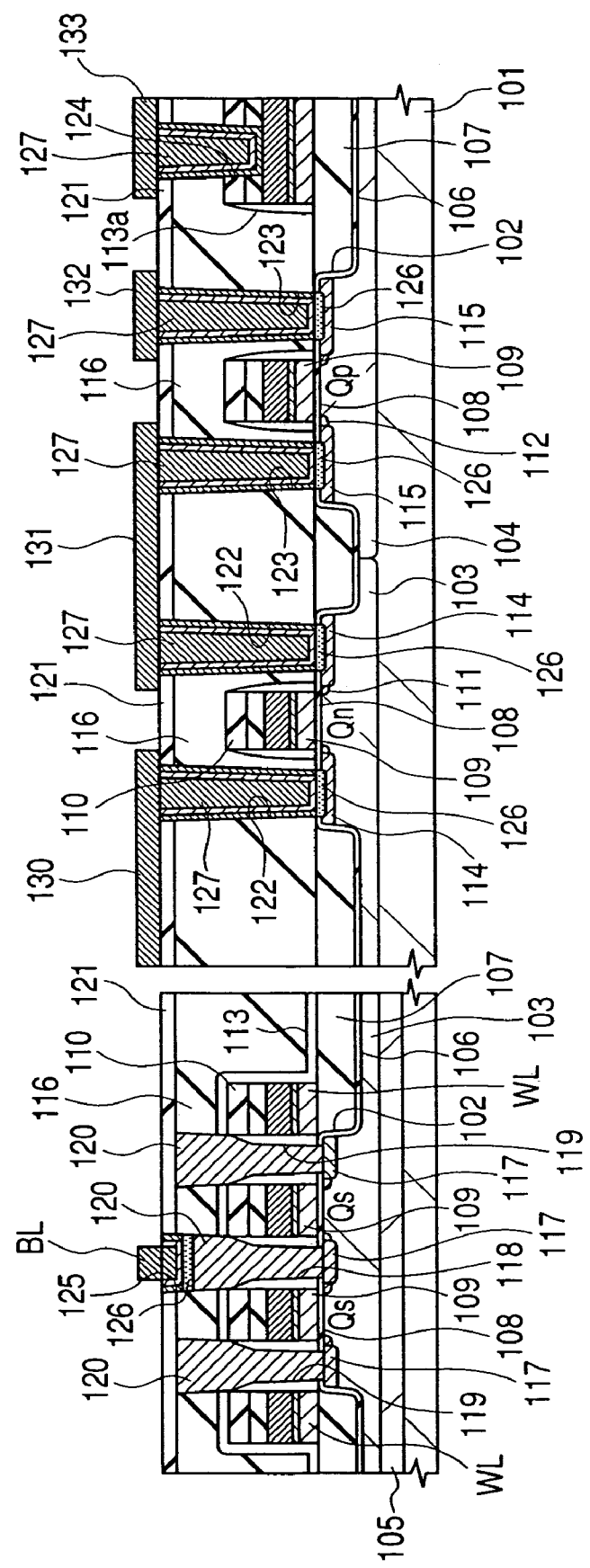

As illustrated in FIG. 34, a bit line BL is formed over the silicon oxide film 121 of the memory cell array, while the first-layer interconnections 130 to 133 are formed over the silicon oxide film 121 in the peripheral circuit region. The bit line BL and the first-layer interconnections 130 to 133 can be formed, for example, by depositing a W film of about 100 nm thick over the silicon oxide film 121 by sputtering and then, dry etching this W film using a photoresist film as a mask. At this time, the silicon oxide film 116 lying under the bit line BL and interconnections 130 to 133 have been planarized so that the bit line BL and interconnections 130 to 133 can be patterned with high size accuracy.

Figure 35:
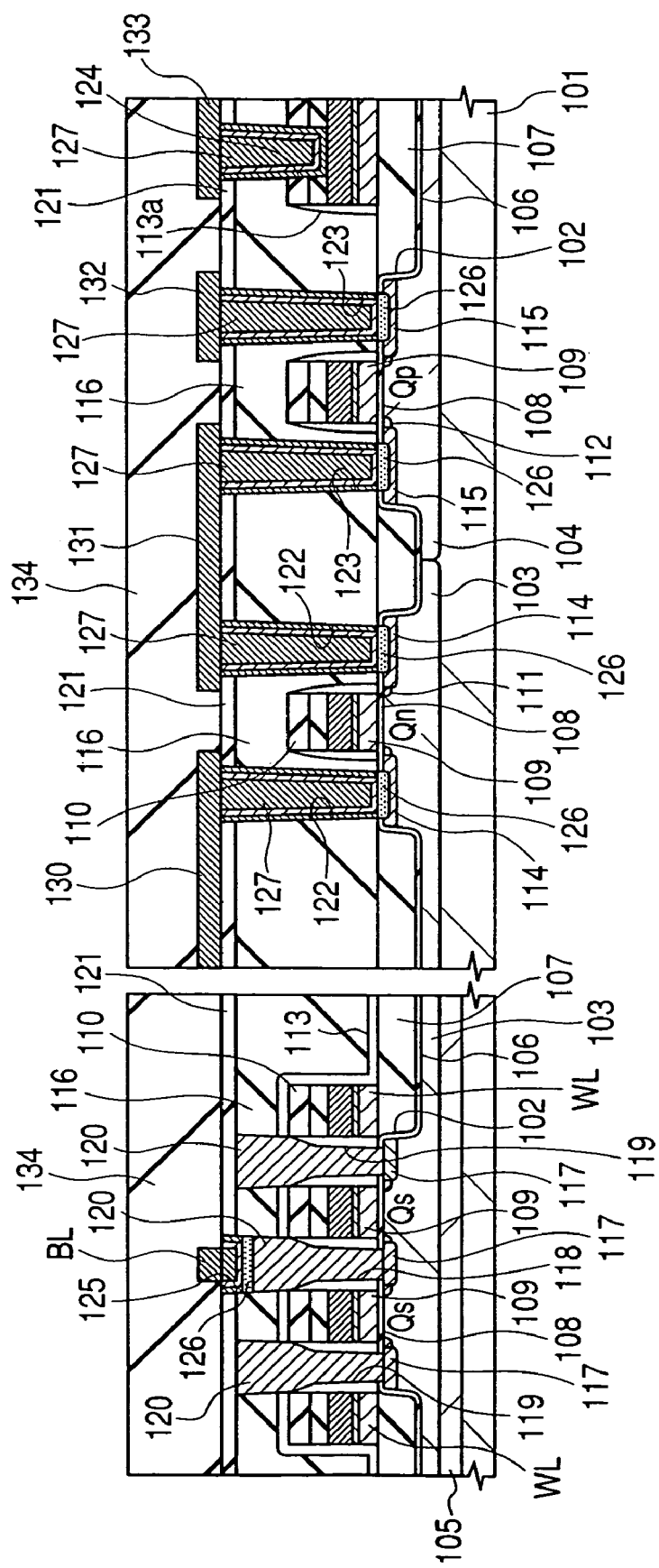

As illustrated in FIG. 35, a silicon oxide film 134 of about 300 nm thick is formed over the bit line BL and the first-layer interconnections 130 to 133. This silicon oxide film 134 is formed in a similar manner to the above-described silicon oxide film 116.

Figure 36:
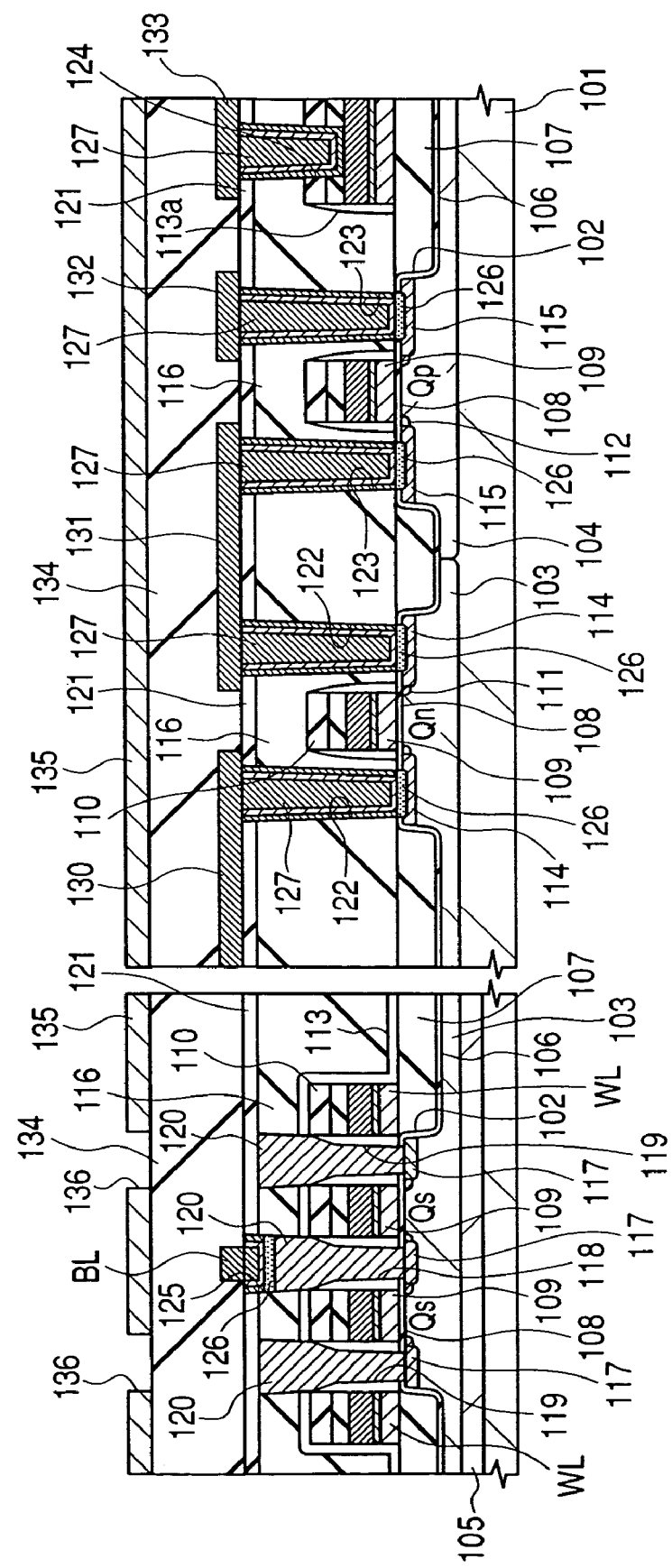

As illustrated in FIG. 36, after deposition of a polycrystalline silicon film 135 of about 200 nm thick over the silicon oxide film 134 by CVD, the polycrystalline silicon film 135 of the memory cell array is dry etched using a photoresist film as a mask, whereby a trench 136 is formed in the polycrystalline silicon film 135 above the contact hole 119.

Figure 37:
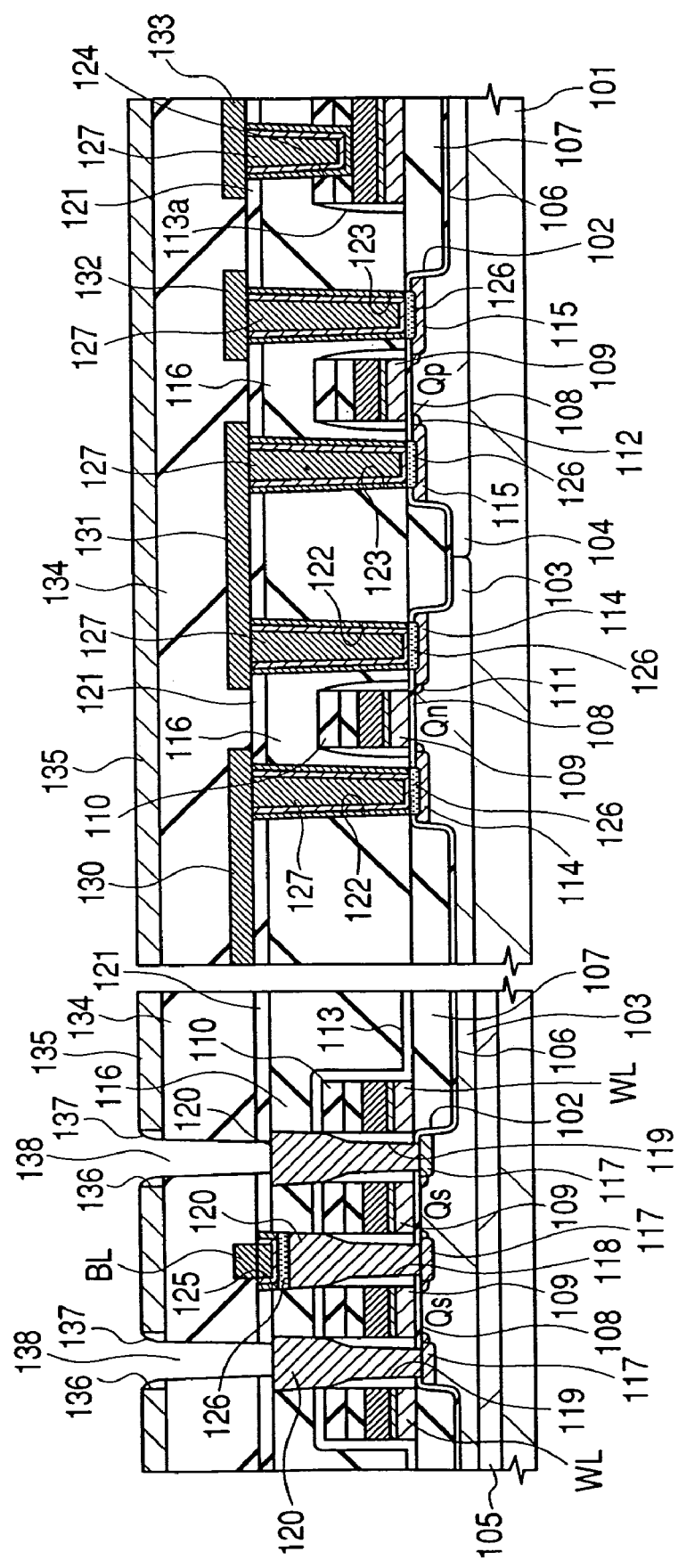

As illustrated in FIG. 37, side wall spacers 137 are formed on the side walls of the trench 136, followed by dry etching of the silicon oxide film 134 and underlying silicon oxide film 121 using these side wall spacers 137 and polycrystalline silicon film 135 as masks, to form a through-hole 138 above the contact hole 119. The side wall spacers 137 on the side walls of the trench 136 are formed by depositing a polycrystalline silicon film over the polycrystalline silicon film 135, including the inside of the trench 136, and then leaving the polycrystalline silicon film on the side walls of the trench 136 by anisotropic etching.

By forming the through-hole 138 at the bottom of the trench 136 having the side wall spacers 137 formed on the side walls thereof, the diameter of the through-hole 138 becomes smaller than that of the underlying contact hole 119. This makes it possible to secure an alignment margin of the bit line BL and through-hole 138 even if the memory cell size is reduced, thereby preventing a short-circuit between the plug 139 which will be embedded inside of the through-hole 138 and the bit line BL.

Figure 38:
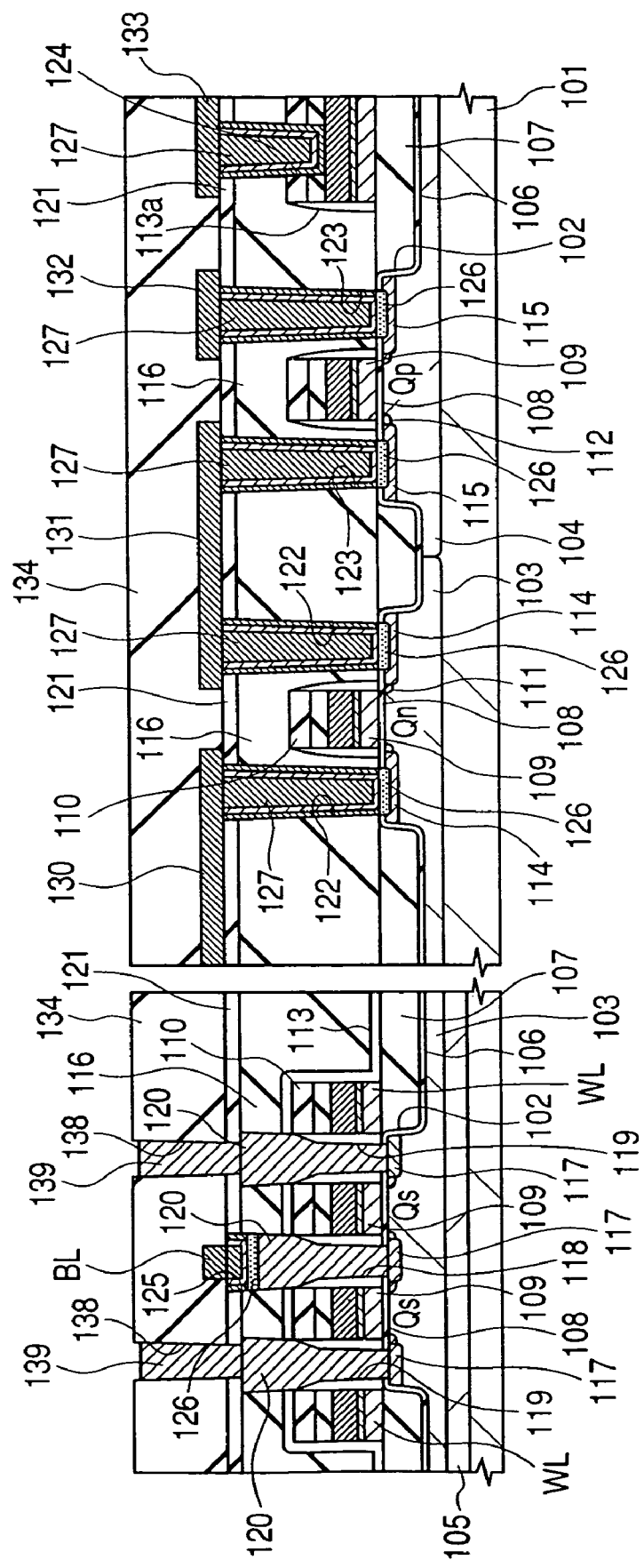

After removal of the polycrystalline silicon film 135 and side wall spacers 137 by dry etching, a plug 139 is formed inside of the through-hole 138 as illustrated in FIG. 38. This plug 139 is formed by depositing a low-resistance polycrystalline silicon film having an n-type impurity (phosphorus) doped thereto over the silicon oxide film including the inside of the through-hole 138 by CVD, and then leaving this polycrystalline silicon film only inside of the through-hole 138 by etching back.

Figure 39:
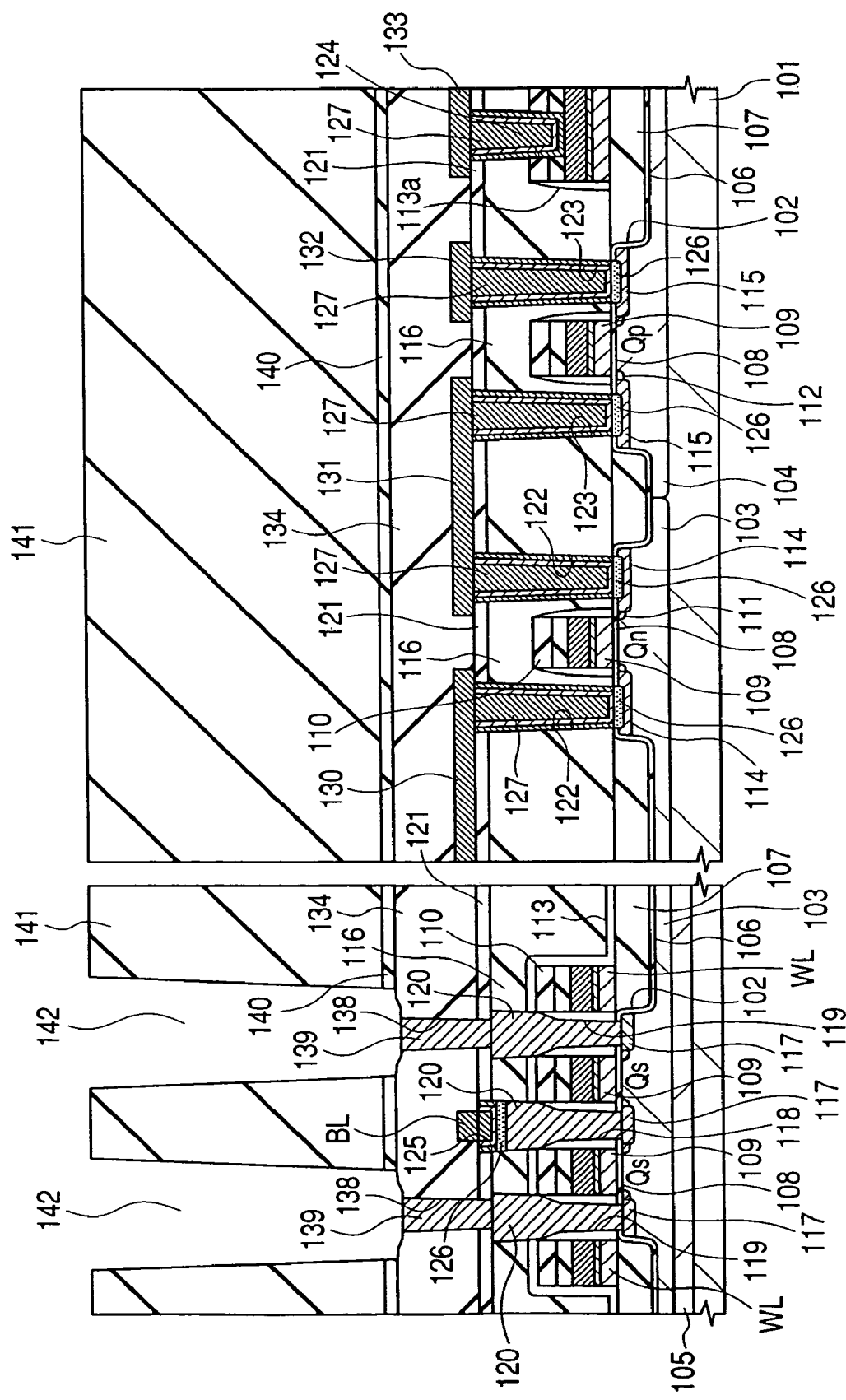

As illustrated in FIG. 39, a silicon nitride film 140 of about 100 nm thick is deposited over the silicon oxide film 134 by CVD, followed by deposition of a silicon oxide film 141 over the silicon nitride film 140 by CVD. With a photoresist film (not illustrated) being used as a mask, the silicon oxide film 141 of the memory cell array is dry etched, and then the silicon nitride film 140 lying under the silicon oxide film 141 is dry etched, whereby a trench 142 is formed above the through-hole 138. A lower electrode of an information storing capacitor is formed along the inside wall of this trench 142 so that the silicon oxide film 141 forming the trench 142 must be deposited so as to be thick (for example, about 1.3 µm) in order to enlarge the surface area of the lower electrode, thereby increasing the charge accumulated amount.

As the silicon nitride film 140, a silicon nitride film formed at a substrate temperature of 400° C. or greater by plasma CVD using a raw material gas having monosilane and nitrogen may be used alternatively.

Figure 40:
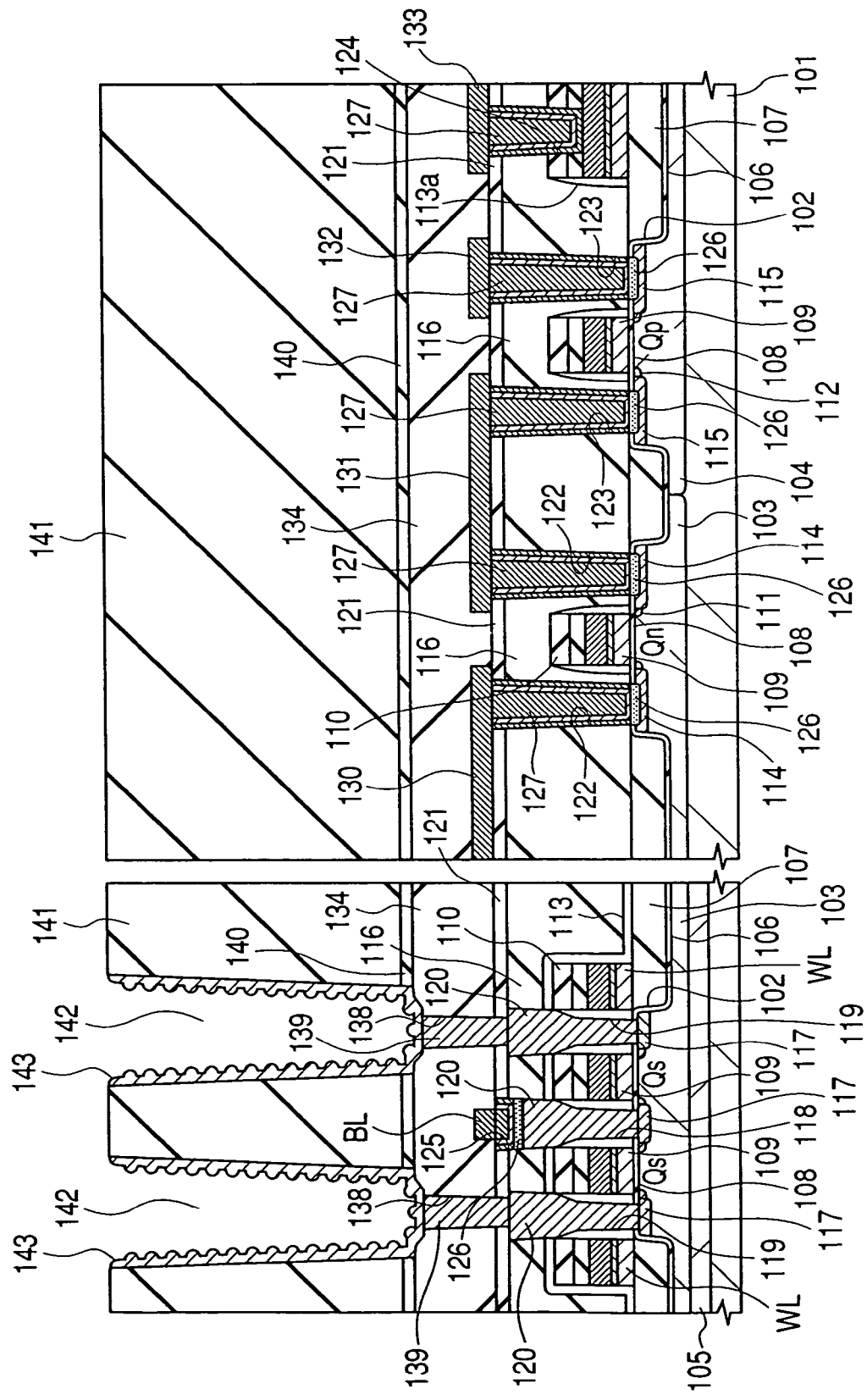

As illustrated in FIG. 40, after deposition of an amorphous silicon film 143a having an n-type impurity (phosphorus) doped thereto and having a thickness of about 50 nm over the silicon oxide film 141 including the inside of the trench 142, the amorphous silicon film 143a is left along the inside wall of the trench 142 by etching back the amorphous silicon film 143a over the silicon oxide film 141. The surface of the amorphous silicon film 143a left inside of the trench 142 is then wet washed with a hydrofluoric acid washing liquid. Monosilane ($SiH_4$) is then fed to the surface of the amorphous silicon film 143a under a vacuum atmosphere, followed by thermal treatment of the substrate 101 to convert the amorphous silicon film 143a into polycrystalline, and, at the same time, to allow silicon grains to grow on the surface. By this treatment, the polycrystalline silicon film 143 having a roughened surface is formed along the inside wall of the trench 142. This polycrystalline silicon film 143 serves as a lower electrode of a data storage capacitor.

Figure 41:
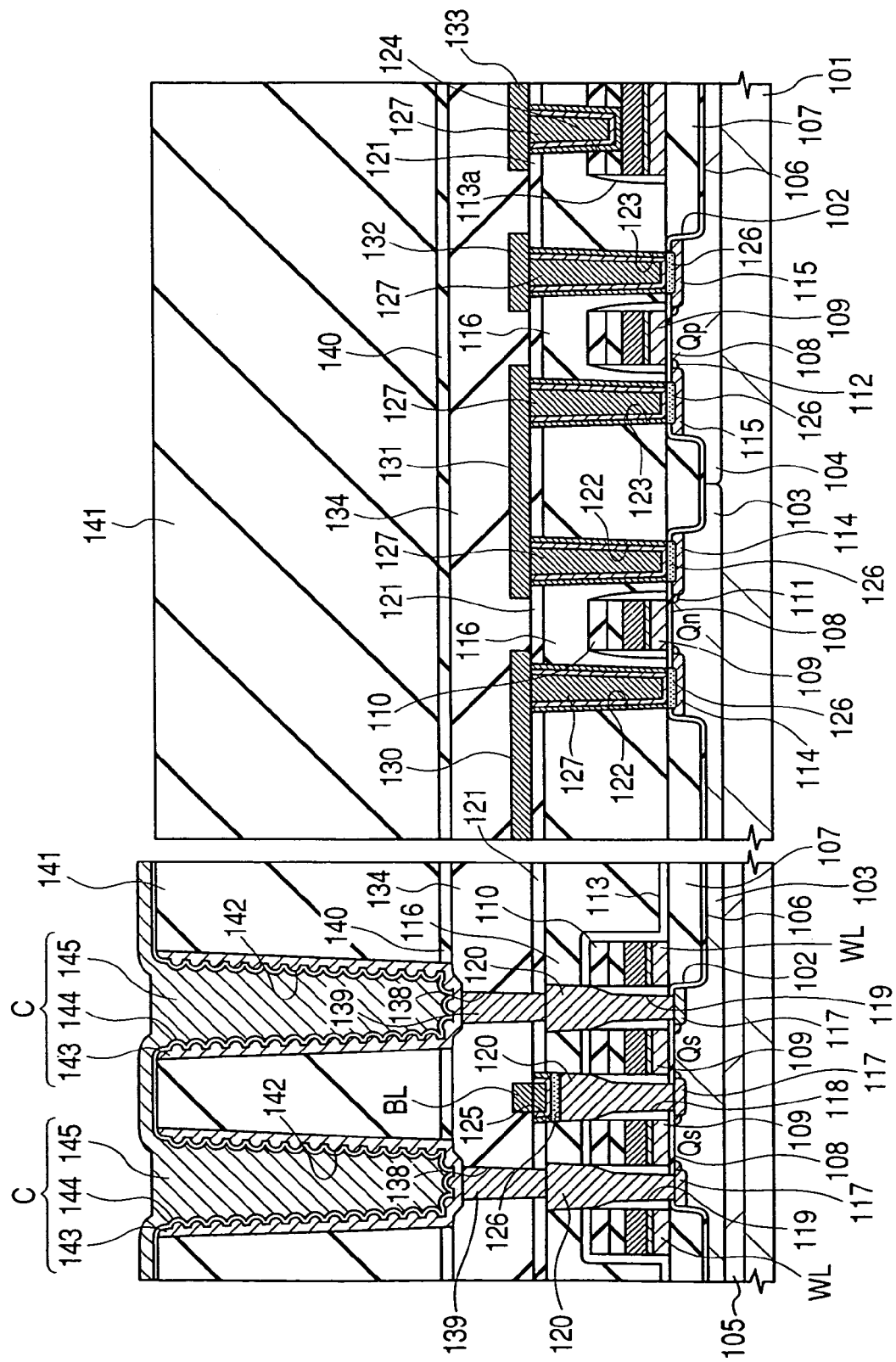

As illustrated in FIG. 41, a tantalum oxide ($Ta_2O_5$) film of about 15 nm thick is deposited by CVD over the silicon oxide film 141, including the inside of the trench 142, followed by thermal treatment at about 800° C. for 3 minutes in an oxygen atmosphere to crystallize the tantalum oxide film 144 and, at the same time, to repair defects caused by oxygen fed to the film. This tantalum oxide film 144 serves as a capacitor insulating film of the data storage capacitor. After deposition of a TiN film 145 of about 150 nm thick over the tantalum oxide film 144 including the inside of the trench 142 by using, in combination, CVD and sputtering, the TiN film 145 and tantalum oxide film 144 are dry etched using a photoresist film (not illustrated) as a mask, whereby a data storage capacitor C is provided, which is formed of an upper electrode made of the TiN film 145, a capacitor insulating film made of the tantalum oxide film 144 and a lower electrode made of the polycrystalline silicon film 143.

By the steps so far described, a memory cell of a DRAM formed of the memory cell selecting MISFETQs and data storing capacitor C connected in series therewith is completed.

The capacitor insulating film of the data storage capacitor C may be made of a film composed mainly of a high dielectric substance or ferroelectric substance having a perovskite or complex perovskite crystal structure, such as PZT, PLT, PLZT, $PbTiO_3$, $SrTiO_3$, $BaTiO_3$, BST, SBT or $Ta_2O_5$.

Figure 42:
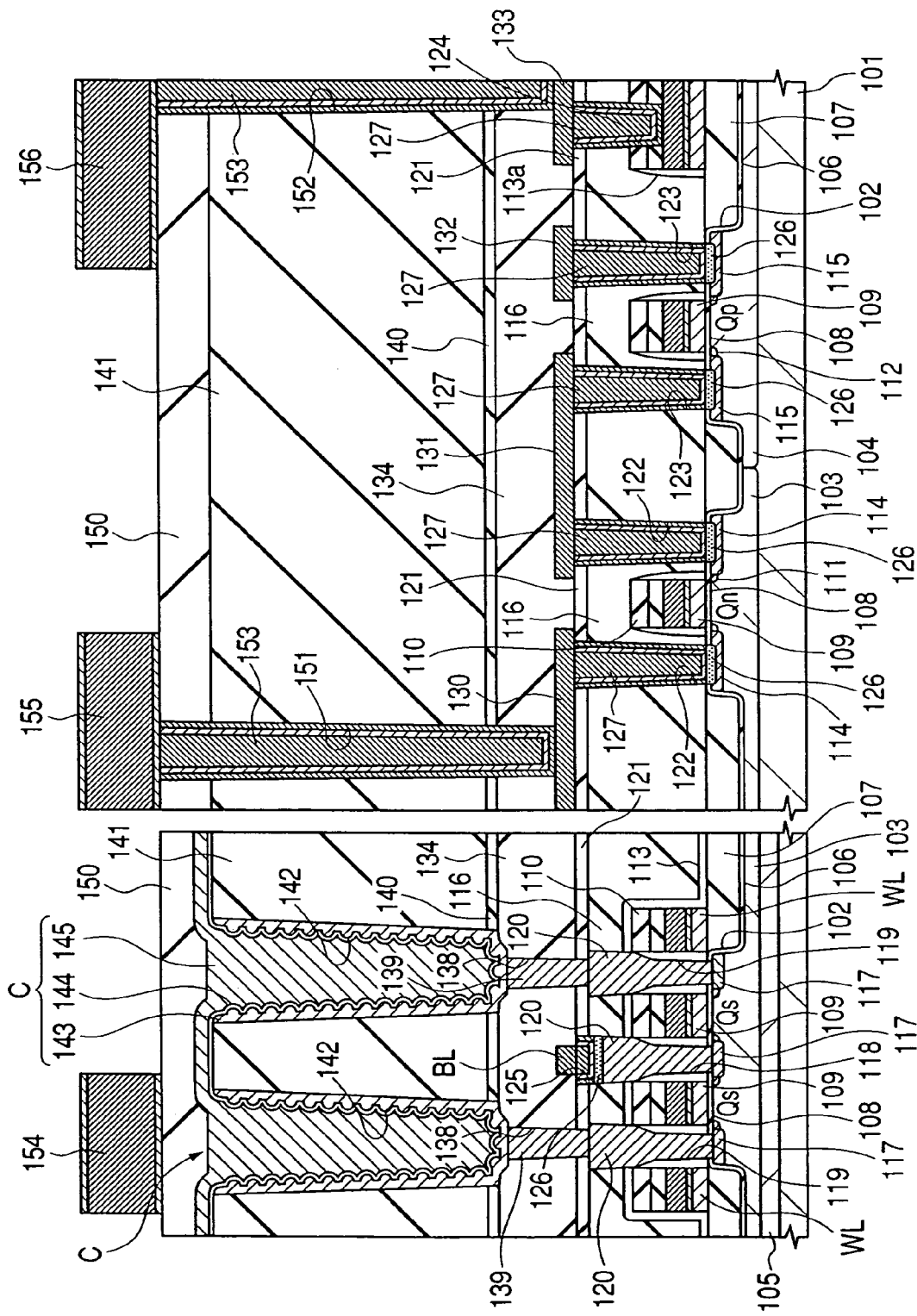

As illustrated in FIG. 42, over the data storage capacitor C, a second wiring layer is formed by the following method.

First, a silicon oxide film 150 is deposited to a thickness of about 100 nm over the data storage capacitor C by CVD. After formation of through-holes 151,152 by dry etching the silicon oxide film 150,141, silicon nitride film 140 and silicon oxide film 134 over the first-layer interconnections 130,133 in the peripheral circuit region using a photoresist film (not illustrated) as a mask, plugs 153 are formed in the through-holes 151,152. These plugs 153 are formed, for example, by depositing a TiN film of about 100 nm thick over the silicon oxide film 150 by sputtering, depositing thereover a W film of about 500 nm thick by CVD and then etching back these films to leave them only inside of each of the through-holes 151,152. Interconnection layers 154 to 156 are then formed over the silicon oxide film 150, for example, by depositing a TiN film of about 50 nm thick, an Al (aluminum) alloy film of about 500 nm thick and a Ti film of about 50 nm thick over the silicon oxide film 150 by sputtering, and then dry etching these films using a photoresist film (not illustrated) as a mask.

An interlayer insulating film covering the interconnections 154 to 156 therewith, third-layer interconnections and a passivation film formed of a silicon oxide film and a silicon nitride film are then deposited in this order, but illustration thereof is omitted. By the steps so far described, a DRAM of this embodiment is substantially completed.

What is claimed is:

1. A manufacturing process of a semiconductor device, comprising:
   (a) selectively forming a first insulating film on a surface of a semiconductor substrate;
   (b) forming a first conductor piece via a second insulating film over the surface of the semiconductor substrate;
   (c) forming a semiconductor layer in the semiconductor substrate in a region, in the surface of the semiconductor substrate, wherein the first insulating film and the first conductor piece do not exist;
   (d) forming a third insulating film to cover the first conductor piece, semiconductor layer and first insulating film, the third insulating film providing self-alignment during self-alignment processing;
   (e) forming a fourth insulating film over the third insulating film;
   (f) forming a first opening in the fourth and third insulating films,
   (g) forming a second conductor piece in the first opening; and
   (h) forming a fifth insulating film over the fourth insulating film, the fifth insulating film being a passivation insulating film,
   wherein the third and fifth insulating films are silicon nitride films formed by plasma CVD,
   wherein the fifth insulating film is formed using a silane, nitrogen and ammonia gas, while the third insulating film is formed using a silane and a nitrogen gas in an ammonia-free atmosphere, and
   wherein the third insulating film is formed at a temperature higher than that of the fifth insulating film.

2. A manufacturing process of a semiconductor device according to claim 1, wherein the first and fourth insulating films are silicon oxide films, and the step for forming a first opening comprises a step of etching the fourth insulating film under conditions permitting a larger etching amount of the fourth insulating film than that of the third insulating film and a step of etching the third insulating film under conditions permitting a larger etching amount of the third insulating film than that of the first insulating film.

3. A manufacturing process of a semiconductor device according to claim 1, further comprising, between the steps (c) and (d), a step of forming a suicide layer over the surface of the semiconductor layer.

4. A manufacturing process of a semiconductor device according to claim 3, wherein the second conductor piece contains a first conductor layer and a second conductor layer, and wherein the first conductor layer is thinner than the second conductor layer and lies below the second conductor layer.

5. A manufacturing process of a semiconductor device according to claim 1, further comprising, between the steps (g) and (h),
   (i) forming a third conductor piece; and
   (j) connecting, in a second opening formed in the fifth insulating film to expose a portion of the third conductor piece, the third conductor piece with an externally connecting conductor piece.

6. A manufacturing process of a semiconductor device according to claim 1, wherein the first conductor piece is formed of a boron-containing silicon layer.

7. A manufacturing process of a semiconductor device according to claim 1, wherein the first conductor piece is formed of silicon layer, a metal nitride layer over the silicon layer and a refractory metal layer over the metal nitride layer.

8. A manufacturing process of a semiconductor device according to claim 1, wherein the third insulating film is formed using monosilane and nitrogen.

9. A manufacturing process of a semiconductor device comprising:
   (a) selectively forming a first insulating film on a surface of a semiconductor substrate;
   (b) forming a first conductor piece over the surface of the semiconductor substrate via a second insulating film;
   (c) forming a semiconductor layer in a region, in the surface of the semiconductor substrate, wherein the first insulating film and the first conductor piece do not exist;
   (d) forming a third insulating film to cover the first conductor piece, semiconductor layer and first insulating film, the third insulating film providing self-alignment during self-alignment processing;
   (e) forming a fourth insulating film over the third insulating film;
   (f) forming a first opening in the fourth and third insulating films;
   (g) forming a second conductor piece in the first opening; and
   (h) forming a fifth insulating film over the fourth insulating film, the fifth insulating film being a passivation insulating film,
   wherein the third and fifth insulating films are silicon nitride films formed by plasma CVD,
   wherein the fifth insulating film is formed using a silane, nitrogen and ammonia gas, while the third insulating film is formed using a silane and a nitrogen gas in an ammonia-free atmosphere, and wherein the third insulating film has a hydrogen content smaller than that of the fifth insulating film.

10. A manufacturing process of a semiconductor device according to claim 9, wherein the third insulating film is formed using monosilane and nitrogen.

11. A manufacturing process of a semiconductor device according to claim 9, wherein the first and fourth insulating films are silicon oxide films, and the step for forming a first opening comprises a step of etching the fourth insulating film under conditions permitting a larger etching amount of the fourth insulating film than that of the third insulating film, and a step of etching the third insulating film under conditions permitting a larger etching amount of the third insulating film than that of the first insulating film.

12. A manufacturing process of a semiconductor device, comprising:
   (a) forming a first insulating film over a surface of a semiconductor substrate, the first insulating film providing self-alignment during self-alignment processing;
   (b) forming a second insulating film over the first insulating film;
   (c) forming an opening in the second and first insulating films;
   (d) forming a conductor layer in the opening; and
   (e) forming a third insulating film over the conductor layer, the third insulating film being a passivation insulating film,
   wherein the first insulating film and the third insulating film are silicon nitride films formed by plasma CVD,
   wherein the third insulating film is formed using a silane, nitrogen and ammonia gas, while the first insulating film is formed using a silane and a nitrogen gas in an ammonia-free atmosphere, and
   wherein the first insulating film is formed at a temperature higher than that of the third insulating film.

13. A manufacturing process of a semiconductor device, comprising:
   (a) forming a first insulating film over a surface of a semiconductor substrate, the first insulating film providing self-alignment during self-alignment processing;
   (b) forming a second insulating film over the first insulating film;
   (c) forming an opening in the second and first insulating films;
   (d) forming a conductor layer in the opening; and
   (e) forming a third insulating film over the conductor layer, the third insulating film being a passivation insulating film,
   wherein the first insulating film and the third insulating film are silicon nitride films formed by plasma CVD,
   wherein the third insulating film is formed using a silane, nitrogen and ammonia gas, while the first insulating film is formed using a silane and a nitrogen gas in an ammonia-free atmosphere, and
   wherein the first insulating film has a hydrogen content smaller than that of the third insulating film.

14. A manufacturing process of a semiconductor device, which comprises:
   forming a first silicon nitride film, wherein the first silicon nitride film provides self-alignment during self-alignment processing; and
   forming a second silicon nitride film, the second silicon nitride film being a silicon nitride passivation film,
   wherein the first silicon nitride film is formed by plasma CVD using a raw material gas having silane and nitrogen in an ammonia-free atmosphere, and
   wherein the second silicon nitride film is formed by plasma CVD using a raw material gas having silane, ammonia and nitrogen.

15. A manufacturing process of a semiconductor device according to claim 14, wherein the first silicon nitride film is formed at a temperature higher than that of the second silicon nitride film.

16. A manufacturing process of a semiconductor device according to claim 14, wherein the first silicon nitride film is formed at 400° C. or greater.

17. A manufacturing process of a semiconductor device according to claim 14, wherein the first silicon nitride film is formed using monosilane and nitrogen, while the second silicon nitride film is formed using monosilane, ammonia and nitrogen.

* * * * *